United States Patent
Yamazaki et al.

(10) Patent No.: US 8,395,153 B2
(45) Date of Patent: Mar. 12, 2013

(54) SEMICONDUCTOR DEVICE AND MANUFACTURING METHOD THE SAME

(75) Inventors: Shunpei Yamazaki, Setagaya (JP); Hiroki Ohara, Sagamihara (JP); Junichiro Sakata, Atsugi (JP); Toshinari Sasaki, Atsugi (JP); Miyuki Hosoba, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/596,527

(22) Filed: Aug. 28, 2012

(65) Prior Publication Data

US 2012/0319106 A1 Dec. 20, 2012

Related U.S. Application Data

(63) Continuation of application No. 12/832,333, filed on Jul. 8, 2010, now Pat. No. 8,294,147.

(30) Foreign Application Priority Data

Jul. 10, 2009 (JP) ................................. 2009-164197

(51) Int. Cl.
*H01L 29/786* (2006.01)

(52) U.S. Cl. ......................................... 257/43; 438/104

(58) Field of Classification Search .................... 257/43, 257/E29.296, E21.459; 438/104
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1 737 044 A | 12/2006 |
| EP | 2 226 847 A | 9/2010 |

(Continued)

OTHER PUBLICATIONS

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, Or Al; B: Mg, Mn, Fe, Ni, Cu, or Zn] at Temperatures Over 1000°C" Journal of Solid State Chemistry, 1985, vol. 60, pp. 382-384.

(Continued)

*Primary Examiner* — Thao P. Le

(74) *Attorney, Agent, or Firm* — Eric J. Robinson; Robinson Intellectual Property Law Office, P.C.

(57) ABSTRACT

An object is to manufacture and provide a highly reliable semiconductor device including a thin film transistor with stable electric characteristics. In a method for manufacturing a semiconductor device including a thin film transistor in which a semiconductor layer including a channel formation region serves as an oxide semiconductor film, heat treatment for reducing impurities such as moisture (heat treatment for dehydration or dehydrogenation) is performed after an oxide insulating film serving as a protective film is formed in contact with an oxide semiconductor layer. Then, the impurities such as moisture, which exist not only in a source electrode layer, in a drain electrode layer, in a gate insulating layer, and in the oxide semiconductor layer but also at interfaces between the oxide semiconductor film and upper and lower films which are in contact with the oxide semiconductor layer, are reduced.

24 Claims, 35 Drawing Sheets

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,580,475 B2 | 6/2003 | Yamazaki et al. |
| 6,727,522 B1 | 4/2004 | Kawasaki et al. |
| 6,800,872 B2 * | 10/2004 | Tanaka et al. ............... 257/59 |
| 6,812,975 B2 * | 11/2004 | Nagahiro .................. 349/39 |
| 6,890,783 B2 * | 5/2005 | Kimura et al. ............ 438/30 |
| 6,933,568 B2 | 8/2005 | Yang et al. |
| 7,023,021 B2 | 4/2006 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,084,019 B2 | 8/2006 | Yamazaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,485,896 B2 | 2/2009 | Yamazaki et al. |
| 7,501,293 B2 | 3/2009 | Ito et al. |
| 7,560,732 B2 | 7/2009 | Yamazaki et al. |
| 7,566,903 B2 | 7/2009 | Yamazaki et al. |
| 7,601,984 B2 | 10/2009 | Sano et al. |
| 7,612,753 B2 | 11/2009 | Koyama |
| 7,674,650 B2 | 3/2010 | Akimoto et al. |
| 7,732,819 B2 | 6/2010 | Akimoto et al. |
| 7,807,999 B2 * | 10/2010 | Kim et al. .................. 257/59 |
| 7,852,443 B2 * | 12/2010 | Tsuchimichi ............. 349/138 |
| 7,902,549 B2 | 3/2011 | Yang et al. |
| 7,989,815 B2 * | 8/2011 | Yamazaki et al. ........... 257/72 |
| 8,030,663 B2 | 10/2011 | Yamazaki et al. |
| 8,039,840 B2 * | 10/2011 | Hosoya ...................... 257/59 |
| 8,188,477 B2 | 5/2012 | Miyairi et al. |
| 2001/0046027 A1 | 11/2001 | Tai et al. |
| 2002/0017645 A1 | 2/2002 | Yamazaki et al. |
| 2002/0056838 A1 | 5/2002 | Ogawa |
| 2002/0132454 A1 | 9/2002 | Ohtsu et al. |
| 2003/0043309 A1 * | 3/2003 | Nakata ........................ 349/43 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0121890 A1 * | 5/2008 | Yang et al. ..................... 257/66 |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250704 A1 | 10/2009 | Yamazaki et al. |
| 2009/0267073 A1 | 10/2009 | Yamazaki et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0032665 A1 | 2/2010 | Yamazaki et al. |
| 2010/0045584 A1 | 2/2010 | Koyama |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2011/0127514 A1 * | 6/2011 | Matsumuro .................. 257/40 |
| 2011/0303919 A1 * | 12/2011 | Kobayashi et al. ............. 257/59 |
| 2012/0032177 A1 * | 2/2012 | Hosoya ...................... 257/59 |
| 2012/0153312 A1 * | 6/2012 | Chou ........................... 257/88 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-026825 | 1/1992 |
| JP | 05-251705 | 9/1993 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-045966 | 2/2003 |
| JP | 2003-086000 A | 3/2003 |

| | | |
|---|---|---|
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-099847 | 5/2009 |
| WO | WO 2004/114391 | 12/2004 |
| WO | WO 2008/126879 | 10/2008 |

OTHER PUBLICATIONS

Kimizuka et al., "Syntheses and Single-Crystal Data of Homologous Compounds, $In_2O_3(ZnO)m$ (m =3, 4, and 5), $InGaO_3(ZnO)_3$, and $Ga_2O_3(ZnO)m$ (m =7, 8, 9, and 16) in the $In_2O_3$—$ZnGa_2O_4$—$ZnO$ System," Journal of Solid State Chemistry, Apr. 1, 1995, vol. 116, No. 1, pp. 170-178.

Nakamura et al., "The Phase Relations in the $In_2O_3$-$Ga_2ZnO_4$-$ZnO$ System at 1350° C," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Osada et al., "Development of Driver-Integrated Panel using Amorphous In—Ga—Zn—Oxide TFT," AM-FPD '09 Digest of Technical Papers, Jul. 1, 2009, pp. 33-36.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In—Ga—Zn—Oxide TFTS," IDW '09: Proceedings of the 16th International Display Workshops, 2009, pp. 689-692.

International Search Report (Application No. PCT/JP2010/060931) dated Aug. 3, 2010.

Written Opinion (Application No. PCT/JP2010/060931) dated Aug. 3, 2010.

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga-Zn—O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Nakamura, et al., "Syntheses and Crystal Structures of New Homologous Compounds, Indium Iron Zinc Oxides ($InFeO_3(ZnO)_m$) (m: natural number) and Related Compounds," Kotai Butsuri (Solid State Physics), 1993, vol. 28, No. 5, pp. 317-327.

* cited by examiner

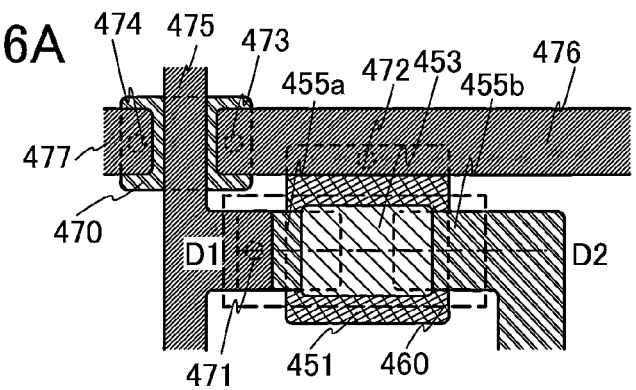
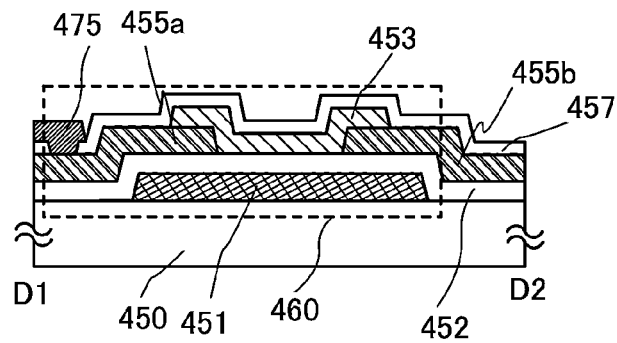
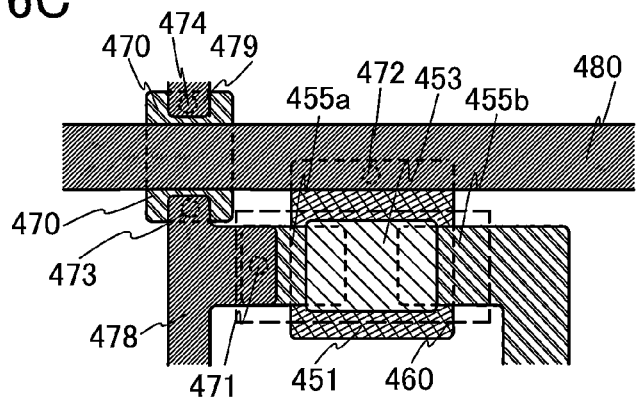
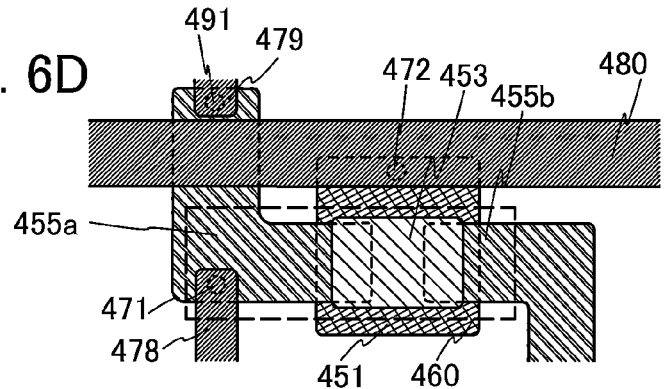

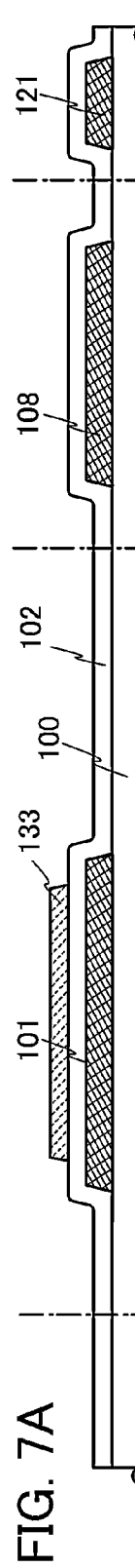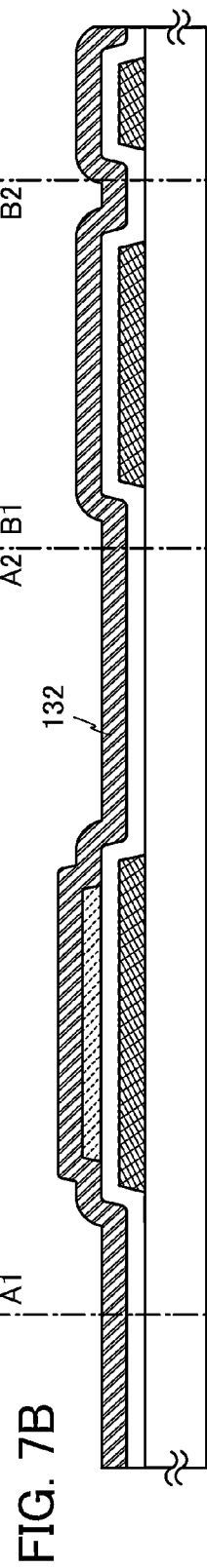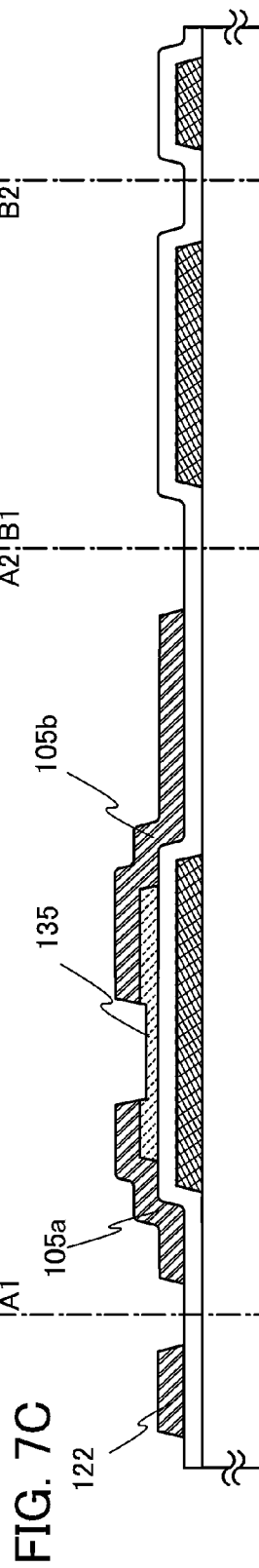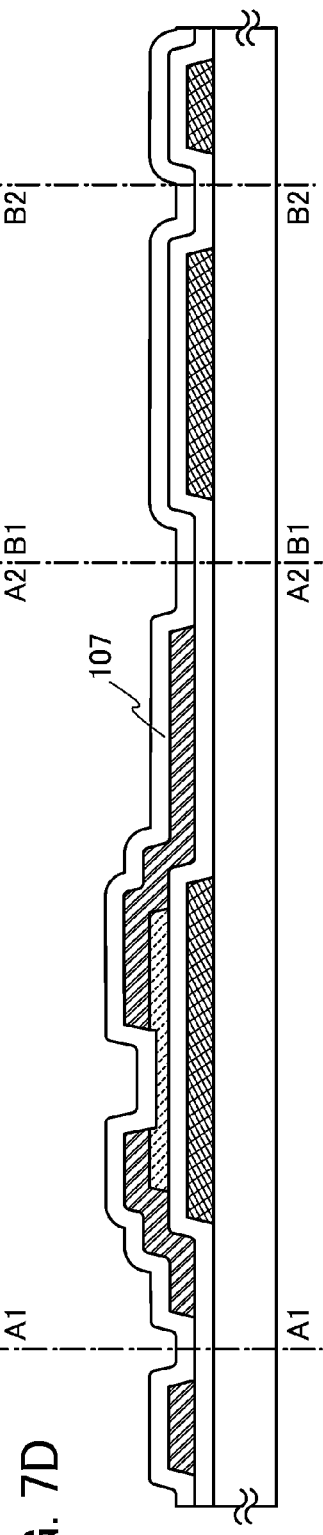

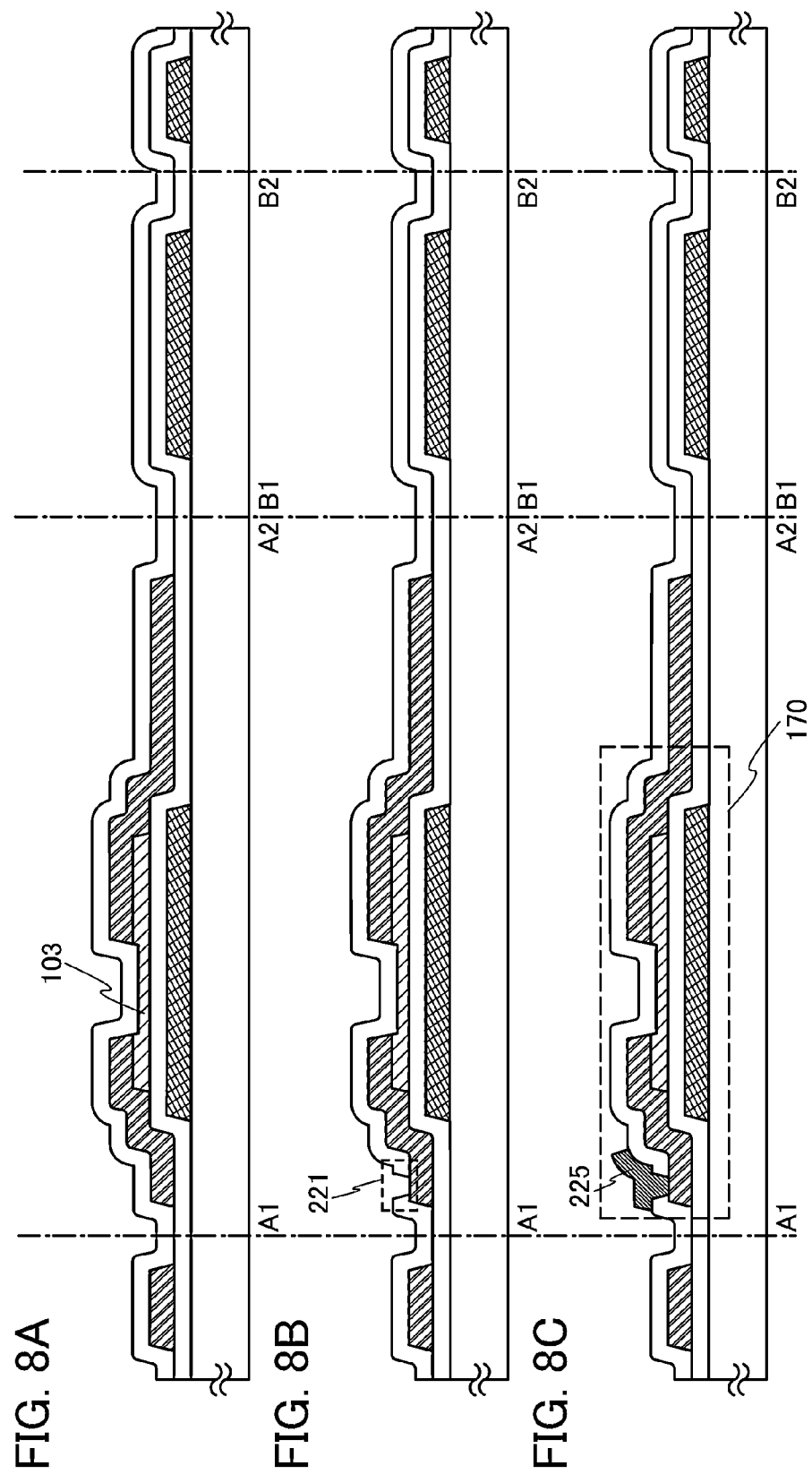

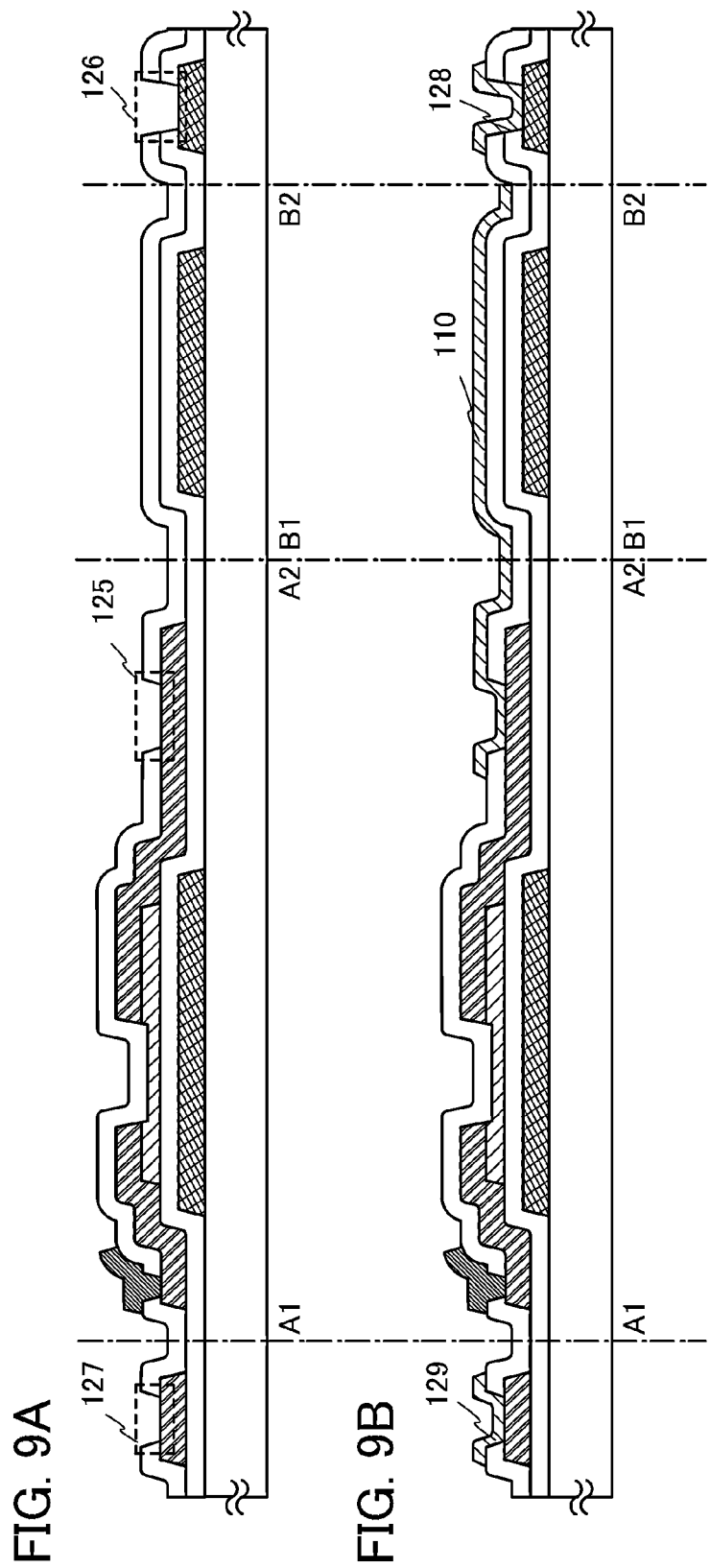

SEMICONDUCTOR DEVICE AND MANUFACTURING METHOD THE SAME

CROSS-REFERENCE TO RELATED APPLICATION

This application claims the benefit of Japan Application 2009-164197, filed Jul. 10, 2009, the contents of which are hereby incorporated herein by reference in their entirety. This application is a continuation of U.S. application Ser. No. 12/832,333 filed Jul. 8, 2010, now U.S. Pat. No. 8,294,147.

TECHNICAL FIELD

The present invention relates to a semiconductor device including an oxide semiconductor and a manufacturing method thereof.

In this specification, a semiconductor device generally means a device which can function by utilizing semiconductor characteristics, and an electro-optical device, a semiconductor circuit, and an electronic device are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Indium oxide is an example of metal oxides and is used as a light-transmitting electrode material which is necessary for liquid crystal displays and the like.

Some metal oxides have semiconductor characteristics. For example, metal oxides having semiconductor characteristics include tungsten oxide, tin oxide, indium oxide, zinc oxide, and the like. Thin film transistors in which a channel formation region is formed using such a metal oxide having semiconductor characteristics are already known (Patent Documents 1 to 4 and Non-Patent Document 1).

Further, not only single-component oxides but also multi-component oxides are known as metal oxides. For example, a homologous compound, $InGaO_3(ZnO)_m$ (m is natural number) is known as a multi-component oxide semiconductor containing In, Ga, and Zn (also referred to as an In—Ga—Zn—O-based oxide) (Non-Patent Documents 2 to 4).

Furthermore, it is confirmed that an oxide semiconductor containing such an In—Ga—Zn—O-based oxide is applicable to a channel layer of a thin film transistor (Patent Document 5 and Non-Patent Documents 5 and 6).

REFERENCES

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

An object is to provide a highly reliable semiconductor device including a thin film transistor with stable electric characteristics.

In a method for manufacturing a semiconductor device including a thin film transistor in which a semiconductor layer including a channel formation region serves as an oxide semiconductor film, heat treatment for increasing purity of the oxide semiconductor film and reducing impurities such as moisture (heat treatment for dehydration or dehydrogenation) is performed. Further, impurities such as moisture, which exist not only in the oxide semiconductor film but also in a source electrode layer, in a drain electrode layer, and in a gate insulating layer are reduced by performing heat treatment, and impurities such as moisture, which exist at interfaces between the oxide semiconductor film and upper and lower films which are in contact with the oxide semiconductor film, are reduced by performing heat treatment.

An oxide semiconductor layer is formed and an oxide insulating film serving as a protective film is formed in contact with the oxide semiconductor layer, and then heat treatment for dehydration or dehydrogenation is performed. Heat treatment is performed under a nitrogen atmosphere, an oxygen atmosphere, or an inert gas atmosphere of a rare gas (argon, helium, or the like), or under reduced pressure at a temperature of higher than or equal to 200° C. and lower than or equal to 700° C., preferably higher than or equal to 350° C. and lower than a strain point of a substrate, whereby the moisture content in the source electrode layer, the drain electrode layer, the gate insulating layer, and the oxide semiconductor film, or the like is reduced. Further, the heat treatment can repair plasma damage which is caused to the oxide semiconductor layer when the oxide insulating film serving as a protective film is formed in contact with the oxide semiconductor layer. The heat treatment can reduce variation in electric characteristics of a thin film transistor.

When the oxide semiconductor layer in which the moisture content or the like is reduced by the heat treatment and whose plasma damage is repaired is used, electric characteristics of a thin film transistor are improved and a thin film transistor with mass productivity and high performance is realized.

In this specification, heat treatment under a nitrogen atmosphere, an oxygen atmosphere, or an inert gas atmosphere of a rare gas (argon, helium, or the like), or under reduced pressure is referred to as heat treatment for dehydration or dehydrogenation. In this specification, "dehydrogenation" does not indicate elimination of only $H_2$ by the heat treatment. For convenience in this description, elimination of H, OH, and the like is referred to as "dehydrogenation or dehydration".

Note that the oxide insulating film serving as a protective film which is in contact with the oxide semiconductor layer is formed using an inorganic insulating film which blocks impurities such as moisture, hydrogen ions, and $OH^-$. Typically, a silicon oxide film, a silicon nitride oxide film, an aluminum oxide film, or an aluminum oxynitride film is used. In addition, a silicon nitride film or an aluminum nitride film may be stacked over the oxide insulating film.

One embodiment of the present invention disclosed in this specification is a method for manufacturing a semiconductor device including the steps of: forming a gate electrode layer including a heat resistant conductive material; forming a gate insulating layer over the gate electrode layer; forming an oxide semiconductor layer over the gate insulating layer; forming a connection electrode layer, a source electrode layer, and a drain electrode layer each including a heat resistant conductive material above the oxide semiconductor layer; forming, over the gate insulating layer, the oxide semiconductor layer, the connection electrode layer, the source electrode layer, and the drain electrode layer, an oxide insulating film which is in contact with part of the oxide semiconductor layer; and performing dehydration or dehydrogenation on the oxide semiconductor layer after the oxide insulating film is formed.

With the above structure, at least one of the above problems can be resolved.

Another embodiment of the present invention is a method for manufacturing a semiconductor device including the steps of: forming a gate electrode layer including a heat resistant conductive material over a substrate having an insulating surface; forming a gate insulating layer over the gate electrode layer; forming an oxide semiconductor layer over the gate insulating layer; forming a connection electrode layer, a source electrode layer, and a drain electrode layer each including a heat resistant conductive material above the oxide semiconductor layer; forming, over the gate insulating layer, the oxide semiconductor layer, the connection electrode layer, the source electrode layer, and the drain electrode layer, an oxide insulating film which is in contact with part of the oxide semiconductor layer; performing dehydration or dehydrogenation on the oxide semiconductor layer after the oxide insulating film is formed; removing part of the oxide insulating film and forming a first contact hole which reaches the source electrode layer, and a third contact hole and a fourth contact hole which reach both end portions of the connection electrode layer; removing part of the oxide insulating film and part of the gate insulating layer and forming a second contact hole which reaches the gate electrode layer; and forming, over the oxide insulating film, a source wiring which is connected to the source electrode layer through the first contact hole, a first gate wiring which is connected to the gate electrode layer through the second contact hole and to the connection electrode layer through the third contact hole, and a second gate wiring which is connected to the connection electrode layer through the fourth contact hole.

Another embodiment of the present invention is a method for manufacturing a semiconductor device including the steps of: forming a gate electrode layer including a heat resistant conductive material over a substrate having an insulating surface; forming a gate insulating layer over the gate electrode layer; forming an oxide semiconductor layer over the gate insulating layer; forming a connection electrode layer, a source electrode layer, and a drain electrode layer each including a heat resistant conductive material above the oxide semiconductor layer; forming, over the gate insulating layer, the oxide semiconductor layer, the connection electrode layer, the source electrode layer, and the drain electrode layer, an oxide insulating film which is in contact with part of the oxide semiconductor layer; performing dehydration or dehydrogenation on the oxide semiconductor layer after the oxide insulating film is formed; removing part of the oxide insulating film and forming a first contact hole which reaches the source electrode layer, and a third contact hole and a fourth contact hole which reach both end portions of the connection electrode layer; removing part of the oxide insulating film and part of the gate insulating layer and forming a second contact hole which reaches the gate electrode layer; and forming, over the oxide insulating film, a first source wiring which is connected to the source electrode layer through the first contact hole and to the connection electrode layer through the third contact hole, a second source wiring which is connected to the connection electrode layer through the fourth contact hole, and a gate wiring which is connected to the gate electrode layer through the second contact hole.

In any of the structures of the manufacturing methods, the dehydration or dehydrogenation is preferably heating under a nitrogen atmosphere, an oxygen atmosphere, or a rare gas atmosphere, or under reduced pressure, and the oxide semiconductor layer is more preferably heated at a temperature of higher than or equal to 350° C. and lower than a strain point of the substrate. Slow cooling is preferably performed after the heating.

As the heat resistant conductive material, an element selected from titanium, tantalum, tungsten, molybdenum, chromium, neodymium, or scandium; an alloy including any of these elements as a component; or a nitride including any of these elements as a component is preferably used in a single layer or a stacked layer. The source wiring and the gate wiring are preferably formed using a low resistance conductive material which has lower resistivity than the source electrode layer and the drain electrode layer. Aluminum or copper is preferably used as the low resistance conductive material.

Another embodiment of the present invention is a semiconductor device including a gate electrode layer formed using a first mask over a substrate having an insulating surface; a gate insulating layer over the gate electrode layer; an oxide semiconductor layer formed using a second mask over the gate insulating layer; a connection electrode layer, a source electrode layer, and a drain electrode layer which are formed using a third mask, wherein the source electrode layer and the drain electrode layer are above the oxide semiconductor layer; an oxide insulating film which covers the gate insulating layer, the oxide semiconductor layer, the source electrode layer, and the drain electrode layer, wherein the oxide insulating film is in contact with part of the oxide semiconductor layer; and a gate wiring, a first source wiring, and a second source wiring which are formed using a fourth mask over the oxide insulating film. The first source wiring is electrically connected to the source electrode layer, the gate wiring is electrically connected to the gate electrode layer, the first source wiring and the second source wiring are electrically connected to the connection electrode layer, and the connection electrode layer overlaps the gate wiring with the oxide insulating film interposed therebetween. Here the first to fourth masks refer to photomasks.

Another embodiment of the present invention is a semiconductor device including: a gate electrode layer formed using a first mask over a substrate having an insulating surface; a gate insulating layer over the gate electrode layer; an oxide semiconductor layer formed using a second mask over the gate insulating layer; a connection electrode layer, a source electrode layer, and a drain electrode layer which are formed using a third mask, wherein the source electrode layer and the drain electrode layer are above the oxide semiconductor layer; an oxide insulating film which covers the gate insulating layer, the oxide semiconductor layer, the source electrode layer, and the drain electrode layer, wherein the oxide insulating film is in contact with part of the oxide semiconductor layer; and a gate wiring, a first source wiring, and a second source wiring which are formed using a fourth mask over the oxide insulating film. The first source wiring is electrically connected to the source electrode layer, the gate wiring is electrically connected to the gate electrode layer, the first source wiring and the second source wiring are electrically connected to the connection electrode layer; and the connection electrode layer overlaps the gate wiring with the oxide insulating film interposed therebetween. Here the first to fourth masks refer to photomasks.

In any of the structures of the semiconductor devices, a single layer or a stacked layer of an element selected from titanium, tantalum, tungsten, molybdenum, chromium, neodymium, or scandium; an alloy including any of these elements as a component; or a nitride including any of these elements as a component is preferably used for the gate electrode layer, the connection electrode layer, the source electrode layer, and the drain electrode layer. The source wiring and the gate wiring are preferably formed using a low resistance conductive material which has lower resistivity than the source electrode layer and the drain electrode layer, and aluminum or copper is more preferably used.

An oxide semiconductor used in this specification is formed into a thin film represented by $InMO_3(ZnO)_m$ (m>0), and a thin film transistor is manufactured using this thin film as an oxide semiconductor layer. However, m is not always an integer. Note that M represents one or more metal elements selected from Ga, Fe, Ni, Mn, or Co. As an example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, among the oxide semiconductor layers whose composition formulae are represented by $InMO_3(ZnO)_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As the oxide semiconductor which is applied to the oxide semiconductor layer, any of the following oxide semiconductors can be applied in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Silicon oxide may be included in the oxide semiconductor layer. Further, silicon oxide ($SiO_x$ (x>0)), which hinders crystallization, contained in the oxide semiconductor layer can suppress crystallization of the oxide semiconductor layer in the case where heat treatment is performed after the formation of the oxide semiconductor layer in the manufacturing process. Note that the oxide semiconductor layer is preferably an amorphous state and may be partly crystallized.

The change of the oxide semiconductor layer in an amorphous state to a microcrystalline state or a polycrystalline state in some cases is determined by conditions of heat treatment or a material used to form the oxide semiconductor layer.

Since a thin film transistor is easily broken due to static electricity or the like, a protective circuit for protecting a driver circuit is preferably provided over the same substrate as a gate wiring or a source wiring. The protective circuit is preferably formed with a non-linear element including an oxide semiconductor.

The gate insulating layer and the oxide semiconductor film may be successively subjected to treatment (also referred to as successive treatment, an in-situ process, or successive film formation) without exposure to air. Successive treatment without exposure to air makes it possible to obtain an interface between the gate insulating layer and the oxide semiconductor film, which is not contaminated by atmospheric components or impurities floating in air, such as water, hydrocarbon, or the like. Therefore, variation in characteristics of the thin film transistor can be reduced.

Note that the term "successive treatment" in this specification means that during the process from a first treatment step by a PCVD method or a sputtering method to a second treatment step by a PCVD method or a sputtering method, an atmosphere in which a substrate to be processed is disposed is kept controlled to be vacuum or an inert gas atmosphere (a nitrogen atmosphere or a rare gas atmosphere) without exposure to a contaminant atmosphere such as air. By the successive treatment, treatment such as film formation can be performed while preventing moisture or the like from being attached again to the substrate to be processed which is cleaned.

Performing the process from the first treatment step to the second treatment step in the same chamber is within the scope of the successive treatment in this specification.

In addition, the following is also within the scope of the successive treatment in this specification: in the case of performing the process from the first treatment step to the second treatment step in different chambers, the substrate is transferred after the first treatment step to another chamber without exposure to air and subjected to the second treatment.

Note that the case where there is a substrate transfer step, an alignment step, a slow cooling step, a step of heating or cooling a substrate so that the temperature of the substrate is suitable to the second treatment step, or the like between the first treatment step and the second treatment step is also in the range of the successive treatment in this specification.

A step in which liquid is used, such as a cleaning step, wet etching, or formation of a resist may be provided between the first treatment step and the second treatment step. This case is not within the scope of the successive treatment in this specification.

A thin film transistor having stable electric characteristics can be provided. Further, a semiconductor device including a highly reliable thin film transistor having favorable electric characteristics can be provided.

BRIEF DESCRIPTION OF DRAWINGS

FIGS. 6A to 6D are views illustrating a semiconductor device according to an embodiment of the present invention.

FIGS. 7A to 7D are cross-sectional views illustrating a method for manufacturing a semiconductor device according to an embodiment of the present invention.

FIGS. 8A to 8C are cross-sectional views illustrating the method for manufacturing a semiconductor device according to an embodiment of the present invention.

FIGS. 9A and 9B are cross-sectional views illustrating the method for manufacturing a semiconductor device according to an embodiment of the present invention.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 3A:
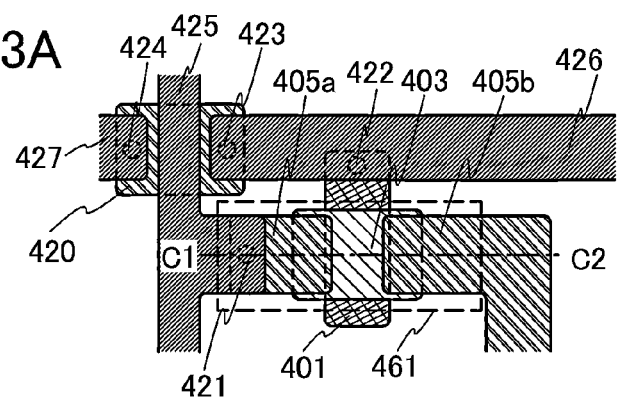
FIGS. 3A to 3D are views illustrating semiconductor devices according to an embodiment of the present invention.
Figure 3B:
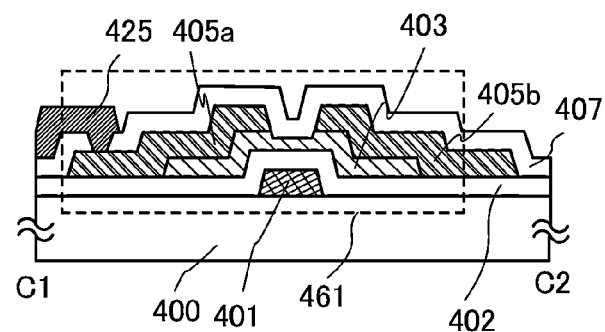

FIG. 3A is a plan view of a thin film transistor 461 included in a semiconductor device, and FIG. 3B is a cross-sectional view taken along line C1-C2 of FIG. 3A. The thin film transistor 461 is an inverted staggered thin film transistor. A gate electrode layer 401 is provided over a substrate 400 having an insulating surface. A gate insulating layer 402 is provided over the gate electrode layer 401. An oxide semiconductor layer 403 is provided over the gate insulating layer 402. A source electrode layer 405a and a drain electrode layer 405b are provided over the oxide semiconductor layer 403. In addition, an oxide insulating film 407 which covers the gate insulating layer 402, the oxide semiconductor layer 403, the source electrode layer 405a and the drain electrode layer 405b and which is in contact with part of the oxide semiconductor layer 403 is provided.

The oxide insulating film 407 is provided with a first contact hole 421 which reaches the source electrode layer 405a, a second contact hole 422 which reaches the gate electrode layer 401, and a third contact hole 423 and a fourth contact hole 424 which reach both end portions of a connection electrode layer 420. Here, in this embodiment, since a source wiring and a gate wiring are formed from the same layer, a first gate wiring 426 and a second gate wiring 427 are formed so as to sandwich a source wiring 425 therebetween. The first gate wiring 426 and the second gate wiring 427 are electrically connected to each other through the connection electrode layer 420 which is formed so as to overlap the source wiring 425. Here, the source wiring 425 is electrically connected to the source electrode layer 405a through the first contact hole 421. The first gate wiring 426 is electrically connected to the gate electrode layer 401 through the second contact hole 422. The first gate wiring 426 and the second gate wiring 427 are electrically connected to the connection electrode layer 420 through the third contact hole 423 and the fourth contact hole 424. The source wiring 425, the first gate wiring 426, and the second gate wiring 427 extend beyond the perimeter of the oxide semiconductor layer 403.

After the oxide insulating film 407 serving as a protective film is formed in contact with the oxide semiconductor layer 403, heat treatment for reducing impurities such as moisture (heat treatment for dehydration or dehydrogenation) is performed on the oxide semiconductor layer 403.

Impurities such as moisture, which exist not only in the oxide semiconductor layer 403 but also in the gate insulating layer 402, in the source electrode layer 405a, in the drain electrode layer 405b, and at interfaces between the oxide semiconductor layer 403 and upper and lower films which are in contact with the oxide semiconductor layer 403, specifically, at an interface between the gate insulating layer 402 and the oxide semiconductor layer 403 or at an interface between the oxide insulating film 407 and the oxide semiconductor layer 403, are reduced. When the moisture or the like content in the oxide semiconductor layer 403 is reduced with the heat treatment, electric characteristics of the thin film transistor can be improved.

With this heat treatment, plasma damage which is caused to the oxide semiconductor layer 403 is repaired when the oxide insulating film 407 is formed.

Each of the gate electrode layer 401, the connection electrode layer 420, the source electrode layer 405a, and the drain electrode layer 405b preferably includes a heat resistant conductive material. As the heat resistant conductive material, an element selected from titanium, tantalum, tungsten, molybdenum, chromium, neodymium, or scandium; an alloy including any of these elements as a component; or a nitride including any of these elements as a component can be used. The gate electrode layer 401, the connection electrode layer 420, the source electrode layer 405a, and the drain electrode layer 405b may have a stacked structure of an element selected from titanium, tantalum, tungsten, molybdenum, chromium, neodymium, or scandium; an alloy including any of these elements as a component; or a nitride including any of these elements as a component. For example, a combination of tungsten nitride for a first layer and tungsten for a second layer, a combination of molybdenum nitride for the first layer and tungsten for the second layer, or a combination of titanium nitride for the first layer and titanium for the second layer may be employed.

For the heat resistant conductive material used for the connection electrode layer 420, the source electrode layer 405a, and the drain electrode layer 405b, a transparent conductive oxide containing any of indium, tin, or zinc may be used. For example, indium oxide ($In_2O_3$) or an indium oxide-tin oxide ($In_2O_3$—$SnO_2$, abbreviated to ITO) alloy is preferably used. Alternatively, a transparent conductive oxide to which an insulating oxide such as silicon oxide is added may be used.

By inclusion of the insulating oxide such as silicon oxide in the transparent conductive oxide, crystallization of the transparent conductive oxide can be suppressed and the transparent conductive oxide can have an amorphous structure. Crystallization of the transparent conductive oxide is suppressed and an amorphous structure is formed, so that crystallization of the transparent conductive oxide or generation of microcrystalline grains can be prevented even when heat treatment is performed.

When such a heat resistant conductive material is included in the gate electrode layer 401, the connection electrode layer 420, the source electrode layer 405a, and the drain electrode layer 405b, the gate electrode layer 401, the connection electrode layer 420, the source electrode layer 405a, and the drain electrode layer 405b can endure the heat treatment which is performed after the oxide insulating film 407 is formed.

The source wiring 425, the first gate wiring 426, and the second gate wiring 427 are preferably formed using a low resistance conductive material which has lower resistivity than the source electrode layer 405a and the drain electrode layer 405b, and aluminum or copper is particularly preferable. With the use of the low resistance conductive material for the source wiring 425, the first gate wiring 426, and the second gate wiring 427, wiring resistance or the like can be reduced.

The low resistance conductive material such as aluminum or copper has low heat resistance. However, the heat treatment is performed after forming the oxide insulating film, and then the source wiring 425, the first gate wiring 426, and the second gate wiring 427 are provided, whereby the above low resistance conductive material can be used as the source wiring 425, the first gate wiring 426, and the second gate wiring 427.

As the oxide semiconductor layer 403 including a channel formation region, an oxide material having semiconductor characteristics may be used, and typically, In—Ga—Zn—O-based non-single-crystal is used.

Figure 3C:
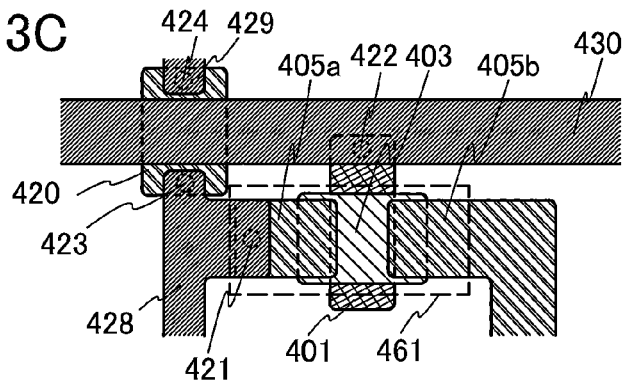

As illustrated in FIG. 3C, a first source wiring 428 and a second source wiring 429 may be formed so as to sandwich a gate wiring 430 therebetween and may be electrically connected to each other through the connection electrode layer 420 which is formed so as to overlap the gate wiring 430. Here, the first source wiring 428 is electrically connected to the source electrode layer 405a through the first contact hole 421. The gate wiring 430 is electrically connected to the gate electrode layer 401 through the second contact hole 422. The first source wiring 428 and the second source wiring 429 are electrically connected to the connection electrode layer 420 through the third contact hole 423 and the fourth contact hole 424 which reach both end portions of the connection electrode layer 420. The other portions are similar to those of the thin film transistor illustrated in FIGS. 3A and 3B.

Figure 3D:
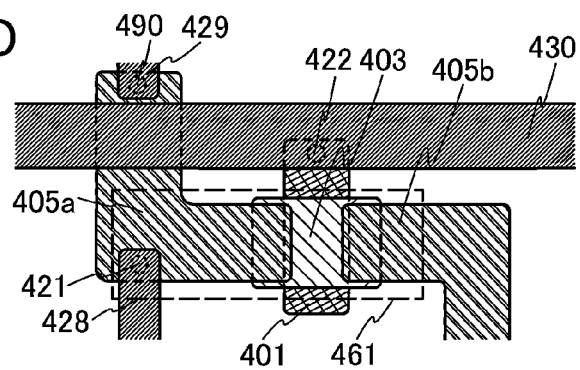

As illustrated in FIG. 3D, the source electrode layer 405a may be formed so as to overlap the gate wiring 430, and the first source wiring 428 and the second source wiring 429 may be electrically connected to each other through the source electrode layer 405a. Here, the first source wiring 428 is electrically connected to the source electrode layer 405a through the first contact hole 421. The second source wiring 429 is electrically connected to the source electrode layer 405a through a third contact hole 490 provided over the source electrode layer 405a. The other portions are similar to those of the thin film transistor illustrated in FIG. 3C.

FIGS. 1A to 1E are cross-sectional views of a manufacturing process of the thin film transistor 461 illustrated in FIGS. 3A and 3B, and FIGS. 2A to 2D are plan views of the manufacturing process.

First, over the substrate 400 having an insulating surface, the gate electrode layer 401 is provided using a photolithography process with the use of a photomask.

Although there is no particular limitation on a glass substrate which can be used, it is necessary that the glass substrate have at least enough heat resistance to heat treatment to be performed later. As the light-transmitting substrate 400, it is possible to use a glass substrate made of barium borosilicate glass, aluminoborosilicate glass, or the like.

As the substrate 400, a substrate whose strain point is higher than or equal to 730° C. may be used when the temperature of later heat treatment is high. Further, as a material of the substrate 400, for example, a glass material such as aluminosilicate glass, aluminoborosilicate glass, or barium borosilicate glass is used. Note that by containing a larger amount of barium oxide (BaO) than boric acid, a glass substrate is heat-resistant and of more practical use. Therefore, a glass substrate containing a larger amount of BaO than $B_2O_3$ is preferably used.

Note that a substrate formed of an insulator such as a ceramic substrate, a quartz glass substrate, a quartz substrate, or a sapphire substrate may be used instead of the glass substrate 400. Alternatively, crystallized glass or the like may be used.

An insulating film serving as a base film may be provided between the substrate 400 and the gate electrode layer 401. The base film has a function of preventing diffusion of an impurity element from the substrate 400, and can be formed to have a single-layer or stacked structure using one or more of a silicon nitride film, a silicon oxide film, a silicon nitride oxide film, and a silicon oxynitride film.

Since heat treatment is performed in a later step, a material of the gate electrode layer 401 preferably includes a heat resistant conductive material. As the heat resistant conductive material, an element selected from titanium, tantalum, tungsten, molybdenum, chromium, neodymium, or scandium; an alloy including any of these elements as a component; or a nitride including any of these elements as a component can be used. The gate electrode layer 401 may have a single-layer or stacked structure of an element selected from titanium, tantalum, tungsten, molybdenum, chromium, neodymium, or scandium; an alloy including any of these elements as a component; or a nitride including any of these elements as a component. For example, a combination of tungsten nitride for a first layer and tungsten for a second layer, a combination of molybdenum nitride for the first layer and tungsten for the second layer, or a combination of titanium nitride for the first layer and titanium for the second layer may be employed. However, a material of the gate electrode layer 401 preferably has heat resistance that can withstand at least later heat treatment.

At this time, the connection electrode layer 420 which is formed at the same time as the formation of the source electrode layer 405a and the drain electrode layer 405b in a later step may be formed at the same time as the formation of the gate electrode layer 401. In that case, the connection electrode layer 420 is not necessarily formed when the source electrode layer 405a and the drain electrode layer 405b are formed.

Next, the gate insulating layer 402 is formed over the gate electrode layer 401.

The gate insulating layer can be formed as a single layer or a stacked layer using any of a silicon oxide layer, a silicon nitride layer, a silicon oxynitride layer, and a silicon nitride oxide layer by a plasma enhanced CVD method, a sputtering method, or the like. For example, a silicon oxynitride layer may be formed using a deposition gas containing $SiH_4$, oxygen, and nitrogen by a plasma enhanced CVD method.

Next, an oxide semiconductor film is formed over the gate insulating layer 402.

Note that before the oxide semiconductor film is formed by a sputtering method, powdery substances (also referred to as particles or dust) which are generated at the time of the film formation and attached on a surface of the gate insulating layer 402 are preferably removed by reverse sputtering in which an argon gas is introduced and plasma is generated. The reverse sputtering refers to a method in which an RF power supply is used for application of voltage to a substrate side in an argon atmosphere and plasma is generated around the substrate to modify a surface. Note that instead of an argon atmosphere, a nitrogen atmosphere, a helium atmosphere, or the like may be used.

The oxide semiconductor film is formed by a sputtering method with the use of an In—Ga—Zn—O-based oxide semiconductor target. Alternatively, the oxide semiconductor film can be formed by a sputtering method under a rare gas (typically, argon) atmosphere, an oxygen atmosphere, or an atmosphere containing a rare gas (typically, argon) and oxygen.

The gate insulating layer 402 and the oxide semiconductor film may be formed successively without exposure to air. Successive film formation without exposure to air makes it possible to obtain each interface between stacked layers, which is not contaminated by atmospheric components or impurity elements floating in air, such as water, hydrocarbon, or the like. Therefore, variation in characteristics of the thin film transistor can be reduced.

The oxide semiconductor film is processed into an island-shaped oxide semiconductor layer using a photolithography process with the use of a photomask.

Next, a first conductive film is formed over the gate insulating layer 402 and the oxide semiconductor layer.

The material used for the first conductive film preferably includes a heat resistant conductive material in order to perform heat treatment in a later process. As the heat resistant conductive material, an element selected from titanium, tantalum, tungsten, molybdenum, chromium, neodymium, or scandium; an alloy including any of these elements as a component; or a nitride including any of these elements as a component can be used. The first conductive film may have a single-layer or stacked structure of an element selected from titanium, tantalum, tungsten, molybdenum, chromium, neodymium, or scandium; an alloy including any of these elements as a component; or a nitride including any of these elements as a component. For example, a combination of tungsten nitride for a first layer and tungsten for a second layer, a combination of molybdenum nitride for the first layer and tungsten for the second layer, or a combination of titanium nitride for the first layer and titanium for the second layer may be used. However, a material of the first conductive film preferably has heat resistance that can withstand at least later heat treatment.

For the heat resistant conductive material used for the first conductive film, a transparent conductive oxide containing any of indium, tin, or zinc may be used. For example, indium oxide ($In_2O_3$) or an indium oxide-tin oxide ($In_2O_3$—$SnO_2$, abbreviated to ITO) alloy is preferably used. Alternatively, a transparent conductive oxide to which an insulating oxide such as silicon oxide is added may be used.

By inclusion of the insulating oxide such as silicon oxide in the transparent conductive oxide, crystallization of the transparent conductive oxide can be suppressed and the transparent conductive oxide can have an amorphous structure. Crystallization of the transparent conductive oxide is suppressed and an amorphous structure is provided, so that crystallization of the transparent conductive oxide or generation of microcrystalline grains can be prevented even when heat treatment is performed.

Figure 1A:
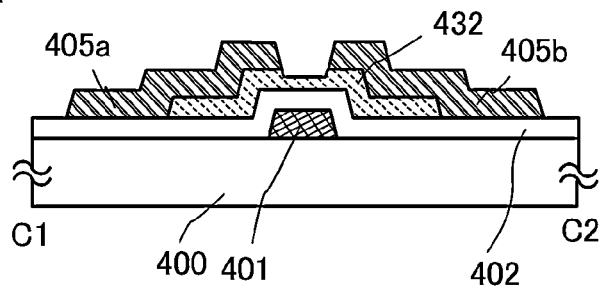
FIGS. 1A to 1E are cross-sectional views illustrating a manufacturing process according to an embodiment of the present invention.
Figure 2A:
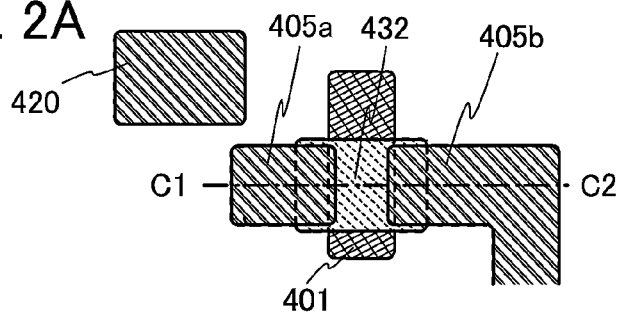
FIGS. 2A to 2D are plan views illustrating a manufacturing process according to an embodiment of the present invention.

The oxide semiconductor layer and the first conductive film are processed into an oxide semiconductor layer 432, the source electrode layer 405a, the drain electrode layer 405b, and the connection electrode layer 420 using a photolithography with the use of a photomask (see FIG. 1A and FIG. 2A). Note that only part of the oxide semiconductor layer is etched to be the oxide semiconductor layer 432 having a groove (depression).

The connection electrode layer 420 is not necessarily formed when the connection electrode layer 420 is formed at the same time as the formation of the gate electrode layer 401. Also in the case of having the structure illustrated in FIG. 3D, the connection electrode layer 420 is not necessarily formed.

Figure 1B:
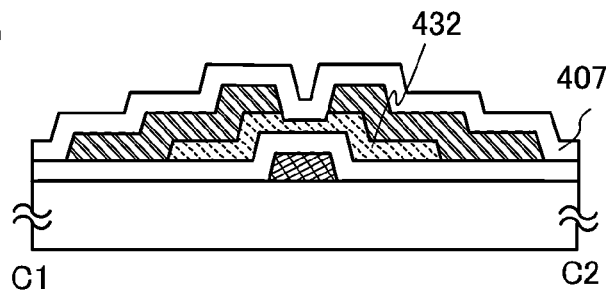

The oxide insulating film 407 which covers the gate insulating layer 402, the oxide semiconductor layer 432, the source electrode layer 405a, and the drain electrode layer 405b and which is in contact with part of the oxide semiconductor layer 432 is formed (see FIG. 1B). The oxide insulating film 407 can be formed to a thickness of at least 1 nm or more using a method by which impurities such as water and hydrogen are prevented from being mixed to the oxide insulating film 407, such as a CVD method or a sputtering method, as appropriate. Here, the oxide insulating film 407 is formed using a sputtering method. The oxide insulating film 407 which is in contact with part of the oxide semiconductor layer 432 does not include impurities such as moisture, hydrogen ions, and OH⁻ and is formed using an inorganic insulating film which prevents entry of these from the outside. Specifically, a silicon oxide film, a silicon nitride oxide film, an aluminum oxide film, or an aluminum oxynitride film is used. Further, a silicon nitride film or an aluminum nitride film may be stacked so as to be formed over and in contact with the oxide insulating film 407. The silicon nitride film does not include impurities such as moisture, hydrogen ions, and OH⁻ and prevents entry of these from the outside.

When slow cooling is performed under an oxygen atmosphere after heat treatment to be performed later, a region including oxygen at high concentration near a surface of the oxide semiconductor layer can be formed, and the oxide semiconductor layer can have sufficient high resistance, a silicon nitride film may be formed instead of the oxide insulating film 407. For example, slow cooling may be performed so that the substrate temperature is lowered by at least approximately 50° C. to 100° C. from the highest heating temperature.

In this embodiment, a silicon oxide film having a thickness of 300 nm is formed as the oxide insulating film 407. The substrate temperature at the time of film formation may be higher than or equal to a room temperature and lower than or equal to 300° C., and the temperature is set at 100° C. in this embodiment. The silicon oxide film can be formed by a sputtering method under a rare gas (typically, argon) atmosphere, an oxygen atmosphere, or an atmosphere containing a rare gas (typically, argon) and oxygen. In addition, a silicon oxide target or a silicon target can be used as a target. For example, the silicon oxide film can be formed using a silicon target by a sputtering method under an atmosphere containing oxygen and nitrogen.

Figure 1C:
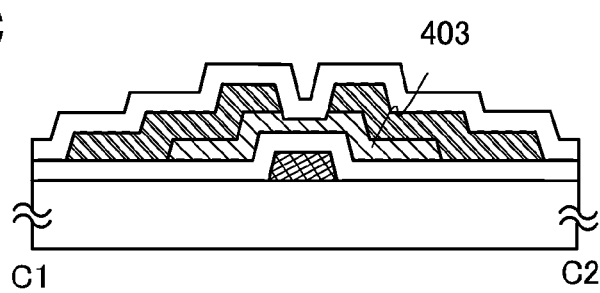
Figure 2B:
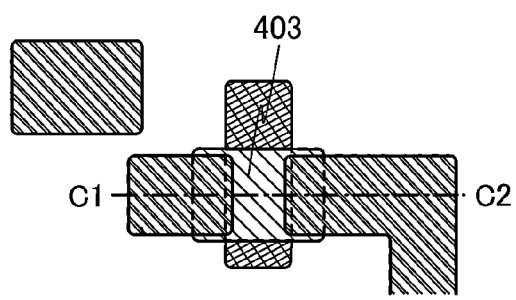

Next, heat treatment is performed on the source electrode layer 405a, the drain electrode layer 405b, the gate insulating layer 402, the oxide insulating film 407, and the oxide semiconductor layer 432 under an oxygen gas atmosphere, an inert gas atmosphere (nitrogen, helium, neon, argon, or the like), or under reduced pressure, whereby the oxide semiconductor layer 403 is formed (see FIG. 1C and FIG. 2B). The heat treatment is performed at a temperature of higher than or equal to 200° C. and lower than or equal to 700° C., preferably, higher than or equal to 350° C. and lower than the strain point of the substrate 400. When the heat treatment is performed on the source electrode layer 405a, the drain electrode layer 405b, the gate insulating layer 402, the oxide insulating film 407, and the oxide semiconductor layer 403 under the above atmosphere, impurities such as hydrogen and water included in the source electrode layer 405a, in the drain electrode layer 405b, in the gate insulating layer 402, in the oxide insulating film 407, and in the oxide semiconductor layer 403, and at interfaces between the oxide semiconductor layer 403 and upper and lower films which are in contact with the oxide semiconductor layer 403 can be removed. In accordance with conditions of the heat treatment or a material of the oxide semiconductor layer, the oxide semiconductor layer is crystallized and changed to a microcrystalline film or a polycrystalline film in some cases.

When the oxide insulating film 407 serving as a protective film is formed in contact with the oxide semiconductor layer 432, there is a possibility that the oxide semiconductor layer 432 might receive plasma damage. However, with the heat treatment, plasma damage which is caused to the oxide semiconductor layer 432 can be repaired.

With this heat treatment, oxygen in the oxide insulating film 407 is supplied to the oxide semiconductor layer 403 using solid-phase diffusion. Accordingly, since the resistance of the oxide semiconductor layer 403 increases, a highly reliable thin film transistor with favorable electric characteristics can be manufactured.

The heat treatment can reduce variation in electric characteristics of the thin film transistor.

Note that in heat treatment, it is preferable that water, hydrogen, and the like be not contained in nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more, that is, an impurity concentration is set to 1 ppm or lower, preferably, 0.1 ppm or lower. After the heat treatment, slow cooling is preferably performed under an oxygen atmosphere. For example, slow cooling may be performed so that the substrate temperature is lowered by at least approximately 50° C. to 100° C. from the highest heating temperature.

As the heat treatment, an instantaneous heating method can be employed, such as a heating method using an electric furnace, a gas rapid thermal annealing (GRTA) method using a heated gas, or a lamp rapid thermal anneal (LRTA) method using lamp light.

Here, as an embodiment of heat treatment of the source electrode layer 405a, the drain electrode layer 405b, the gate insulating layer 402, the oxide insulating film 407, and the oxide semiconductor layer 432, a heating method using an electric furnace 601 will be described with reference to FIG. 15.

Figure 15:
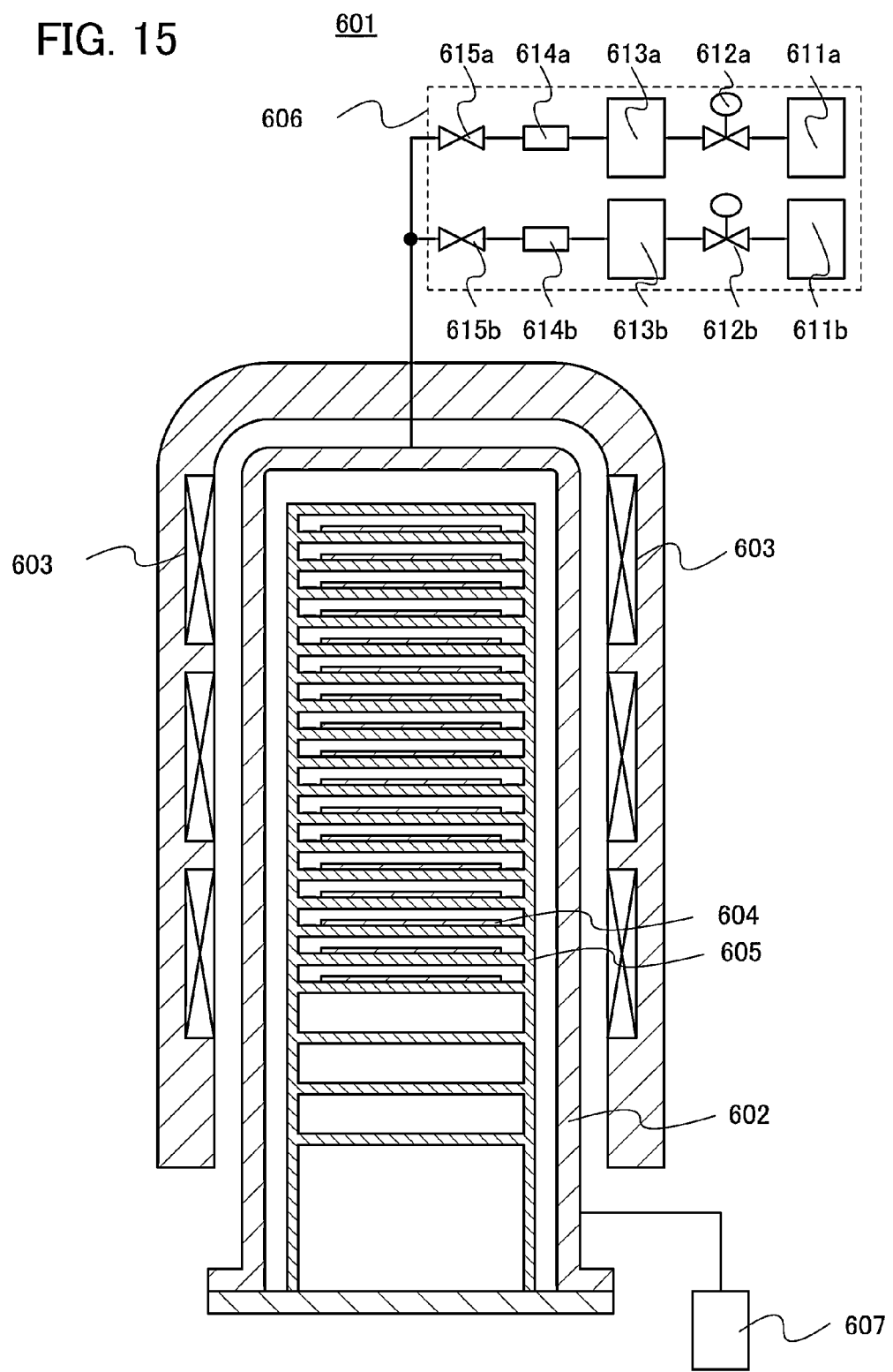
FIG. 15 is a cross-sectional view illustrating an electric furnace.

FIG. 15 is a schematic view of the electric furnace 601. Heaters 603 are provided outside a chamber 602, which heats the chamber 602. Inside the chamber 602, a susceptor 605 in which a substrate 604 is mounted is provided. The substrate 604 is transferred into/from the chamber 602. In addition, the chamber 602 is provided with a gas supply means 606 and an evacuation means 607. With the gas supply means 606, a gas is introduced into the chamber 602. The evacuation means 607 exhausts the inside of the chamber 602 or reduces the pressure in the chamber 602. Note that the temperature rise characteristics of the electric furnace 601 are preferably set to from 0.1° C./min to 20° C./min, inclusive. The temperature drop characteristics of the electric furnace 601 are preferably set to from 0.1° C./min to 15° C./min, inclusive.

The gas supply means 606 includes a gas supply source 611a, a gas supply source 611b, a pressure regulation valve 612a, a pressure regulation valve 612b, a refiner 613a, a refiner 613*b*, a mass flow controller 614*a*, a mass flow controller 614*b*, a stop valve 615*a*, and a stop valve 615*b*. In this embodiment, the refiner 613*a* and the refiner 613*b* are preferably provided between the gas supply source 611*a* and the chamber 602 and between the gas supply source 611*b* and the chamber 602, respectively. The refiner 613*a* and the refiner 613*b* can remove impurities such as water and hydrogen in a gas which is introduced into the chamber 602 from the gas supply source 611*a* and the gas supply source 611*b*; thus, entry into the chamber 602 of water, hydrogen, and the like, can be suppressed by provision of the refiner 613*a* and the refiner 613*b*.

In this embodiment, nitrogen or a rare gas is introduced into the chamber 602 from the gas supply source 611*a* or the gas supply source 611*b*, respectively, so that the inside of the chamber is in an oxygen atmosphere, a nitrogen atmosphere, or a rare gas atmosphere. In the chamber 602 which is heated at a temperature of higher than or equal to 200° C. and lower than or equal to 700° C., preferably, higher than or equal to 350° C. and lower than the strain point of the substrate 400, the oxide semiconductor layer 432 formed over the substrate 400 is heated, whereby the oxide semiconductor layer 432 can be subjected to dehydration or dehydrogenation.

Alternatively, the chamber 602 in which the pressure is reduced by the evacuation means is heated at a temperature of higher than or equal to 200° C. and lower than or equal to 700° C., preferably, higher than or equal to 350° C. and lower than the strain point of the substrate 400. In such a chamber 602, the oxide semiconductor layer 432 formed over the substrate 400 is heated, whereby the oxide semiconductor layer 432 can be subjected to dehydration or dehydrogenation.

Next, introduction of nitrogen or a rare gas from the gas supply source 611*a* into the chamber 602 is stopped, and the heaters are turned off. Then, oxygen is introduced from the gas supply source 611*b* into the chamber 602, and the chamber 602 of a heating apparatus is gradually cooled. That is, the chamber 602 has an oxygen atmosphere, and the substrate 604 is gradually cooled. Here, impurities such as water and hydrogen are preferably not included in oxygen which is introduced from the gas supply source 611*b* into the chamber 602. Alternatively, the purity of oxygen introduced from the gas supply source 611*b* into the chamber 602 is preferably 6N (99.9999%) or more, more preferably, 7N (99.99999%) or more, that is, an impurity concentration in oxygen is set to 1 ppm or lower, preferably, 0.1 ppm or lower.

As a result, reliability of the thin film transistor to be formed later can be improved.

Note that when heat treatment is performed under reduced pressure, oxygen may be introduced into the chamber 602 after the heat treatment, pressure may be returned to atmospheric pressure, and then cooling may be performed.

Alternatively, oxygen is introduced from the gas supply source 611*b* into the chamber 602, and at the same time, one of or both nitrogen and a rare gas such as helium, neon, or argon may be introduced into the chamber 602.

After the substrate 604 in the chamber 602 of the heating apparatus is cooled to 300° C., the substrate 604 may be transferred into an atmosphere at room temperature. As a result, the cooling time of the substrate 604 can be shortened.

When the heating apparatus has a multi-chamber structure, heat treatment and cooling treatment can be performed in chambers different from each other. Typically, an oxide semiconductor layer over a substrate is heated in a first chamber that is filled with oxygen, nitrogen, or a rare gas and heated at a temperature of higher than or equal to 200° C. and lower than or equal to 700° C., preferably, higher than or equal to 350° C. and lower than the strain point of the substrate 400.

Next, the substrate which has been subjected to the heat treatment is transferred, through the transfer chamber in which nitrogen or a rare gas is introduced, into a second chamber that is filled with oxygen and heated at a temperature of lower than or equal to 100° C., preferably at room temperature, and then cooling treatment is performed therein. Through this process, throughput can be increased.

Although the oxide semiconductor layer 432 which has been subjected to heat treatment under an inert gas atmosphere or reduced pressure is preferably an amorphous state, part of the oxide semiconductor layer 432 may be crystallized.

As described above, when heat treatment is performed after the oxide insulating film serving as a protective film is formed in contact with the oxide semiconductor layer, impurities ($H_2O$, H, OH, or the like) included in the source electrode layer, the drain electrode layer, the gate insulating layer, the oxide insulating film, and the oxide semiconductor layer can be reduced. With the heat treatment, plasma damage which is caused to the oxide semiconductor layer when the oxide insulating film serving as a protective film is formed in contact with the oxide semiconductor layer can be repaired. The heat treatment can reduce variation in electric characteristics of the thin film transistor. As described above, electric characteristics and reliability of the thin film transistor 461 can be improved.

Figure 1D:
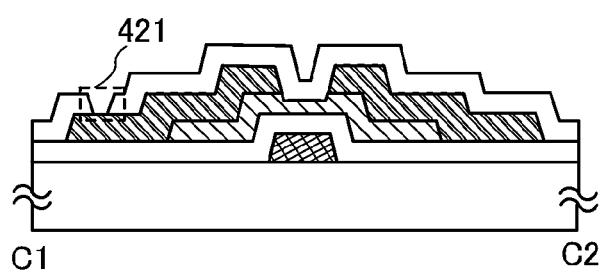
Figure 2C:
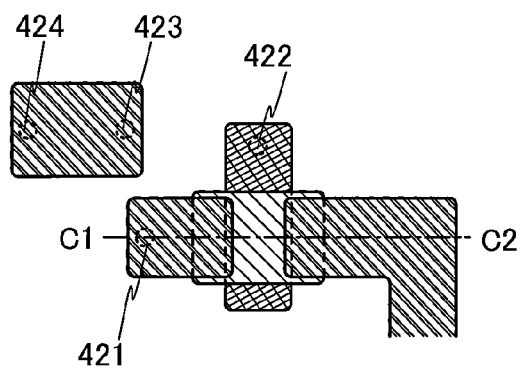

Next, the first contact hole 421, the second contact hole 422, the third contact hole 423, and the fourth contact hole 424 are formed in the oxide insulating film 407 (see FIG. 1D and FIG. 2C). First, when part of the oxide insulating film 407 is removed by etching, the first contact hole 421 which reaches the source electrode layer 405*a*, part of the second contact hole 422 which reaches the gate electrode layer 401, and the third contact hole 423 and the fourth contact hole 424 which reach both end portions of the connection electrode layer 420 are formed. Further, part of the gate insulating layer 402 is removed by etching, so that the second contact hole 422 which reaches the gate electrode layer 401 is formed.

Next, a second conductive film is formed over the oxide insulating film 407. Here, the second conductive film is connected to the source electrode layer 405*a*, the gate electrode layer 401, and the connection electrode layer 420 through the first contact hole 421, the second contact hole 422, the third contact hole 423, and the fourth contact hole 424.

The second conductive film is preferably formed using a low resistance conductive material which has lower resistivity than the source electrode layer 405*a* and the drain electrode layer 405*b*, and aluminum or copper is particularly preferable. With the use of the low resistance conductive material for the second conductive film, wiring resistance or the like can be reduced.

Although the low resistance conductive material such as aluminum or copper has low heat resistivity, the second conductive film can be provided after the heat treatment; therefore, the low resistance conductive material such as aluminum or copper can be used.

Figure 1E:
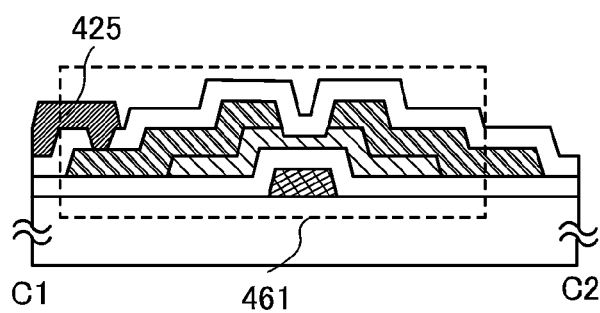
Figure 2D:
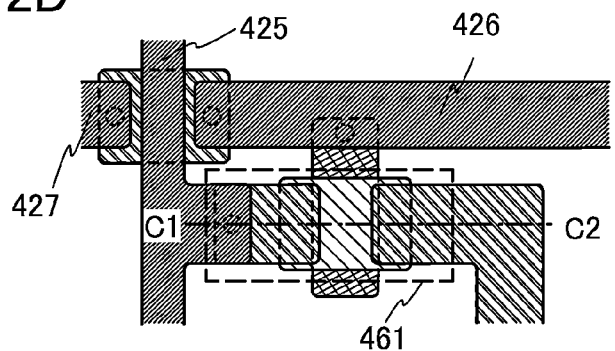

Next, the second conductive film is processed using a photolithography process with the use of a photomask, so that the source wiring 425, the first gate wiring 426, and the second gate wiring 427 are formed over the oxide insulating film 407 (see FIG. 1E and FIG. 2D). The source wiring 425 is formed so as to overlap the connection electrode layer 420 and so as to be connected to the source electrode layer 405*a* through the first contact hole 421. The first gate wiring 426 and the second gate wiring 427 are formed so as to sandwich the source wiring 425 therebetween. Here, the first gate wiring 426 is formed so as to be connected to the gate electrode layer 401 through the second contact hole 422 and so as to be connected to the connection electrode layer 420 through the third contact hole 423. The second gate wiring 427 is formed so as to be connected to the connection electrode layer 420 through the fourth contact hole 424. Accordingly, the first gate wiring 426 and the second gate wiring 427 are electrically connected to each other through the connection electrode layer 420.

Through the above process, the thin film transistor 461 can be formed. The structures illustrated in FIGS. 3C and 3D can be manufactured in a similar process.

As described above, when heat treatment is performed after the oxide insulating film serving as a protective film is formed in contact with the oxide semiconductor layer, impurities ($H_2O$, H, OH, or the like) included in the source electrode layer, the drain electrode layer, the gate insulating layer, and the oxide semiconductor layer can be reduced. With the heat treatment, plasma damage which is caused to the oxide semiconductor layer when the oxide insulating film serving as a protective film is formed in contact with the oxide semiconductor layer can be repaired. The heat treatment can reduce variation in electric characteristics of the thin film transistor. Therefore, reliability of the thin film transistor 461 can be improved.

This embodiment can be implemented in appropriate combination with the structures described in the other embodiments.

Embodiment 2

A semiconductor device and a method for manufacturing the semiconductor device will be described with reference to FIGS. 4A to 4E, FIGS. 5A to 5D, and FIGS. 6A to 6D. The same portion as Embodiment 1 or a portion having similar function to that described in Embodiment 1 can be formed in a manner similar to that described in Embodiment 1; therefore, repetitive description is omitted.

FIG. 6A is a plan view of a thin film transistor 460 included in a semiconductor device, and FIG. 6B is a cross-sectional view taken along line D1-D2 of FIG. 6A. The thin film transistor 460 is an inverted staggered thin film transistor. A gate electrode layer 451 is provided over a substrate 450 having an insulating surface. A gate insulating layer 452 is provided over the gate electrode layer 451. A source electrode layer 455a and a drain electrode layer 455b are provided over the gate insulating layer 452. An oxide semiconductor layer 453 is provided over the source electrode layer 455a, the drain electrode layer 455b, and the gate insulating layer 452. An oxide insulating film 457 which covers the gate insulating layer 452, the oxide semiconductor layer 453, the source electrode layer 455a, and the drain electrode layer 455b and which is in contact with the oxide semiconductor layer 453 is provided. An In—Ga—Zn—O-based non-single-crystal film is used for the oxide semiconductor layer 453.

The oxide insulating film 457 is provided with a first contact hole 471 which reaches the source electrode layer 455a, a second contact hole 472 which reaches the gate electrode layer 451, and a third contact hole 473 and a fourth contact hole 474 which reach both end portions of a connection electrode layer 470. Here, in this embodiment, a source wiring and a drain wiring are formed from the same layer; therefore, a first gate wiring 476 and a second gate wiring 477 are formed so as to sandwich a source wiring 475 therebetween. The first gate wiring 476 and the second gate wiring 477 are electrically connected to each other through the connection electrode layer 470 which is formed so as to overlap the source wiring 475. Here, the source wiring 475 is electrically connected to the source electrode layer 455a through the first contact hole 471. The first gate wiring 476 is electrically connected to the gate electrode layer 451 through the second contact hole 472. The first gate wiring 476 and the second gate wiring 477 are electrically connected to the connection electrode layer 470 through the third contact hole 473 and the fourth contact hole 474. The source wiring 475, the first gate wiring 476, and the second gate wiring 477 extend beyond the perimeter of the oxide semiconductor layer 453.

After the oxide insulating film 457 serving as a protective film is formed in contact with the oxide semiconductor layer 453, heat treatment for reducing impurities such as moisture (heat treatment for dehydration or dehydrogenation) is performed on the oxide semiconductor layer 453.

Impurities such as moisture which exist not only in the oxide semiconductor layer 453 but also in the gate insulating layer 452, in the source electrode layer 455a, in the drain electrode layer 455b, or at interfaces between the oxide semiconductor layer 453 and upper and lower films which are in contact with the oxide semiconductor layer 453, specifically, at an interface between the gate insulating layer 452 and the oxide semiconductor layer 453 or at an interface between the oxide insulating film 457 and the oxide semiconductor layer 453 are reduced. When the moisture content or the like in the oxide semiconductor layer 453 is reduced with the heat treatment, electric characteristics of the thin film transistor can be improved.

With the heat treatment, plasma damage which is caused to the oxide semiconductor layer 453 when the oxide insulating film 457 is formed is repaired.

Each of the gate electrode layer 451, the connection electrode layer 470, the source electrode layer 455a, and the drain electrode layer 455b preferably includes a heat resistant conductive material. As the heat resistant conductive material, an element selected from titanium, tantalum, tungsten, molybdenum, chromium, neodymium, or scandium; an alloy including any of these elements as a component; or a nitride including any of these elements as a component can be used. The gate electrode layer 451, the connection electrode layer 470, the source electrode layer 455a, and the drain electrode layer 455b may have a stacked structure of an element selected from titanium, tantalum, tungsten, molybdenum, chromium, neodymium, or scandium; an alloy including any of these elements as a component; or a nitride including any of these elements as a component. For example, a combination of tungsten nitride for a first layer and tungsten for a second layer, a combination of molybdenum nitride for the first layer and tungsten for the second layer, or a combination of titanium nitride for the first layer and titanium for the second layer may be employed.

For the heat resistant conductive material used for the connection electrode layer 470, the source electrode layer 455a, and the drain electrode layer 455b, a transparent conductive oxide containing any of indium, tin, or zinc may be used. For example, indium oxide ($In_2O_3$) or an indium oxide-tin oxide ($In_2O_3$—$SnO_2$, abbreviated to ITO) alloy is preferably used. Alternatively, a transparent conductive oxide to which an insulating oxide such as silicon oxide is added may be used.

By inclusion of the insulating oxide such as silicon oxide in the transparent conductive oxide, crystallization of the transparent conductive oxide can be suppressed and the transparent conductive oxide can have an amorphous structure. Crystallization of the transparent conductive oxide is suppressed and the transparent conductive oxide has an amorphous structure, so that crystallization of the transparent conductive oxide or generation of microcrystalline grains can be prevented even when heat treatment is performed.

Such a heat resistant conductive material is included in the gate electrode layer 451, the connection electrode layer 470, the source electrode layer 455a, and the drain electrode layer 455b, whereby the gate electrode layer 451, the connection electrode layer 470, the source electrode layer 455a, and the drain electrode layer 455b can endure heat treatment which is performed after the oxide insulating film 457 is formed.

The source wiring 475, the first gate wiring 476, and the second gate wiring 477 are preferably formed using a low resistance conductive material which has lower resistivity than the source electrode layer 455a and the drain electrode layer 455b, and aluminum or copper is particularly preferable. With the use of the low resistance conductive material for the source wiring 475, the first gate wiring 476, and the second gate wiring 477, wiring resistance or the like can be reduced.

The low resistance conductive material such as aluminum or copper has low heat resistance. However, when the source wiring 475, the first gate wiring 476, and the second gate wiring 477 are provided after performing heat treatment and forming the oxide insulating layer, and then the above low resistance conductive material can be used as the source wiring 475, the first gate wiring 476, and the second gate wiring 477.

As the oxide semiconductor layer 453 including a channel formation region, an oxide material having semiconductor characteristics may be used, and typically, In—Ga—Zn—O-based non-single-crystal is used.

As illustrated in FIG. 6C, a first source wiring 478 and a second source wiring 479 may be formed so as to sandwich a gate wiring 480 therebetween and may be electrically connected to each other through the connection electrode layer 470 which is formed so as to overlap the gate wiring 480. Here, the first source wiring 478 is electrically connected to the source electrode layer 455a through the first contact hole 471. The gate wiring 480 is electrically connected to the gate electrode layer 451 through the second contact hole 472. The first source wiring 478 and the second source wiring 479 are electrically connected to the connection electrode layer 470 through the third contact hole 473 and the fourth contact hole 474 which reach both end portions of the connection electrode layer 470. The other portions are similar to those of the thin film transistor illustrated in FIGS. 6A and 6B.

As illustrated in FIG. 6D, the source electrode layer 455a may be formed so as to overlap the gate wiring 480, and the first source wiring 478 and the second source wiring 479 may be electrically connected to each other through the source electrode layer 455a. Here, the first source wiring 478 is electrically connected to the source electrode layer 455a through the first contact hole 471. The second source wiring 479 is electrically connected to the source electrode layer 455a through a third contact hole 491 provided over the source electrode layer 455a. The other portions are similar to those of the thin film transistor illustrated in FIG. 6C.

FIGS. 4A to 4E are cross-sectional views of a manufacturing process of the thin film transistor 460 illustrated in FIGS. 6A and 6B, while FIGS. 5A to 5D are plan views of the manufacturing process.

The gate electrode layer 451 is provided over the substrate 450 which is a substrate having an insulating surface. An insulating film serving as a base film may be provided between the substrate 450 and the gate electrode layer 451. The gate electrode layer 451 can be formed using a material which is similar to that of the gate electrode layer 401 described in Embodiment 1.

In a manner similar to that of Embodiment 1, the connection electrode layer 470 which is formed at the same time as the formation of the source electrode layer 455a and the drain electrode layer 455b in a later step may be formed at the same time as the formation of the gate electrode layer 451. In that case, the connection electrode layer 470 is not necessarily formed when the source electrode layer 455a and the drain electrode layer 455b are formed.

The gate insulating layer 452 is formed over the gate electrode layer 451. The gate insulating layer 452 can be formed in a manner similar to that of the gate insulating layer 402 described in Embodiment 1.

A first conductive film is formed over the gate insulating layer 452 and patterned into the island-shaped source electrode layer 455a, the island-shaped drain electrode layer 455b, and the connection electrode layer 470 by a photolithography process. The first conductive film can be formed using a material which is similar to the material used for the first conductive film described in Embodiment 1. The source electrode layer 455a and the drain electrode layer 455b can be formed in a manner similar to that of the source electrode layer 405a and the drain electrode layer 405b described in Embodiment 1.

When the connection electrode layer 470 is formed at the same time as the formation of the gate electrode layer 451, the connection electrode layer 470 is not necessarily formed here. Also in the case of having such a structure as illustrated in FIG. 6D, the connection electrode layer 470 is not necessarily formed.

Figure 4A:
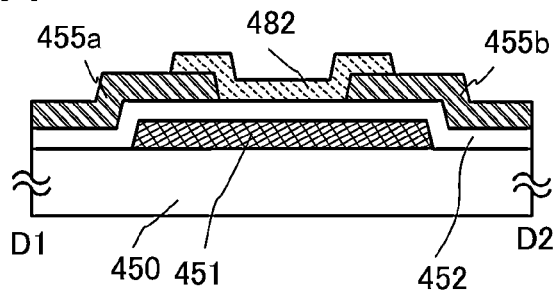
FIGS. 4A to 4E are cross-sectional views illustrating a manufacturing process according to an embodiment of the present invention.
Figure 5A:
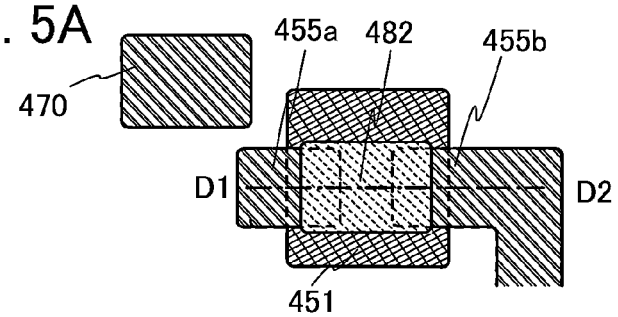
FIGS. 5A to 5D are plan views illustrating a manufacturing process according to an embodiment of the present invention.

Then, an oxide semiconductor film is formed over the gate insulating layer 452, the source electrode layer 455a, and the drain electrode layer 455b and patterned into an island-shaped oxide semiconductor layer 482 by a photolithography process (see FIG. 4A and FIG. 5A).

The oxide semiconductor layer 482 serves as a channel formation region and is thus formed in a manner similar to the oxide semiconductor layer 432 in Embodiment 1.

Note that before the oxide semiconductor layer 482 is formed by a sputtering method, powdery substances (also referred to as particles or dust) which are generated at the time of the film formation and attached on a surface of the gate insulating layer 452 are preferably removed by reverse sputtering in which an argon gas is introduced and plasma is generated.

Figure 4B:
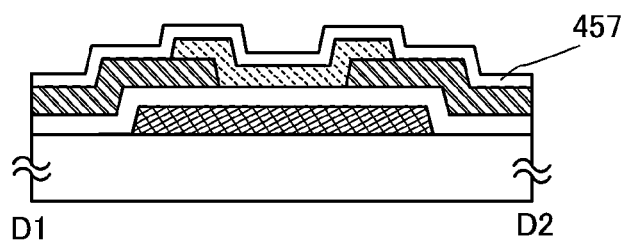

Next, the oxide insulating film 457 which covers the gate insulating layer 452, the oxide semiconductor layer 482, the source electrode layer 455a, and the drain electrode layer 455b and which is in contact with the oxide semiconductor layer 482 is formed by a sputtering method or a PCVD method (see FIG. 4B). The oxide insulating film 457 can also be formed in a manner similar to that of the oxide insulating film 407 described in Embodiment 1. In this embodiment, a silicon oxide film having a thickness of 300 nm is formed as the oxide insulating film 457. The substrate temperature at the time of film formation may be higher than or equal to a room temperature and lower than or equal to 300° C., and the temperature is set at 100° C. in this embodiment.

Figure 4C:
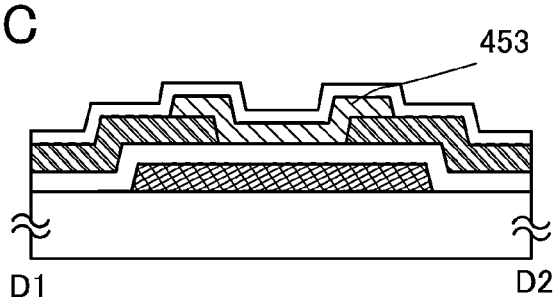
Figure 5B:
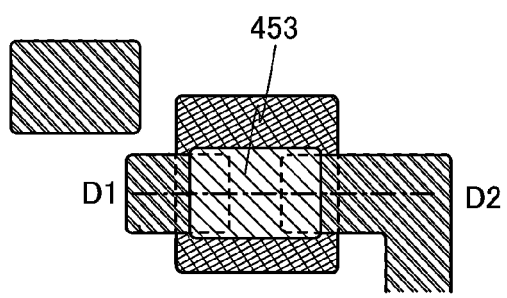

Next, heat treatment is performed on the source electrode layer 455a, the drain electrode layer 455b, the gate insulating layer 452, the oxide insulating film 457, and the oxide semiconductor layer 482 under an oxygen gas atmosphere, an inert gas atmosphere (nitrogen, helium, neon, argon, or the like), or under reduced pressure, whereby the oxide semiconductor layer 453 is formed (see FIG. 4C and FIG. 5B). The heat treatment is performed at a temperature of higher than or equal to 200° C. and lower than or equal to 700° C., preferably, higher than or equal to 350° C. and lower than the strain point of the substrate 450. When the heat treatment is performed on the source electrode layer 455a, the drain electrode layer 455b, the gate insulating layer 452, the oxide insulating film 457, and the oxide semiconductor layer 453 under the above atmosphere, impurities such as hydrogen and water included in the source electrode layer 455a, in the drain electrode layer 455b, in the gate insulating layer 452, in the oxide insulating film 457, and in the oxide semiconductor layer 453, and at interfaces between the oxide semiconductor layer 453 and upper and lower films which are in contact with the oxide semiconductor layer 453 can be removed. In accordance with conditions of the heat treatment or a material of the oxide semiconductor layer, the oxide semiconductor layer is crystallized and changed to a microcrystalline film or a polycrystalline film in some cases.

When the oxide insulating film 457 serving as a protective film is formed in contact with the oxide semiconductor layer 482, there is a possibility that the oxide semiconductor layer 482 might receive plasma damage. However, with the heat treatment, plasma damage which is caused to the oxide semiconductor layer 482 can be repaired.

With this heat treatment, oxygen in the oxide insulating film 407 is supplied to the oxide semiconductor layer 403 using solid-phase diffusion. Accordingly, since the resistance of the oxide semiconductor layer 403 increases, a highly reliable thin film transistor with favorable electric characteristics can be manufactured.

The heat treatment can reduce variation in electric characteristics of the thin film transistor.

Note that in heat treatment for dehydration or dehydrogenation, it is preferable that water, hydrogen, and the like be not contained in nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more, that is, an impurity concentration is set to 1 ppm or lower, preferably, 0.1 ppm or lower. After the heat treatment, slow cooling is preferably performed under an oxygen atmosphere. For example, slow cooling may be performed so that the substrate temperature is lowered by at least approximately 50° C. to 100° C. from the highest heating temperature.

As the heat treatment, an instantaneous heating method can be employed, such as a heating method using an electric furnace, a gas rapid thermal annealing (GRTA) method using a heated gas, or a lamp rapid thermal anneal (LRTA) method using lamp light.

Here, as an embodiment of heat treatment of the oxide semiconductor layer 482, a heating method using an electric furnace 1601 will be described with reference to FIG. 16.

Figure 16:
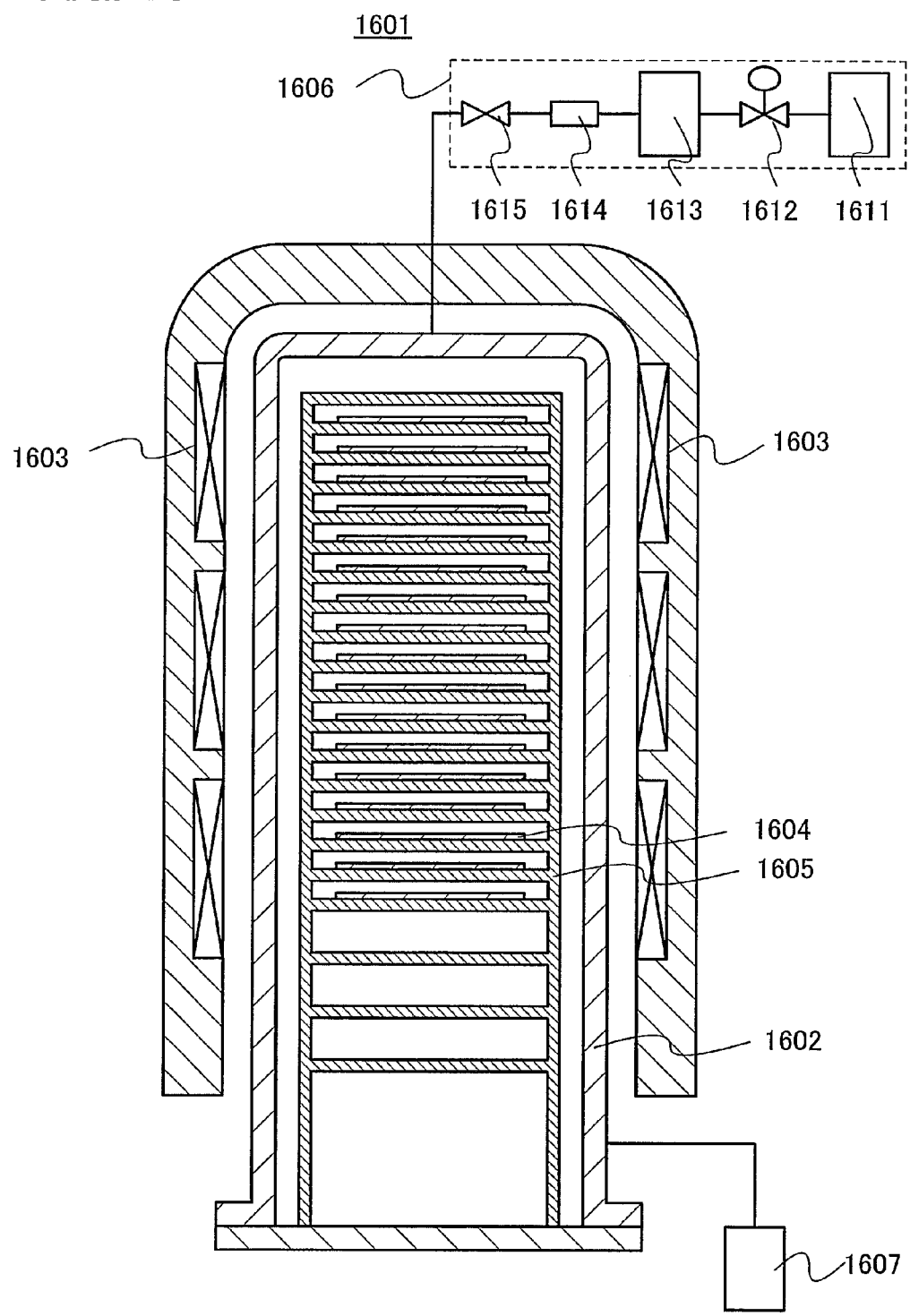
FIG. 16 is a cross-sectional view illustrating an electric furnace.

FIG. 16 is a schematic view of the electric furnace 1601. Heaters 1603 are provided outside a chamber 1602, which heats the chamber 1602. Inside the chamber 1602, a susceptor 1605 in which a substrate 1604 is mounted is provided. The substrate 1604 is transferred into/from the chamber 1602. In addition, the chamber 1602 is provided with a gas supply means 1606 and an evacuation means 1607. With the gas supply means 1606, a gas is introduced into the chamber 1602. The evacuation means 1607 exhausts the inside of the chamber 1602 or reduces the pressure in the chamber 1602. Note that the temperature rise characteristics of the electric furnace 1601 are preferably set to from 0.1° C./min to 20° C./min, inclusive. The temperature drop characteristics of the electric furnace 1601 are preferably set to from 0.1° C./min to 15° C./min, inclusive.

The gas supply means 1606 includes a gas supply source 1611, a pressure regulation valve 1612, a refiner 1613, a mass flow controller 1614, and a stop valve 1615. In this embodiment, the refiner 1613 is preferably provided between the gas supply source 1611 and the chamber 1602. The refiner 1613 can remove impurities such as water and hydrogen in a gas which is introduced into the chamber 1602 from the gas supply source 1611; thus, entry into the chamber 1602 of water, hydrogen, and the like, can be suppressed by provision of the refiner 1613.

In this embodiment, oxygen, nitrogen, or a rare gas is introduced into the chamber 1602 from the gas supply source 1611, so that the inside of the chamber is in a nitrogen atmosphere or a rare gas atmosphere. In the chamber 1602 which is heated at a temperature of higher than or equal to 200° C. and lower than or equal to 700° C., preferably, higher than or equal to 350° C. and lower than the strain point of the substrate 450, the oxide semiconductor layer formed over the substrate 450 is heated, whereby the oxide semiconductor layer can be subjected to dehydration or dehydrogenation.

Alternatively, the chamber 1602 in which the pressure is reduced by the evacuation means is heated at a temperature of higher than or equal to 200° C. and lower than or equal to 700° C., preferably, higher than or equal to 350° C. and lower than the strain point of the substrate 450. In such a chamber 1602, the oxide semiconductor layer formed over the substrate 450 is heated, whereby the oxide semiconductor layer can be subjected to dehydration or dehydrogenation.

Next, the heaters are turned off, and the chamber 1602 of a heating apparatus is gradually cooled.

As a result, reliability of the thin film transistor to be formed later can be improved.

Note that when heat treatment is performed under reduced pressure, an inert gas may be introduced into the chamber 1602 after the heat treatment, pressure may be returned to atmospheric pressure, and cooling may be performed.

After the substrate 1604 in the chamber 1602 of the heating apparatus is cooled to 300° C., the substrate 1604 may be transferred into an atmosphere at room temperature. As a result, the cooling time of the substrate 1604 can be shortened.

When the heating apparatus has a multi-chamber structure, heat treatment and cooling treatment can be performed in chambers different from each other. Typically, an oxide semiconductor layer over a substrate is heated in a first chamber that is filled with oxygen, nitrogen, or a rare gas and heated at a temperature of higher than or equal to 200° C. and lower than or equal to 700° C., preferably, higher than or equal to 350° C. and lower than the strain point of the substrate 450. Next, the substrate which has been subjected to the heat treatment is transferred, through the transfer chamber in which nitrogen or a rare gas is introduced, into a second chamber that is filled with nitrogen or a rare gas and heated at a temperature of lower than or equal to 100° C., preferably at room temperature, and then cooling treatment is performed therein. Through this process, throughput can be increased.

Although the oxide semiconductor layer 482 which has been subjected to heat treatment under an inert gas atmosphere or reduced pressure is preferably an amorphous state, part of the oxide semiconductor layer 482 may be crystallized.

As described above, when heat treatment is performed after the oxide insulating film serving as a protective film is formed in contact with the oxide semiconductor layer, impurities ($H_2O$, H, OH, or the like) included in the source electrode layer, the drain electrode layer, the gate insulating layer, the oxide insulating film, and the oxide semiconductor layer can be reduced. With the heat treatment, plasma damage which is caused to the oxide semiconductor layer when the oxide insulating film serving as a protective film is formed in contact with the oxide semiconductor layer can be repaired.

The heat treatment can reduce variation in electric characteristics of the thin film transistor. Accordingly, electric characteristics and reliability of the thin film transistor 460 can be improved.

Figure 4D:
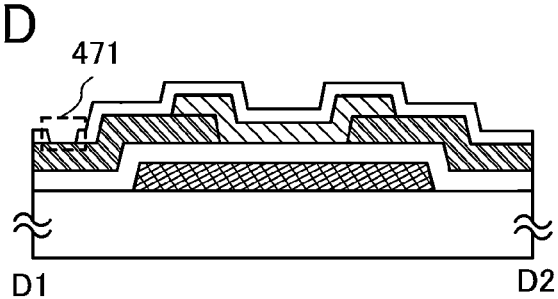
Figure 5C:
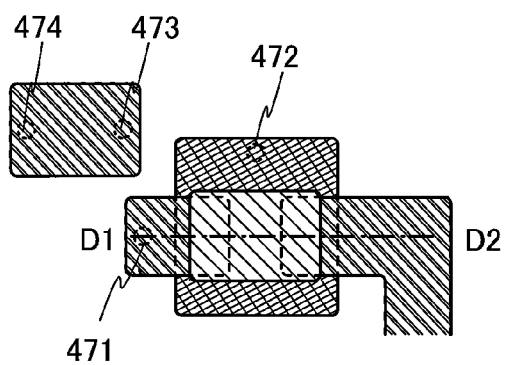

Next, the first contact hole 471, the second contact hole 472, the third contact hole 473, and the fourth contact hole 474 are formed in the oxide insulating film 457 (see FIG. 4D and FIG. 5C). First, when part of the oxide insulating film 457 is removed by etching, the first contact hole 471 which reaches the source electrode layer 455a, part of the second contact hole 472 which reaches the gate electrode layer 451, and the third contact hole 473 and the fourth contact hole 474 which reach both end portions of the connection electrode layer 470 are formed. Further, part of the gate insulating layer 452 is removed by etching, so that the second contact hole which reaches the gate electrode layer 451 is formed.

Next, a second conductive film is formed over the oxide insulating film 457. Here, the second conductive film is connected to the source electrode layer 455a, the gate electrode layer 451, and the connection electrode layer 470 through the first contact hole 471, the second contact hole 472, the third contact hole 473, and the fourth contact hole 474.

The second conductive film is preferably formed using a low resistance conductive material which has lower resistivity than the source electrode layer 455a and the drain electrode layer 455b, and aluminum or copper is particularly preferable. With the use of the low resistance conductive material for the second conductive film, wiring resistance or the like can be reduced.

Although the low resistance conductive material such as aluminum or copper has low heat resistivity, the second conductive film can be provided after the heat treatment; therefore, the low resistance conductive material such as aluminum or copper can be used.

Figure 4E:
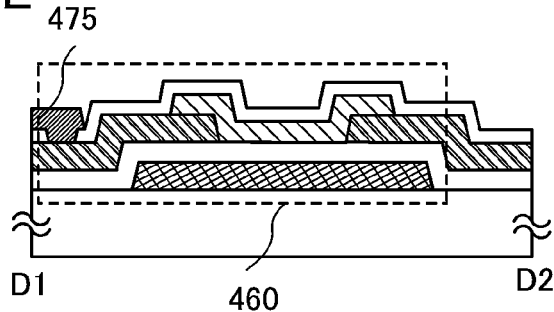
Figure 5D:
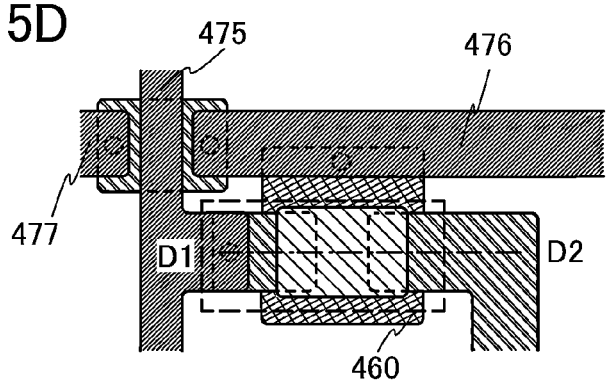
Figure 10:
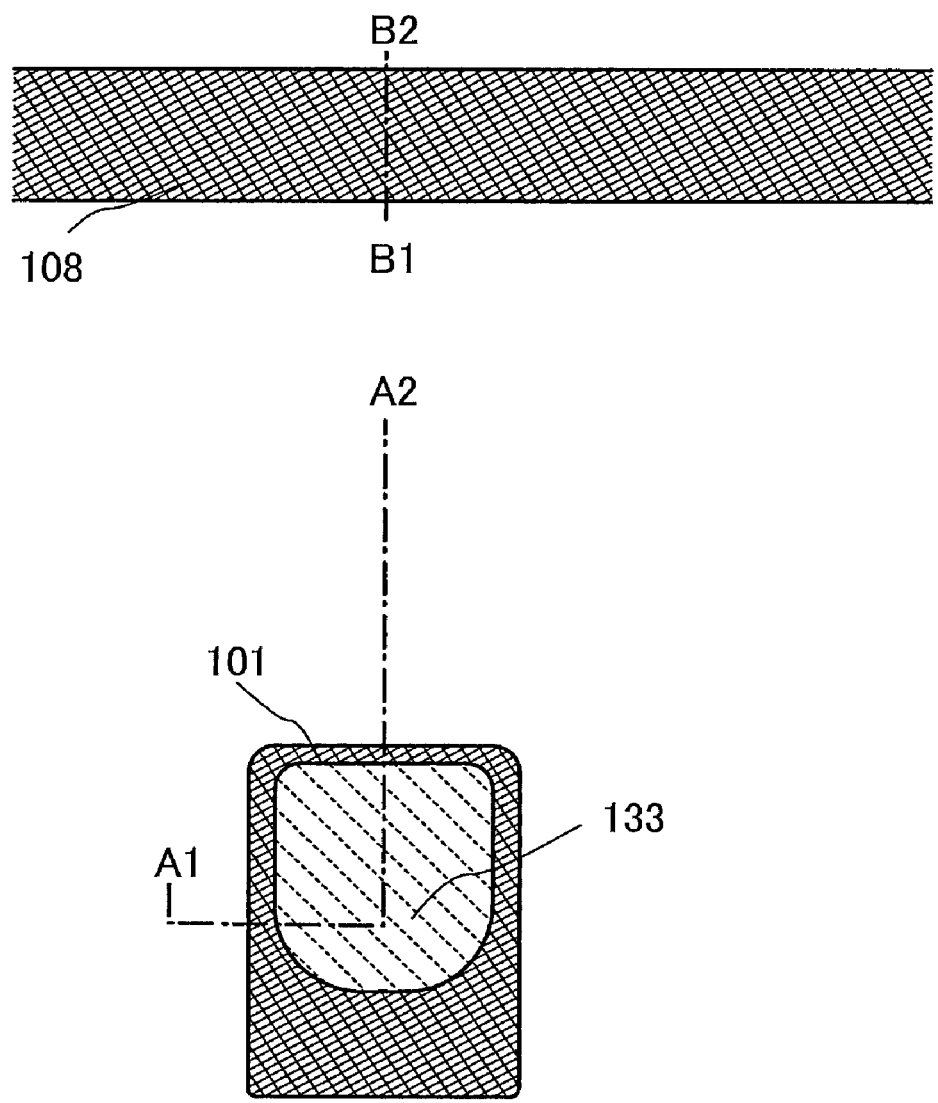
FIG. 10 is a plan view illustrating a method for manufacturing a semiconductor device according to an embodiment of the present invention.
Figure 11:
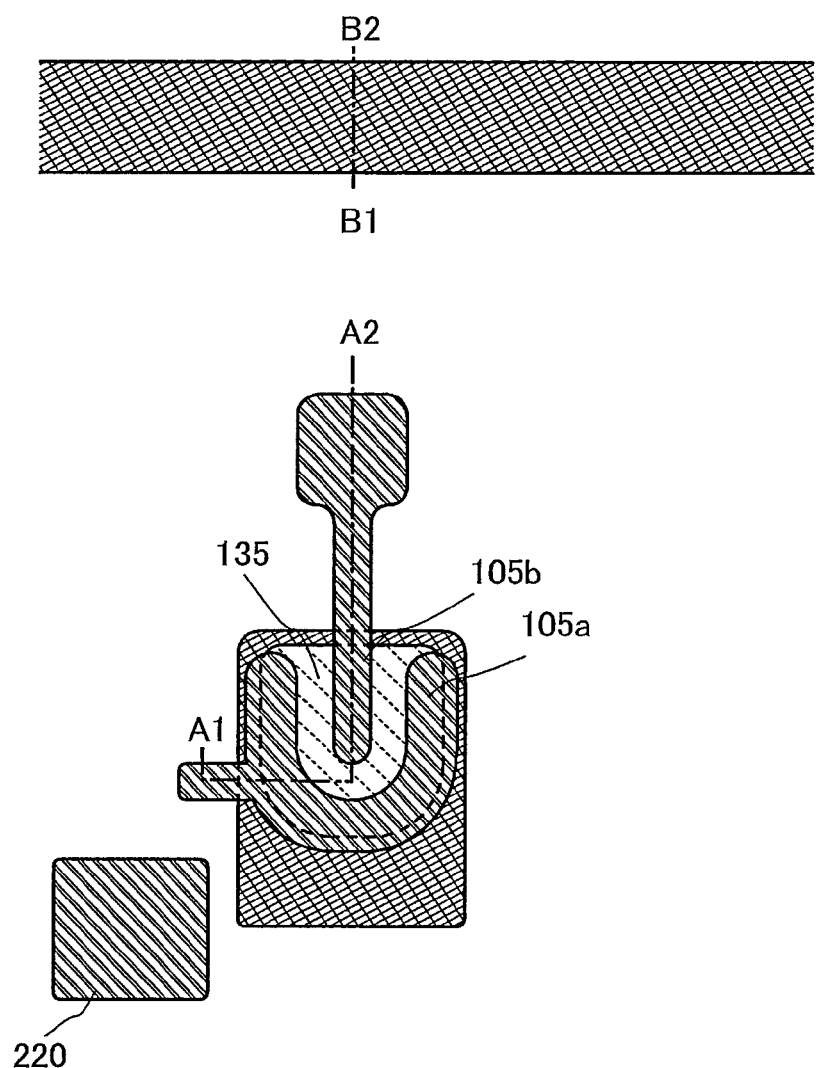
FIG. 11 is a plan view illustrating a method for manufacturing a semiconductor device according to an embodiment of the present invention.
Figure 12:
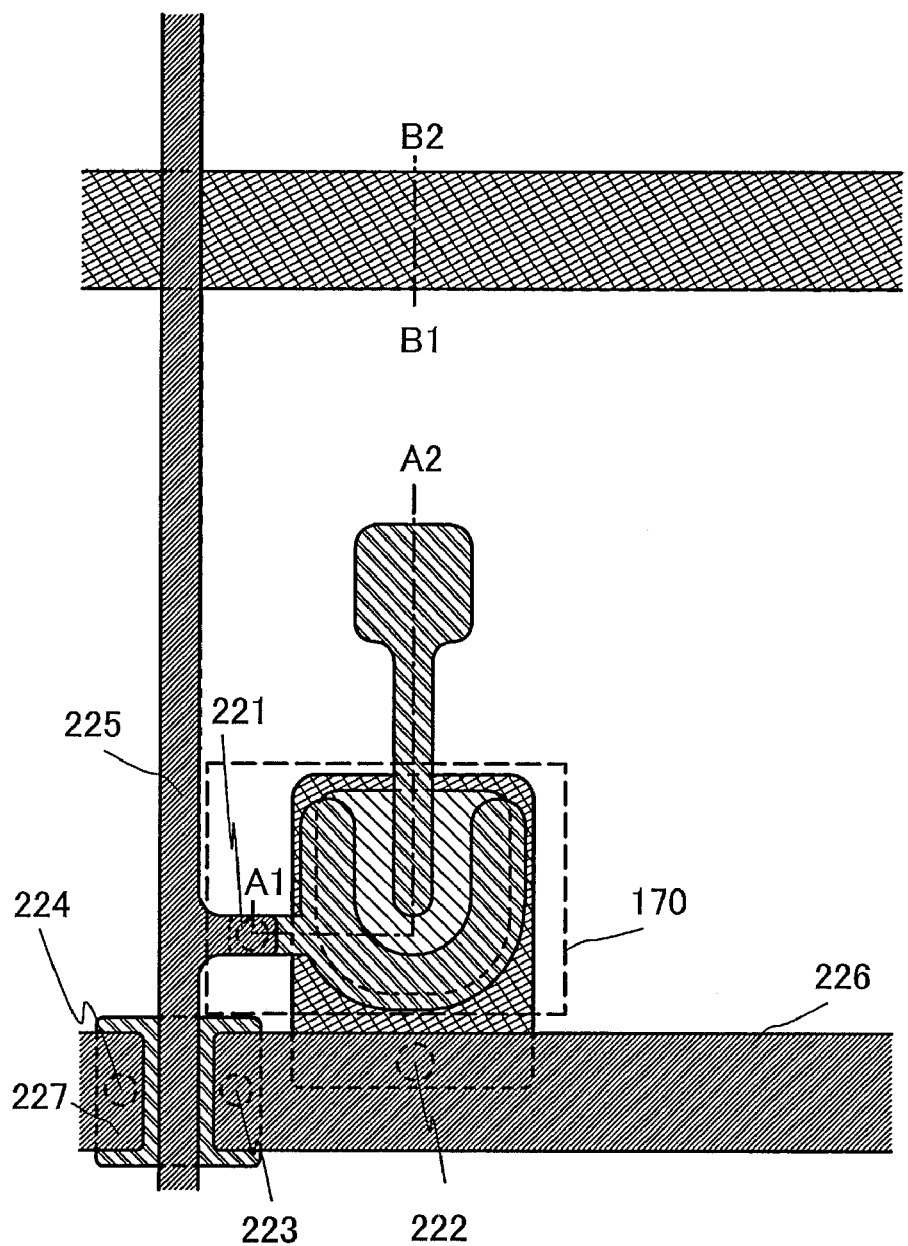
FIG. 12 is a plan view illustrating a method for manufacturing a semiconductor device according to an embodiment of the present invention.
Figure 13:
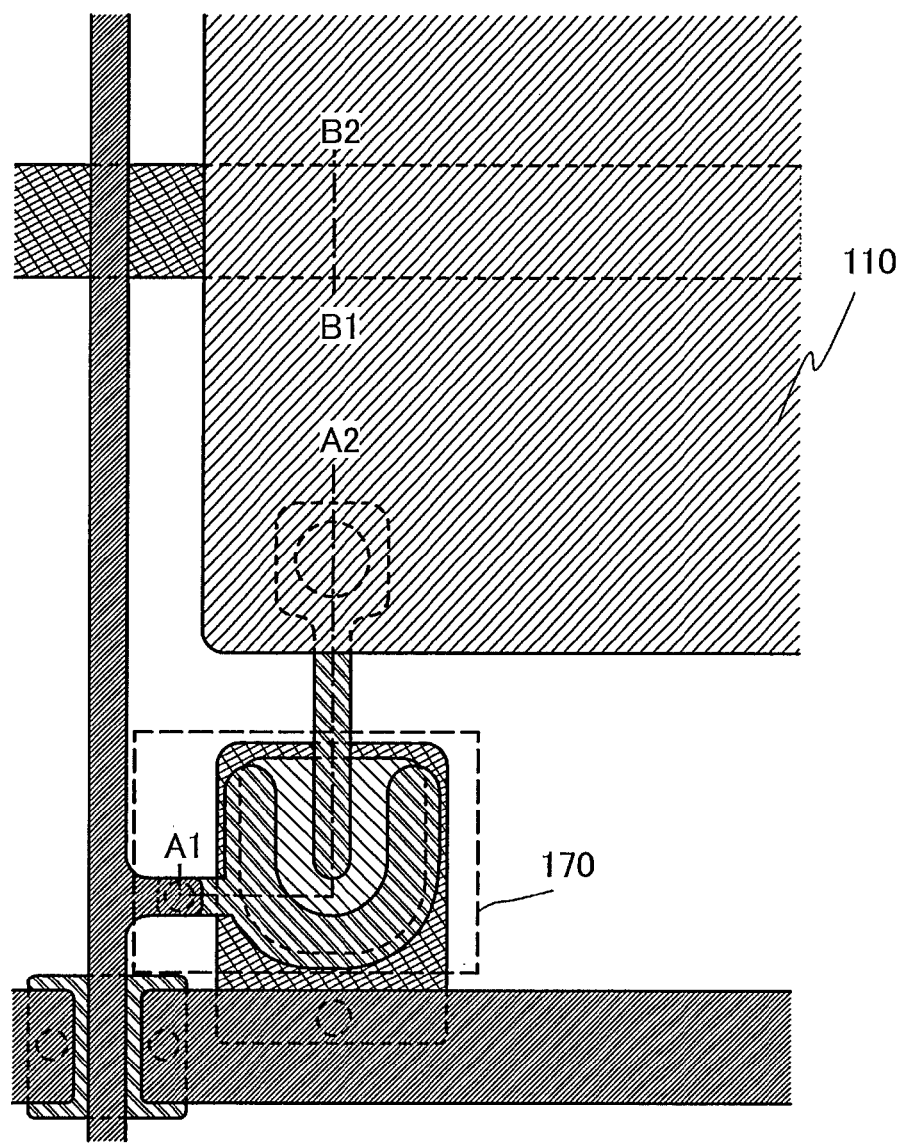
FIG. 13 is a plan view illustrating a method for manufacturing a semiconductor device according to an embodiment of the present invention.

Next, the second conductive film is etched through an etching process, so that the source wiring 475, the first gate wiring 476, and the second gate wiring 477 are formed over the oxide insulating film 457 (see FIG. 4E and FIG. 5D). The source wiring 475 is formed so as to overlap the connection electrode layer 470 and so as to be connected to the source electrode layer 455a through the first contact hole 471. The first gate wiring 476 and the second gate wiring 477 are formed so as to sandwich the source wiring 475 therebetween. Here, the first gate wiring 476 is formed so as to be connected to the gate electrode layer 451 through the second contact hole 472 and so as to be connected to the connection electrode layer 470 through the third contact hole 473. The second gate wiring 477 is formed so as to be connected to the connection electrode layer 470 through the fourth contact hole 474. Accordingly, the first gate wiring 476 and the second gate wiring 477 are electrically connected to each other through the connection electrode layer 470.

Through the above process, the thin film transistor 460 can be formed. The structures illustrated in FIGS. 6C and 6D can be manufactured in a similar process.

As described above, when heat treatment is performed after the oxide insulating film serving as a protective film is formed in contact with the oxide semiconductor layer, impurities ($H_2O$, H, OH, or the like) included in the source electrode layer, the drain electrode layer, the gate insulating layer, and the oxide semiconductor layer can be reduced. With the heat treatment, plasma damage which is caused to the oxide semiconductor layer when the oxide insulating film serving as a protective film is formed in contact with the oxide semiconductor layer can be repaired. The heat treatment can reduce variation in electric characteristics of the thin film transistor. Therefore, reliability of the thin film transistor 460 can be improved.

This embodiment can be implemented in appropriate combination with the structures described in the other embodiments.

Embodiment 3

A manufacturing process of a semiconductor device including a thin film transistor will be described with reference to FIGS. 7A to 7D, FIGS. 8A to 8C, FIGS. 9A and 9B, FIG. 10, FIG. 11, FIG. 12, and FIG. 13. FIGS. 7A to 7D, FIGS. 8A to 8C, and FIGS. 9A and 9B are cross-sectional views of a manufacturing process, and FIG. 10, FIG. 11, FIG. 12, and FIG. 13 are plan views of the manufacturing process.

As for a substrate 100 having a light-transmitting property illustrated in FIG. 7A, a glass substrate of barium borosilicate glass, aluminoborosilicate glass, or the like can be used. Note that a substrate formed of an insulator such as a ceramic substrate, a quartz glass substrate, a quartz substrate, or a sapphire substrate may be used instead of the glass substrate 100. Alternatively, crystallized glass or the like may be used.

Next, a conductive layer is formed over the entire surface of the substrate 100, and then a first photolithography process is performed to form a resist mask. Then, an unnecessary portion is removed by etching, so that a wiring and an electrode (a gate electrode layer 101, a capacitor wiring 108, and a first terminal 121) are formed. At this time, the etching is performed so that at least end portions of the gate electrode layer 101 have a tapered shape.

The gate electrode layer 101, the capacitor wiring 108, and the first terminal 121 of a terminal portion can be formed using the material of the gate electrode layer 401 described in Embodiment 1, as appropriate. Each of the gate electrode layer 101, the capacitor wiring 108, and the first terminal 121 of the terminal portion is preferably formed using a heat-resistance conductive material in order to endure heat treatment in a later step, and is formed using an element selected from titanium (Ti), tantalum (Ta), tungsten (W), molybdenum (Mo), chromium (Cr), neodymium (Nd), or scandium (Sc); an alloy including any of these elements as a component; an alloy film including any of these elements as a component in combination; or a nitride including any of these elements as a component, in a single layer or a stacked layer.

At this time, a connection electrode layer 220 which is formed at the same time as the formation of a source electrode layer 105a and a drain electrode layer 105b which are formed in a later step may be formed at the same time as the formation of the gate electrode layer 101. In that case, the connection electrode layer 220 is not necessarily formed when the source electrode layer 105a and the drain electrode layer 105b are formed.

Next, a gate insulating layer 102 is formed over the entire surface of the gate electrode layer 101. The gate insulating layer 102 is formed to a thickness of 50 to 250 nm by a sputtering method, a PCVD method, or the like.

For example, as the gate insulating layer 102, a silicon oxide film is formed to a thickness of 100 nm by a sputtering method. Needless to say, the gate insulating layer 102 is not limited to such as a silicon oxide film and may be formed to have a single-layer structure or a stacked structure using another insulating film such as a silicon oxynitride film, a silicon nitride film, an aluminum oxide film, a tantalum oxide film, and the like.

Next, an oxide semiconductor film (In—Ga—Zn—O-based non-single-crystal film) is formed over the gate insulating layer 102. It is effective to deposit the In—Ga—Zn—O-based non-single-crystal film without exposure to air after the plasma treatment because dust and moisture are not attached to the interface between the gate insulating layer and the semiconductor film. Here, the oxide semiconductor film is formed in an oxygen atmosphere, an argon atmosphere, or an atmosphere containing argon and oxygen under the condition where a target is an oxide semiconductor target containing In, Ga, and Zn (In—Ga—Zn—O-based oxide semiconductor target ($In_2O_3$:$Ga_2O_3$:ZnO=1:1:1)) with a diameter of 8 inches, the distance between the substrate and the target is 170 mm, the pressure is 0.4 Pa, and the direct current (DC) power supply is 0.5 kW. Note that a pulse direct current (DC) power supply is preferable because dust can be reduced and the film thickness can be uniform. The In—Ga—Zn—O-based non-single-crystal film is formed to a thickness of 5 nm to 200 nm. As the oxide semiconductor film, an In—Ga—Zn—O-based non-single-crystal film with a thickness of 50 nm is formed using the In—Ga—Zn—O-based oxide semiconductor target by a sputtering method.

Examples of a sputtering method include an RF sputtering method in which a high-frequency power supply is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be deposited to be stacked in the same chamber, and a film of plural kinds of materials can be deposited by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

In addition, as a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

Next, a second photolithography process is performed to form a resist mask, and then the oxide semiconductor film is etched. For example, unnecessary portions are removed by wet etching using a mixed solution of phosphoric acid, acetic acid, and nitric acid, so that an oxide semiconductor layer 133 is formed (see FIG. 7A and FIG. 10). Note that etching here is not limited to wet etching and dry etching may also be performed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); oxygen ($O_2$); any of these gases to which a rare gas such as helium (He) or argon (Ar) is added; or the like can be used as the etching gas used for dry etching.

As the dry etching method, a parallel plate reactive ion etching (RIE) method, an inductively coupled plasma (ICP) etching method, or the like can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid or the like can be used. In addition, ITO07N (produced by KANTO CHEMICAL CO., INC.) may also be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

Note that the etching condition (etching solution, etching time, temperature, or the like) are adjusted as appropriate, depending on a material, so that the films can be etched into the desired shapes.

Then, a first conductive film 132 made of a metal material is formed over the oxide semiconductor layer 133 by a sputtering method or a vacuum evaporation method (see FIG. 7B).

For a material of the first conductive film 132, a material which is similar to that of the source electrode layer 405a and the drain electrode layer 405b described in Embodiment 1 can be used as appropriate. The first conductive film 132 is preferably formed using a heat-resistance conductive material in order to endure heat treatment in a later step, and is formed using an element selected from titanium (Ti), tantalum (Ta), tungsten (W), molybdenum (Mo), chromium (Cr), neodymium (Nd), or scandium (Sc); an alloy including any of these elements as a component; an alloy film including any of these elements as a component in combination; or a nitride including any of these elements as a component, in a single layer or a stacked layer.

For the heat resistant conductive material used for the first conductive film 132, a transparent conductive oxide containing any of indium, tin, or zinc may be used. For example, indium oxide ($In_2O_3$) or an indium oxide-tin oxide ($In_2O_3$—$SnO_2$, abbreviated to ITO) alloy is preferably used. Alternatively, a transparent conductive oxide to which an insulating oxide such as silicon oxide is added may be used.

By inclusion of the insulating oxide such as silicon oxide in the transparent conductive oxide, crystallization of the transparent conductive oxide can be suppressed and the transparent conductive oxide can have an amorphous structure. Crystallization of the transparent conductive oxide is suppressed and an amorphous structure is provided, so that crystallization of the transparent conductive oxide or generation of microcrystalline grains can be prevented even when heat treatment is performed.

Next, a third photolithography process is performed. A resist mask is formed, and unnecessary portions are removed by etching, whereby the source electrode layer 105a, the drain electrode layer 105b, the connection electrode layer 220, and a second terminal 122 are formed (see FIG. 7C and FIG. 11). Wet etching or dry etching is employed as an etching method at this time. For example, by wet etching using an ammonia hydrogen peroxide mixture (with the ratio of hydrogen peroxide:ammonia:water=5:2:2), the first conductive film 132 may be etched to form the source electrode layer 105a and the drain electrode layer 105b. In this etching step, an exposed region of the oxide semiconductor layer 133 is partly etched to be an oxide semiconductor layer 135. Therefore, a region of the oxide semiconductor layer 135, which lies between the source electrode layer 105a and the drain electrode layer 105b has a small thickness. The region with a small thickness has a thickness of approximately 30 nm which further hinders crystallization; therefore, the region with a small thickness is effective in the case where a portion serving as a channel is desired to be kept to be in an amorphous state. In FIG. 7C, the etching for forming the source electrode layer 105a, the drain electrode layer 105b, and the oxide semiconductor layer 135 is performed at a time by dry etching. Accordingly, end portions of the source electrode layer 105a and the drain electrode layer 105b are aligned with end portions of the oxide semiconductor layer 135; thus, continuous structures are formed.

In the third photolithography process, the second terminal 122 which is formed using the same material as the source electrode layer 105a and the drain electrode layer 105b is left in a terminal portion. Note that the second terminal 122 is electrically connected to a source wiring to be formed in a later step.

When the connection electrode layer 420 is formed at the same time as the formation of the gate electrode layer 401, the connection electrode layer 420 is not necessarily formed here.

Further, by use of a resist mask having regions with plural thicknesses (typically, two different thicknesses) which is formed using a multi-tone mask, the number of resist masks can be reduced, resulting in simplified process and lower costs.

Then, the resist mask is removed, and a protective insulating layer 107 is formed to cover the gate insulating layer 102, the oxide semiconductor layer 135, the source electrode layer 105a, and the drain electrode layer 105b (see FIG. 7D). The protective insulating layer 107 can be formed to a thickness of at least 1 nm or more using a method by which impurities such as water and hydrogen are prevented from being mixed to the protective insulating layer 107, such as a CVD method or a sputtering method, as appropriate. Here, the protective insulating layer 107 is formed using a sputtering method. The protective insulating layer 107 which is in contact with part of the oxide semiconductor layer 135 does not include impurities such as moisture, hydrogen ions, and OH⁻, and is formed using an inorganic insulating film which prevents entry of these from the outside. Specifically, a silicon oxide film, a silicon nitride oxide film, an aluminum oxide film, or an aluminum oxynitride film is used. Further, a silicon nitride film or an aluminum nitride film may be stacked so as to be formed over and in contact with the protective insulating layer 107. The silicon nitride film does not include impurities such as moisture, hydrogen ions, and OH⁻ and prevents entry of these from the outside.

When the protective insulating layer 107 is formed in contact with the oxide semiconductor layer 135 by a sputtering method, a PCVD method, or the like, a region of the oxide semiconductor layer 135, which is in contact with at least the protective insulating layer 107 can be of high resistance (carrier concentration is decreased, preferably, the carrier concentration is less than $1 \times 10^{18}/cm^3$), and can serve as a high-resistance oxide semiconductor region.

Next, heat treatment is performed on the source electrode layer 105a, the drain electrode layer 105b, the gate insulating layer 102, and the oxide semiconductor layer 135 under an oxygen gas atmosphere, an inert gas atmosphere (nitrogen, helium, neon, argon, or the like), or under reduced pressure, whereby an oxide semiconductor layer 103 is formed (see FIG. 8A). The heat treatment is performed at a temperature of higher than or equal to 200° C. and lower than or equal to 700° C., preferably, higher than or equal to 350° C. and lower than the strain point of the substrate 100. When the heat treatment is performed on the source electrode layer 105a, the drain electrode layer 105b, the gate insulating layer 102, and the oxide semiconductor layer 103 under the above atmosphere, impurities such as hydrogen and water included in the source electrode layer 105a, in the drain electrode layer 105b, in the gate insulating layer 102, and in the oxide semiconductor layer 103, and at interfaces between the oxide semiconductor layer 103 and upper and lower films which are in contact with the oxide semiconductor layer 103 can be removed. In accordance with conditions of the heat treatment or a material of the oxide semiconductor layer, the oxide semiconductor layer is crystallized and changed to a microcrystalline film or a polycrystalline film in some cases.

When the protective insulating layer 107 serving as a protective film is formed in contact with the oxide semiconductor layer 133, there is a possibility that the oxide semiconductor layer 133 might receive plasma damage. However, with the heat treatment, plasma damage which is caused to the oxide semiconductor layer 133 can be repaired.

With this heat treatment, oxygen in the protective insulating layer 107 is supplied to the oxide semiconductor layer 103 using solid-phase diffusion. Accordingly, since the resistance of the oxide semiconductor layer 103 increases, a highly reliable thin film transistor with favorable electric characteristics can be manufactured.

The heat treatment can reduce variation in electric characteristics of the thin film transistor. After the heat treatment, slow cooling is preferably performed under an oxygen atmosphere. For example, slow cooling may be performed so that the substrate temperature is lowered by at least approximately 50° C. to 100° C. from the highest heating temperature.

Next, a fourth photolithography process is performed. A resist mask is formed, and the protective insulating layer 107 and the gate insulating layer 102 are etched to form a first contact hole 221, a second contact hole 222, a third contact hole 223, and a fourth contact hole 224 (see FIG. 8B and FIG. 12). First, when part of the protective insulating layer 107 is removed by etching, the first contact hole 221 which reaches the source electrode layer 105a, part of the second contact hole 222 which reaches the gate electrode layer 101, and the third contact hole 223 and the fourth contact hole 224 which reach both end portions of the connection electrode layer 220 are formed. Further, part of the gate insulating layer 102 is removed by etching, so that the second contact hole 222 which reaches the gate electrode layer 101 is formed.

When a reflective display device is manufactured, a contact hole which reaches the drain electrode layer 105b may be formed here, and a pixel electrode layer 110 may be formed at the same time as the formation of a source wiring and a gate wiring.

Next, a second conductive film made of a metal material is formed over the protective insulating layer 107 by a sputtering method or a vacuum evaporation method. Here, the second conductive film is connected to the source electrode layer 105a, the gate electrode layer 101, and the connection electrode layer 220 through the first contact hole 221, the second contact hole 222, the third contact hole 223, and the fourth contact hole 224.

As a material for the second conductive film, a material which is similar to that of the second conductive film described in Embodiment 1 can be used as appropriate. The second conductive film is preferably formed using a low resistance conductive material which has lower resistivity than the source electrode layer 105a and the drain electrode layer 105b, and aluminum or copper is particularly preferable. With the use of the low resistance conductive material for the second conductive film, wiring resistance or the like can be reduced.

Next, a fifth photolithography process is performed. A resist mask is formed, and the second conductive film is etched to form a source wiring 225, a first gate wiring 226, and a second gate wiring 227 over the protective insulating layer 107 (see FIG. 8C and FIG. 12). The source wiring 225 overlaps the connection electrode layer 220 and is formed so as to be connected to the source electrode layer 105a through the first contact hole 221. The first gate wiring 226 and the second gate wiring 227 are formed so as to sandwich the source wiring 225. Here, the first gate wiring 226 is formed so as to be connected to the gate electrode layer 101 through the second contact hole 222 and so as to be connected to the connection electrode layer 220 through the third contact hole 223. In addition, the second gate wiring 227 is formed so as to be connected to the connection electrode layer 220 through the fourth contact hole 224. Accordingly, the first gate wiring 226 and the second gate wiring 427 are electrically connected to each other through the connection electrode layer 220.

Through the above steps, a thin film transistor 170 can be manufactured.

Next, a sixth photolithography process is performed. A resist mask is formed, and the protective insulating layer 107 is etched to form a contact hole 125 which reaches the drain electrode layer 105b. In addition, a contact hole 127 which reaches the second terminal 122 and a contact hole 126 which reaches the first terminal 121 are also formed in the same etching step. A cross-sectional view at this stage is illustrated in FIG. 9A. Note that the contact hole 125, the contact hole 126, and the contact hole 127 can be formed at the same time in the fourth photolithography process.

Next, the resist mask is removed, and then a transparent conductive film is formed. The transparent conductive film is formed using indium oxide ($In_2O_3$), an indium oxide-tin oxide ($In_2O_3$—$SnO_2$, abbreviated as ITO) alloy, or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability. When heat treatment for reducing the resistance of the transparent conductive film is performed, an increase in the resistance of the oxide semiconductor layer 103 and improvement and less variation in electric characteristics of the transistor can be achieved.

Next, a seventh photolithography process is performed. A resist mask is formed, and an unnecessary portion is removed by etching to form the pixel electrode layer 110.

Further, in this seventh photolithography process, the capacitor wiring 108 and the pixel electrode layer 110 together form a storage capacitor with the use of the gate insulating layer 102 and the protective insulating layer 107 in a capacitor portion as a dielectric.

In addition, in this seventh photolithography process, the first terminal 121 and the second terminal 122 are covered with the resist mask, and transparent conductive films 128 and 129 are left in the terminal portions. The transparent conductive films 128 and 129 function as electrodes or wirings connected to an FPC. The transparent conductive film 128 formed over the first terminal 121 is a connection terminal electrode which functions as an input terminal of the gate wiring. The transparent conductive film 129 formed over the second terminal 122 is a connection terminal electrode which functions as an input terminal of the source wiring.

Then, the resist mask is removed, and a cross-sectional view at this stage is illustrated in FIG. 9B. Note that a top view at this stage corresponds to FIG. 13.

Figure 14A:
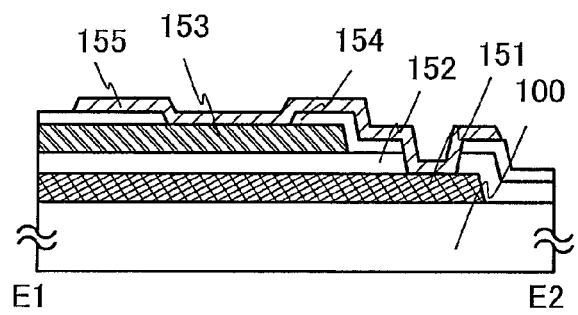
FIGS. 14A to 14D are views illustrating semiconductor devices according to an embodiment of the present invention.
Figure 14B:
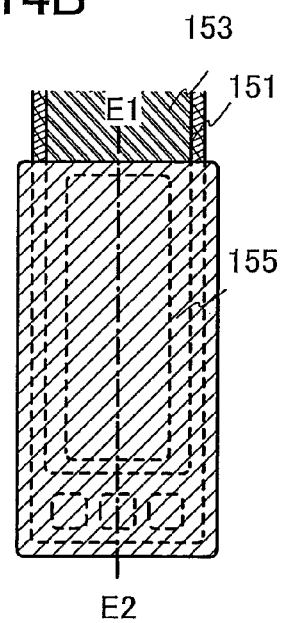

Further, FIGS. 14A and 14B are a cross-sectional view of a gate wiring terminal portion at this stage and a plan view thereof, respectively. FIG. 14A corresponds to a cross-sectional view taken along E1-E2 of FIG. 14B. In FIG. 14A, a transparent conductive film 155 formed over a protective insulating film 154 is a connection terminal electrode which functions as an input terminal. In the terminal portion in FIG. 14A, a first terminal 151 formed using the same material as the material of the gate wiring and a connection electrode layer 153 formed using the same material as the material of the source wiring overlap each other with a gate insulating layer 152 interposed therebetween and are electrically connected through the transparent conductive film 155. Note that a portion where the transparent conductive film 128 and the first terminal 121 are in contact with each other as illustrated in FIG. 9B corresponds to a portion where the transparent conductive film 155 and the first terminal 151 are in contact with each other in FIG. 14A.

Figure 14C:
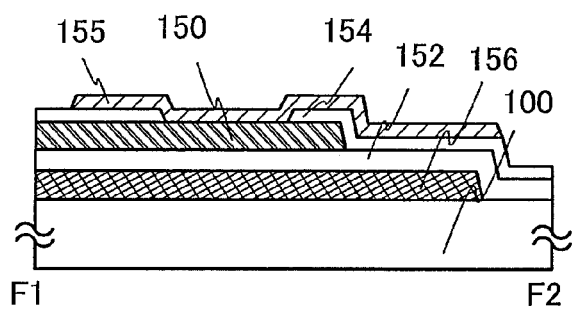
Figure 14D:
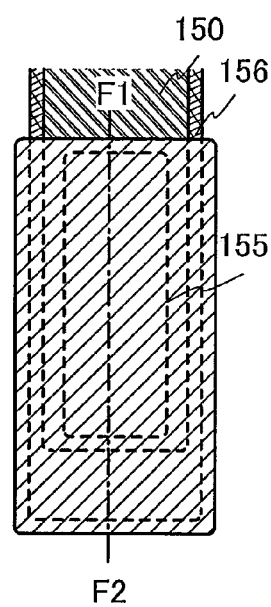

FIGS. 14C and 14D are respectively a cross-sectional view and a top view of a source wiring terminal portion which is different from that illustrated in FIG. 9B. FIG. 14C is a cross-sectional view taken along line F1-F2 of FIG. 14D. In FIG. 14C, the transparent conductive film 155 formed over the protective insulating film 154 is a connection terminal electrode which functions as an input terminal. In the terminal portion in FIG. 14C, an electrode layer 156 formed using the same material as the gate wiring is located under a second terminal 150, which is electrically connected to the source wiring, with the gate insulating layer 152 interposed therebetween. The electrode layer 156 is not electrically connected to the second terminal 150, and a capacitor for preventing noise or static electricity can be formed when the potential of the electrode layer 156 is set to a potential different from that of the second terminal 150, such as floating, GND, or 0 V. The second terminal 150 is electrically connected to the transparent conductive film 155 through the protective insulating film 154.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner, as appropriate.

Through these seven photolithography processes, the storage capacitor and a pixel thin film transistor portion including the thin film transistor 170 of a bottom-gate staggered thin film transistor can be completed using the seven photomasks. By disposing the thin film transistor and the storage capacitor in each pixel of a pixel portion in which pixels are arranged in a matrix, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

A capacitor wiring is not provided, and a pixel electrode overlaps a gate wiring of an adjacent pixel with a protective insulating film and a gate insulating layer interposed therebetween to form a storage capacitor.

In an active matrix liquid crystal display device, pixel electrodes arranged in a matrix are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which the vertical synchronizing frequency is 1.5 times or more, preferably twice or more as high as a usual vertical synchronizing frequency, whereby the moving-image characteristics are improved.

Further alternatively, in order to improve the moving-image characteristics of a liquid crystal display device, a driving method may be employed, in which a plurality of LED (light-emitting diode) light sources or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor disclosed in this specification includes an oxide semiconductor film which is used for a channel formation region and has excellent dynamic characteristics; thus, it can be combined with these driving techniques.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

When a light-emitting display device is manufactured, a partition formed using an organic resin layer is provided between organic light-emitting elements in some cases. In that case, heat treatment performed on the organic resin layer can also serve as the heat treatment which increases the resistance of the oxide semiconductor layer 103 so that improvement and less variation in electric characteristics of the transistor are achieved.

By the heat treatment, impurities such as moisture are reduced and the purity of the oxide semiconductor film is increased. Therefore, a semiconductor device including a highly reliable thin film transistor having favorable electric characteristics can be manufactured without using a special sputtering apparatus in which dew point in a film formation chamber is lowered or an ultrapure oxide semiconductor target.

The channel formation region in the oxide semiconductor layer is a high-resistance region; thus, electric characteristics of the thin film transistor are stabilized and increase in off current can be prevented. Therefore, a semiconductor device including a highly reliable thin film transistor having favorable electric characteristics can be provided.

This embodiment can be implemented in appropriate combination with the structures described in the other embodiments.

Embodiment 4

A semiconductor device and a method for manufacturing the semiconductor device will be described with reference to FIG. 17. The same portion as Embodiment 1 or a portion having similar function to that described in Embodiment 1 and a process can be formed in a manner similar to that described in Embodiment 1; therefore, repetitive description is omitted.

Figure 17:
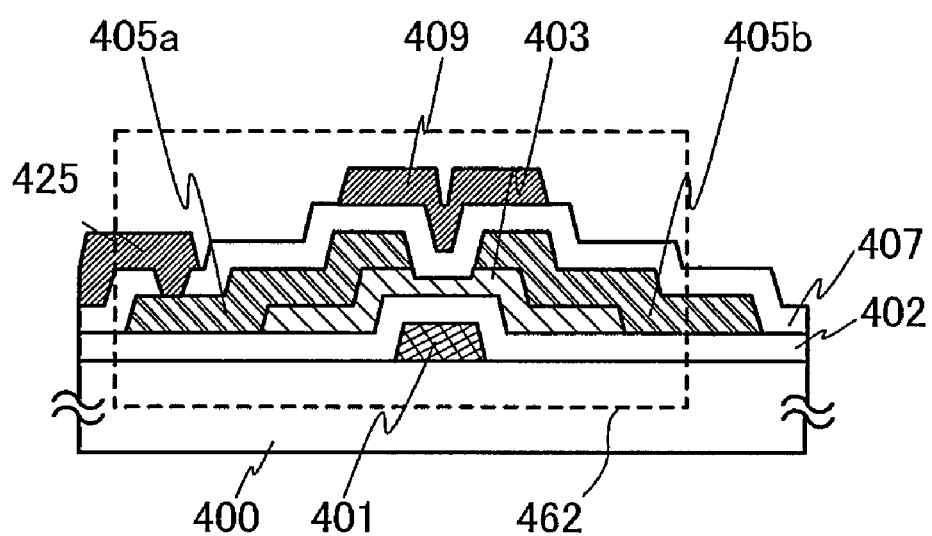
FIG. 17 is a cross-sectional view illustrating a semiconductor device according to an embodiment of the present invention.

In a thin film transistor 462 illustrated in FIG. 17, a conductive layer 409 is provided from the same layer as the source wiring 425 over the oxide insulating film 407 so that the conductive layer 409 overlaps the gate electrode layer 401 and a channel region of the oxide semiconductor layer 403.

FIG. 17 is a cross-sectional view of the thin film transistor 462 included in a semiconductor device. The thin film transistor 462 is a bottom-gate thin film transistor and includes the gate electrode layer 401, the gate insulating layer 402, the oxide semiconductor layer 403, the source electrode layer 405a, the drain electrode layer 405b, the oxide insulating film 407, the source wiring 425, and the conductive layer 409, over the substrate 400 having an insulating surface. The conductive layer 409 is provided over the oxide insulating film 407 so that the conductive layer 409 overlaps the gate electrode layer 401. Although not illustrated in FIG. 17, a gate wiring and a connection electrode layer are also provided in a manner similar to that of Embodiment 1.

The conductive layer 409 can be formed using a material and a method which are similar to those of the source wiring 425 described in Embodiment 1. When a pixel electrode layer is provided, the conductive layer may be formed using a material and a method which are similar to those of the pixel electrode layer. In this embodiment, a low resistance conductive material such as aluminum or copper is used for the conductive layer 409.

The potential of the conductive layer 409 may be the same as or different from the potential of the gate electrode layer 401, and can function as a second gate electrode layer. Further, the conductive layer 409 may be in a floating state.

The conductive layer 409 is provided in a position that overlaps the oxide semiconductor layer 403, whereby in a bias-temperature stress test (hereinafter, referred to as a BT test) for examining reliability of the thin film transistor, the amount of change in threshold voltage of the thin film transistor 462 between before and after the BT test can be reduced. In particular, in a −BT test in which voltage applied to a gate is set at −20 V after the substrate temperature is raised to 150° C., variations in threshold voltage can be suppressed.

This embodiment can be freely combined with Embodiment 1.

Embodiment 5

A semiconductor device and a method for manufacturing the semiconductor device will be described with reference to FIG. 18. The same portion as Embodiment 1 or a portion having similar function to that described in Embodiment 1 and a process can be formed in a manner similar to that described in Embodiment 1; therefore, repetitive description is omitted.

Figure 18:
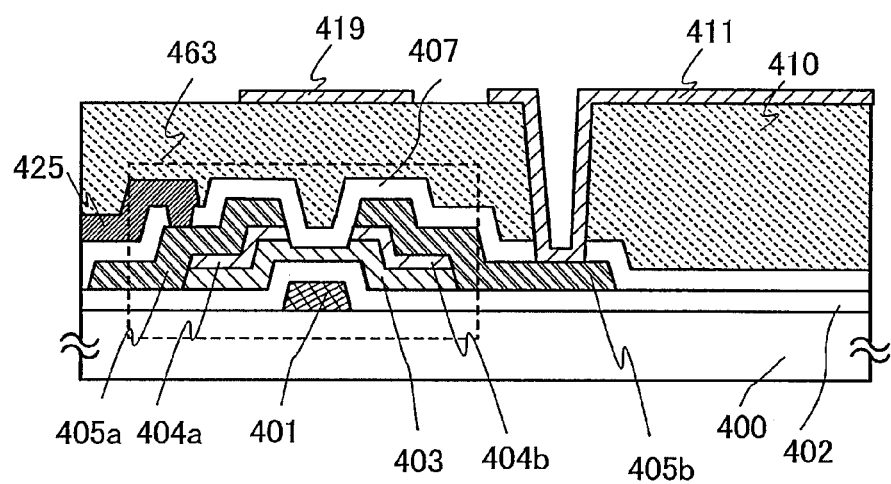
FIG. 18 is a cross-sectional view illustrating a semiconductor device according to an embodiment of the present invention.

A thin film transistor 463 illustrated in FIG. 18 includes a conductive layer 419 with the oxide insulating film 407 and an insulating layer 410 interposed between the conductive layer 419 and the gate electrode layer 401 so that the conductive layer 419 overlaps the gate electrode layer 401 and the channel region of the oxide semiconductor layer 403.

FIG. 18 is a cross-sectional view of the thin film transistor 463 included in a semiconductor device. The thin film transistor 463 is a bottom-gate thin film transistor, and includes the gate electrode layer 401, the gate insulating layer 402, the oxide semiconductor layer 403, a source region 404a, a drain region 404b, the source electrode layer 405a, the drain electrode layer 405b, the oxide insulating film 407, the insulating layer 410, the source wiring 425, and the conductive layer 419, over the substrate 400 having an insulating surface. The conductive layer 419 is provided over the insulating layer 410 so that the conductive layer 419 overlaps the gate electrode layer 401. Although not illustrated in FIG. 18, a gate wiring and a connection electrode layer are also provided in a manner similar to that of Embodiment 1.

In this embodiment, after an oxide semiconductor layer is formed over the gate insulating layer 402, the source region 404a and the drain region 404b are formed over the oxide semiconductor layer. Then, the source electrode layer 405a and the drain electrode layer 405b are formed, and the oxide insulating film 407 is formed. In a manner similar to that of Embodiment 1, after the oxide insulating film 407 is formed, heat treatment for dehydration or dehydrogenation is performed, and the oxide semiconductor layer 403 is formed. The heat treatment is performed at a temperature of higher than or equal to 200° C. and lower than or equal to 700° C., preferably, higher than or equal to 350° C. and lower than the strain point of the substrate 400 under an oxygen gas atmosphere, an inert gas atmosphere (nitrogen, helium, neon, argon, or the like), or under reduced pressure. Slow cooling is preferably performed under an inert gas atmosphere or an oxygen atmosphere after the heat treatment. The heat treatment allows plasma damage caused when the oxide insulating film 407 is formed to be repaired. Then, a contact hole is formed in the oxide insulating film 407, and the source wiring 425 which is connected to the source electrode layer 405a is formed.

In this embodiment, the source region 404a and the drain region 404b are each formed using a Zn—O-based polycrystalline film or a Zn-based microcrystalline film and are formed under a film formation condition which is different from that of the oxide semiconductor layer 403 and each have lower resistance than oxide semiconductor layer 403. In this embodiment, the source region 404a and the drain region 404b are in a polycrystalline state or a microcrystalline state, and the oxide semiconductor layer 403 is also in a polycrystalline state or a microcrystalline state. The oxide semiconductor layer 403 is crystallized with the second heat treatment, so that the oxide semiconductor layer 403 can be in a polycrystalline state or a microcrystalline state.

In the thin film transistor described in this embodiment, the insulating layer 410 functioning as a planarization film is stacked over the oxide insulating film 407, an opening which reaches the drain electrode layer 405b is formed in the oxide insulating film 407 and the insulating layer 410, and a conductive film is formed in the opening formed in the oxide insulating film 407 and the insulating layer 410, and the conductive film is etched to have a predetermined shape, whereby the conductive layer 419 and a pixel electrode layer 411 are formed. In such a process in which the pixel electrode layer 411 is formed, the conductive layer 419 can be formed. In this embodiment, as the pixel electrode layer 411 and the conductive layer 419, an indium oxide-tin oxide alloy including silicon oxide (In—Sn—O-based oxide containing silicon oxide) is used.

Alternatively, the conductive layer 419 may be formed using a material and a manufacturing method which are similar to that of the gate electrode layer 401, the source electrode layer 405a, the drain electrode layer 405b, and the source wiring 425.

The potential of the conductive layer 419 may be the same as or different from that of the gate electrode layer 401. The conductive layer 419 can function as a second gate electrode layer. Further, the conductive layer 419 may be in a floating state.

When the conductive layer 419 is provided so as to overlap the oxide semiconductor layer 403, the threshold voltage of the thin film transistor 463 can be controlled.

This embodiment can be freely combined with Embodiment 1.

Embodiment 6

In this embodiment, an example of a channel stop type thin film transistor 1430 will be described with reference to FIGS. 19A, 19B, and 19C. FIG. 19C is an example of a top view of a thin film transistor, a cross-sectional view taken along dotted line Z1-Z2 of which corresponds to FIG. 19B. An example is described in which gallium is not contained in an oxide semiconductor layer of the thin film transistor 1430.

Figure 19A:
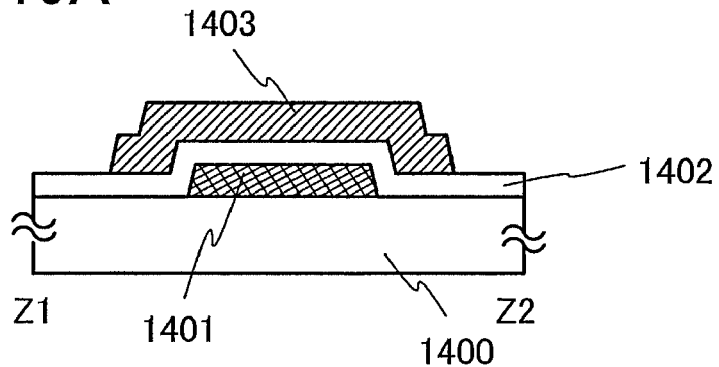
FIGS. 19A to 19C are views illustrating a semiconductor device according to an embodiment of the present invention.

In FIG. 19A, a gate electrode layer 1401 is formed over a substrate 1400. Here, the gate electrode layer is preferably formed using a heat resistant conductive material such as that described in Embodiment 1 so that the gate electrode layer can endure heat treatment to be performed in a later step. Next, a gate insulating layer 1402 covering the gate electrode layer 1401 is formed. Then, an oxide semiconductor layer 1403 is formed over the gate insulating layer 1402.

In this embodiment, as the oxide semiconductor layer 1403, a Sn—Zn—O-based oxide semiconductor formed using a sputtering method is used. When gallium is not used for the oxide semiconductor layer, the oxide semiconductor layer 1403 can be formed without expensive target, so that cost can be reduced.

Next, a channel protective layer 1418 is formed in contact with the oxide semiconductor layer 1403. The formation of the channel protective layer 1418 over the oxide semiconductor layer 1403 can prevent damage (reduction in thickness or the like due to plasma or an etchant in etching) in a later step of forming a source region 1406a and a drain region 1406b. Therefore, reliability of the thin film transistor 1430 can be improved.

Alternatively, after the oxide semiconductor layer 1403 is formed, the channel protective layer 1418 can be successively formed without exposure to air. Successive treatment without exposure to air makes it possible to obtain each interface of stacked layers, which are not contaminated by atmospheric components or impurity elements floating in air, such as water or hydrocarbon. Therefore, variation in characteristics of the thin film transistor can be reduced.

The channel protective layer 1418 can be formed using an inorganic material containing oxygen (such as silicon oxide, silicon oxynitride, or silicon nitride oxide). As a method for forming the channel protective layer 1418, a vapor deposition method such as a plasma enhanced CVD method or a thermal CVD method, or a sputtering method can be used. After the formation of the channel protective layer 1418, the shape thereof is processed by etching. Here, the channel protective layer 1418 is formed in such a manner that a silicon oxide film is formed by a sputtering method and processed by etching using a mask formed by photolithography.

Next, the source region 1406*a* and the drain region 1406*b* are formed over the channel protective layer 1418 and the oxide semiconductor layer 1403. In this embodiment, the source region 1406*a* and the drain region 1406*b* are each formed using a Zn—O-based microcrystalline film or a Zn—O-based polycrystalline film and are formed under a film formation condition which is different from that of the oxide semiconductor layer 1403 and each have lower resistance.

Figure 19B:
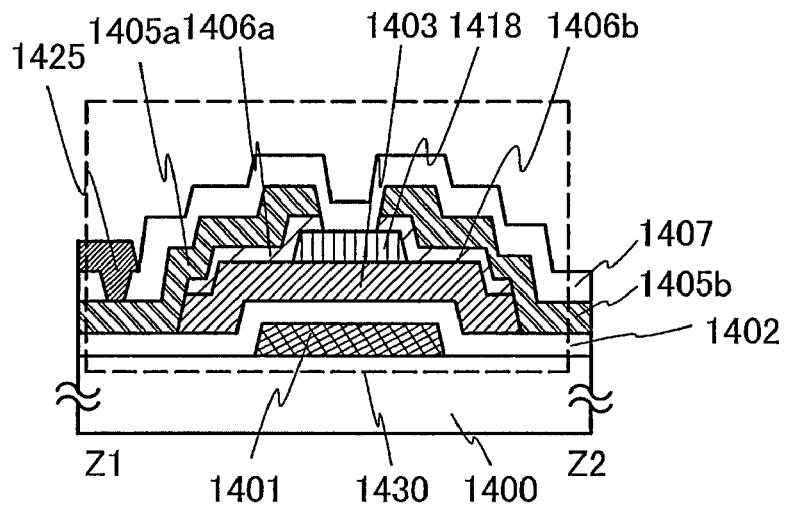
Figure 19C:
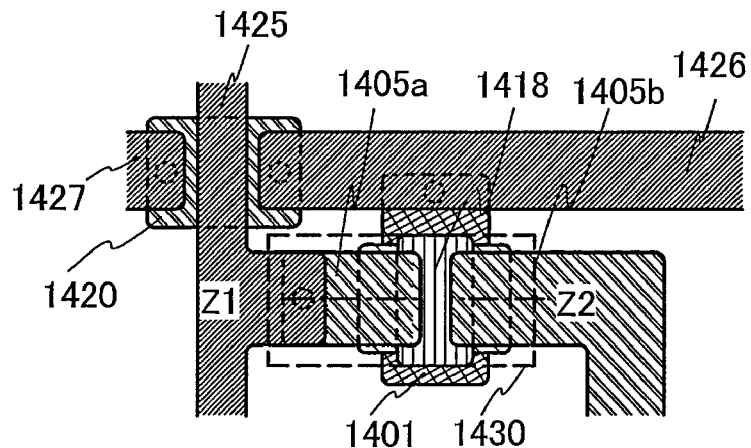

Next, a source electrode layer 1405*a* is formed over the source region 1406*a* and a drain electrode layer 1405*b* is formed over the drain region 1406*b*, so that the thin film transistor 1430 is formed (see FIG. 19B). The source electrode layer 1405*a* and the drain electrode layer 1405*b* can be formed in a manner similar to that of the source electrode layer 405*a* and the drain electrode layer 405*b* described in Embodiment 1, and preferably formed using a heat resistant conductive material. At this time, a connection electrode layer 1420 used for a gate wiring to be formed at the same time.

When the source region 1406*a* is provided between the oxide semiconductor layer 1403 and the source electrode layer 1405*a* and the drain region 1406*b* is provided between the oxide semiconductor layer 1403 and the drain electrode layer 1405*b*, the source electrode layer 1405*a* and the drain electrode layer 1405*b* which are metal layers each can be favorably bonded to the oxide semiconductor layer 1403, which leads to a thermally stable operation as compared to a Schottky junction. Moreover, since resistance is reduced, good mobility can be ensured even with high drain voltage.

This embodiment is not limited to the structure including the source region 1406*a* and the drain region 1406*b*; for example, a structure in which source and drain regions are not provided may be used.

Next, an oxide insulating film 1407 is formed so as to cover the source electrode layer 1405*a*, the drain electrode layer 1405*b*, and the channel protective layer 1418. The oxide insulating film 1407 can be formed to a thickness of at least 1 nm or more using a method by which impurities such as water and hydrogen are prevented from being mixed to the oxide insulating film 1407, such as a CVD method or a sputtering method, as appropriate. The oxide insulating film 1407 does not include impurities such as moisture, hydrogen ions, and OH$^-$ and is formed using an inorganic insulating film which prevents entry of these from the outside. Specifically, a silicon oxide film, a silicon nitride oxide film, an aluminum oxide film, or an aluminum oxynitride film is used. Further, a silicon nitride film or an aluminum nitride film may be stacked so as to be formed over and in contact with the oxide insulating film 1407.

Next, for dehydration or dehydrogenation, heat treatment is performed under an oxygen gas atmosphere, an inert gas atmosphere (nitrogen, helium, neon, argon, or the like), or under reduced pressure. The heat treatment is performed at a temperature of higher than or equal to 200° C. and lower than or equal to 700° C., preferably, higher than or equal to 350° C. and lower than the strain point of the substrate 1400. After the heat treatment, slow cooling is preferably performed under an oxygen atmosphere. For example, slow cooling may be performed so that the substrate temperature is lowered by at least approximately 50° C. to 100° C. from the highest heating temperature. In this embodiment, the oxide semiconductor layer 1403 is in a microcrystalline state or in a polycrystalline state. The heat treatment can reduce variation in electric characteristics of the thin film transistor.

Next, a first contact hole, a second contact hole, a third contact hole, and a fourth contact hole are formed in the oxide insulating film 1407. First, part of the oxide insulating film 1407 is removed by etching, whereby the first contact hole which reaches the source electrode layer 1405*a*, part of the second contact hole which reaches the gate electrode layer 1401, and the third contact hole and the fourth contact hole which reach both end portions of the connection electrode layer 1420 are formed. Further, part of the gate insulating layer 1402 is removed by etching, whereby the second contact hole which reaches the gate electrode layer 1401 is formed.

Next, a second conductive film is formed over the oxide insulating film 1407, and then a source wiring 1425, a first gate wiring 1426, and a second gate wiring 1427 are formed over the oxide insulating film 1407 (see FIG. 19C). The second conductive film is preferably formed using a material which is similar to that of the second conductive film described in Embodiment 1, and a low resistance conductive material such as aluminum or copper is preferably used. The source wiring 1425 overlaps the connection electrode layer 1420 and is formed so as to be connected to the source electrode layer 1405*a* through the first contact hole. The first gate wiring 1426 and the second gate wiring 1427 are formed so as to sandwich the source wiring 1425. Here, the first gate wiring 1426 is formed so as to be connected to the gate electrode layer 1401 through the second contact hole and so as to be connected to the connection electrode layer 1420 through the third contact hole. The second gate wiring 1427 is formed so as to be connected to the connection electrode layer 1420 through the fourth contact hole. Accordingly, the first gate wiring 1426 and the second gate wiring 1427 are electrically connected to each other through the connection electrode layer 1420.

Through the above-described steps, the thin film transistor 1430 can be formed.

This embodiment can be implemented in appropriate combination with the structures described in the other embodiments.

Embodiment 7

A semiconductor device and a method for manufacturing the semiconductor device will be described with reference to FIGS. 20A and 20B. The same portion as Embodiment 6 or a portion having similar function to that described in Embodiment 6 and a process can be formed in a manner similar to that described in Embodiment 6; therefore, repetitive description is omitted.

Figure 20A:
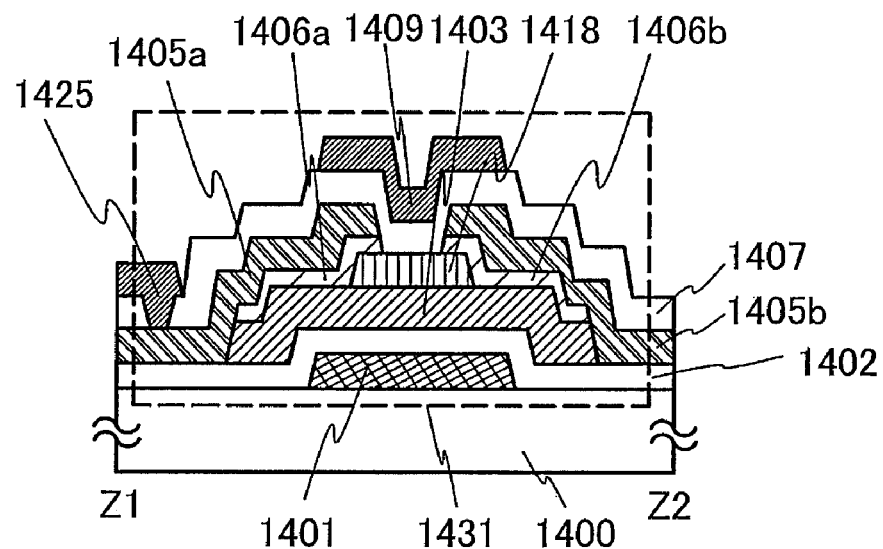
FIGS. 20A and 20B are cross-sectional views illustrating semiconductor devices according to an embodiment of the present invention.

In a thin film transistor 1431 illustrated in FIG. 20A, a conductive layer 1409 is provided so as to overlap the gate electrode layer 1401 with the channel protective layer 1418 and the oxide insulating film 1407 interposed therebetween, and so as to overlap the oxide semiconductor layer 1403 with the channel protective layer 1418 and the oxide insulating film 1407 interposed therebetween.

FIG. 20A is a cross-sectional view of the thin film transistor 1431 included in a semiconductor device. The thin film transistor 1431 is a bottom gate thin film transistor and includes the gate electrode layer 1401, the gate insulating layer 1402, the oxide semiconductor layer 1403, the source region 1406a, the drain region 1406b, the source electrode layer 1405a, the drain electrode layer 1405b, the oxide insulating film 1407, the source wiring 1425, and the conductive layer 1409 over the substrate 1400 having an insulating surface. The conductive layer 1409 is provided over the oxide insulating film 1407 so that the conductive layer 1409 overlaps the gate electrode layer 1401. Although not illustrated in FIG. 20A, a gate wiring and a connection electrode layer are also provided in a manner similar to that of Embodiment 1.

In a manner similar to that of Embodiment 6, after the oxide insulating film 1407 is formed, heat treatment is performed, so that the oxide semiconductor layer 1403 which has been subjected to dehydration or dehydrogenation is formed.

In this embodiment, the source region 1406a and the drain region 1406b formed over the oxide semiconductor layer are each formed using a Zn—O-based microcrystalline film or a Zn—O-based polycrystalline film and are formed under a film formation condition which is different from that of the oxide semiconductor layer 1403 and each are a lower resistance oxide semiconductor layer than the oxide semiconductor layer 1403. Further, the oxide semiconductor layer 1403 is in an amorphous state.

The conductive layer 1409 can be formed using a material and a method which are similar to those of the source wiring 1425 described in Embodiment 1. When a pixel electrode layer is provided, the conductive layer may be formed using a material and a method which are similar to those of the pixel electrode layer. In this embodiment, a low resistance conductive material such as aluminum or copper is used for the conductive layer 1409.

The potential of the conductive layer 1409 may be the same as or different from the potential of the gate electrode layer 1401 and can function as a second gate electrode layer. Further, the conductive layer 1409 may be in a floating state.

In addition, the conductive layer 1409 is provided in a position that overlaps the oxide semiconductor layer 1403, whereby in a bias-temperature stress test (hereinafter, referred to as a BT test) for examining reliability of the thin film transistor, the amount of change in threshold voltage of the thin film transistor 1431 between before and after the BT test can be reduced.

Figure 20B:
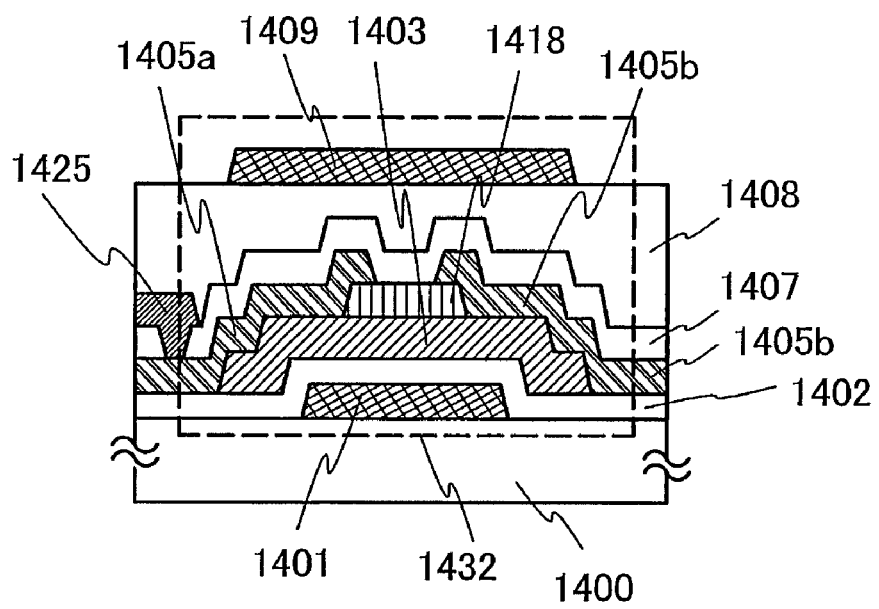

FIG. 20B illustrates an example which is partly different from that in FIG. 20A. The same portion as that described in FIG. 20A or a portion having similar function to that illustrated in FIG. 20A and a process can be formed in a manner similar to that described in FIG. 20A; therefore, repetitive description is omitted.

For example, in a thin film transistor 1432 illustrated in FIG. 20B, the conductive layer 1409 is provided so as to overlap the gate electrode layer 1401 with the channel protective layer 1418, the oxide insulating film 1407, and an insulating layer 1408 interposed therebetween, and so as to overlap a channel region of the oxide semiconductor layer 1403 with the channel protective layer 1418, the oxide insulating film 1407, and the insulating layer 1408 interposed therebetween.

As for the thin film transistor 1432, in a manner similar to that of Embodiment 1, after the oxide insulating film 1407 is formed, heat treatment for dehydration or dehydrogenation is performed, and the oxide semiconductor layer 1403 is formed. The heat treatment is performed at a temperature of higher than or equal to 200° C. and lower than or equal to 700° C., preferably, higher than or equal to 350° C. and lower than the strain point of the substrate 1400 under an oxygen gas atmosphere, an inert gas atmosphere (nitrogen, helium, neon, argon, or the like), or under reduced pressure. Slow cooling is preferably performed under an inert gas atmosphere or an oxygen atmosphere after the heat treatment. Then, a contact hole is formed in the oxide insulating film 1407, and the source wiring 1425 which is connected to the source electrode layer 1405a is formed.

In FIG. 20B, the insulating layer 1408 which functions as a planarization film is stacked over the oxide insulating film 1407.

In FIG. 20B, the oxide semiconductor layer 1403 is directly in contact with the source electrode layer 1405a and the drain electrode layer 1405b without any source and drain regions.

In the structure illustrated in FIG. 20B, when the conductive layer 1409 is provided so as to overlap the oxide semiconductor layer 1403, in a BT test for examining reliability of the thin film transistor, the amount of change in threshold voltage of the thin film transistor 1432 between before and after the BT test can be reduced.

This embodiment can be implemented in appropriate combination with the structures described in the other embodiments.

Embodiment 8

In this embodiment, an example of a structure which is partly different from that of Embodiment 1 will be described with reference to FIG. 21. The same portion as Embodiment 1 or a portion having similar function to that described in Embodiment 1 and a process can be formed in a manner similar to that described in Embodiment 1; therefore, repetitive description is omitted.

In this embodiment, after a first oxide semiconductor layer is formed, a second oxide semiconductor film which is used for a source region and a drain region (also referred to as an n$^+$ layer or a buffer layer) of a thin film transistor is formed over the first oxide semiconductor layer, and then a conductive film is formed.

Next, the first oxide semiconductor layer, the second oxide semiconductor film, and the conductive film are selectively etched by an etching process, so that the oxide semiconductor layer 403, the source region 404a, the drain region 404b, the source electrode layer 405a, and the drain electrode layer 405b are formed. Note that part of the oxide semiconductor layer 403 is etched and a groove (depression) is provided.

Then, a silicon oxide film is formed as the oxide insulating film 407 to be in contact with the oxide semiconductor layer 403 by a sputtering method or a PCVD method. The oxide insulating film 407 which is in contact with the oxide semiconductor layer with reduced resistivity does not include impurities such as moisture, hydrogen ions, and OH$^-$ and is formed using an inorganic insulating film which prevents entry of these from the outside. Specifically, a silicon oxide film, a silicon nitride oxide film, an aluminum oxide film, or an aluminum oxynitride film is used. Further, a silicon nitride film or an aluminum nitride film may be stacked over the oxide insulating film 407.

In a manner similar to that of Embodiment 1, after the oxide insulating film 407 is formed, heat treatment for dehydration or dehydrogenation is performed, and the oxide semiconductor layer 403 is formed. The heat treatment is performed at a temperature of higher than or equal to 200° C. and lower than or equal to 700° C., preferably, higher than or equal to 350° C. and lower than the strain point of the substrate 400 under an oxygen gas atmosphere, an inert gas atmosphere (nitrogen, helium, neon, argon, or the like), or under reduced pressure. Slow cooling is preferably performed under an inert gas atmosphere or an oxygen atmosphere after the heat treatment. The heat treatment allows plasma damage caused when the oxide insulating film 407 is formed to be repaired. Then, a contact hole is formed in the oxide insulating film 407, and the source wiring 425 which is connected to the source electrode layer 405a is formed. In this manner, a thin film transistor 464 can be manufactured (see FIG. 21).

Figure 21:
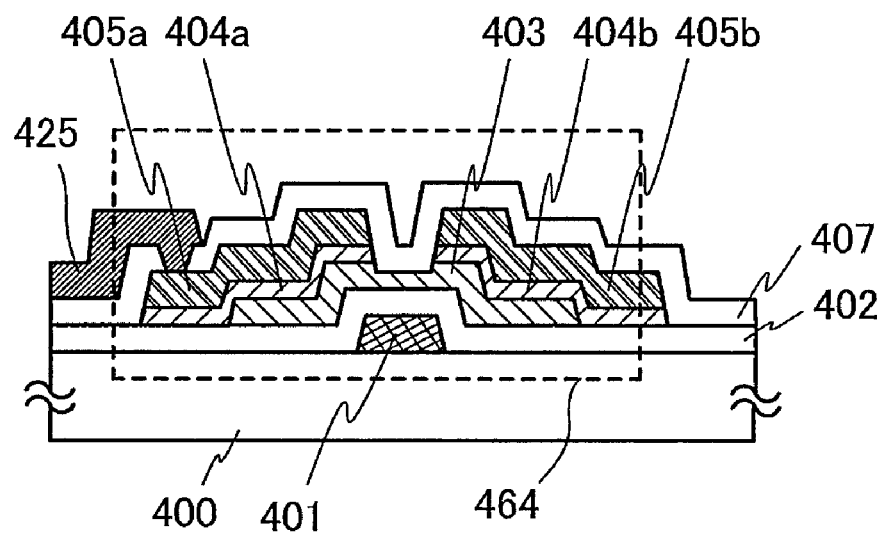
FIG. 21 is a cross-sectional view illustrating a semiconductor device according to an embodiment of the present invention.

As the source region 404a and the drain region 404b in the structure illustrated in FIG. 21, In—Ga—Zn—O-based non-single-crystal is used. Alternatively, an Al—Zn—O-based amorphous film can be used for the source region 404a and the drain region 404b. Further alternatively, an Al—Zn—O-based amorphous film containing nitrogen, that is, an Al—Zn—O—N-based amorphous film (also referred to as an AZON film) may be used for the source region 404a and the drain region 404b.

In addition, a source region may be provided between the oxide semiconductor layer and the source electrode layer, and a drain region may be provided between the oxide semiconductor layer 403 and the drain electrode layer.

The second oxide semiconductor layer used for the source region 404a and the drain region 404b of the thin film transistor 464 is preferably thinner than the first oxide semiconductor layer 403 used for a channel formation region and preferably has higher conductivity (electrical conductivity) than the first oxide semiconductor layer 403.

Further, the first oxide semiconductor layer 403 used for the channel formation region has an amorphous structure and the second oxide semiconductor layer used for the source region and the drain region includes a crystal grain (nanocrystal) in an amorphous structure in some cases. The crystal grain (nanocrystal) in the second oxide semiconductor layer used for the source region and the drain region has a diameter of 1 nm to 10 nm, typically, approximately 2 nm to 4 nm.

This embodiment can be implemented in appropriate combination with the structures described in the other embodiments.

Embodiment 9

In this embodiment, an example will be described below in which at least part of a driver circuit and a thin film transistor to be disposed in a pixel portion are formed over one substrate.

The thin film transistor provided in the pixel portion is formed according to any of Embodiments 1 to 8. Further, the thin film transistor described in any of Embodiments 1 to 8 is an n-channel TFT. Thus, part of a driver circuit that can be formed using n-channel TFTs among driver circuits is formed over the same substrate as that for the thin film transistor in the pixel portion.

Figure 22A:
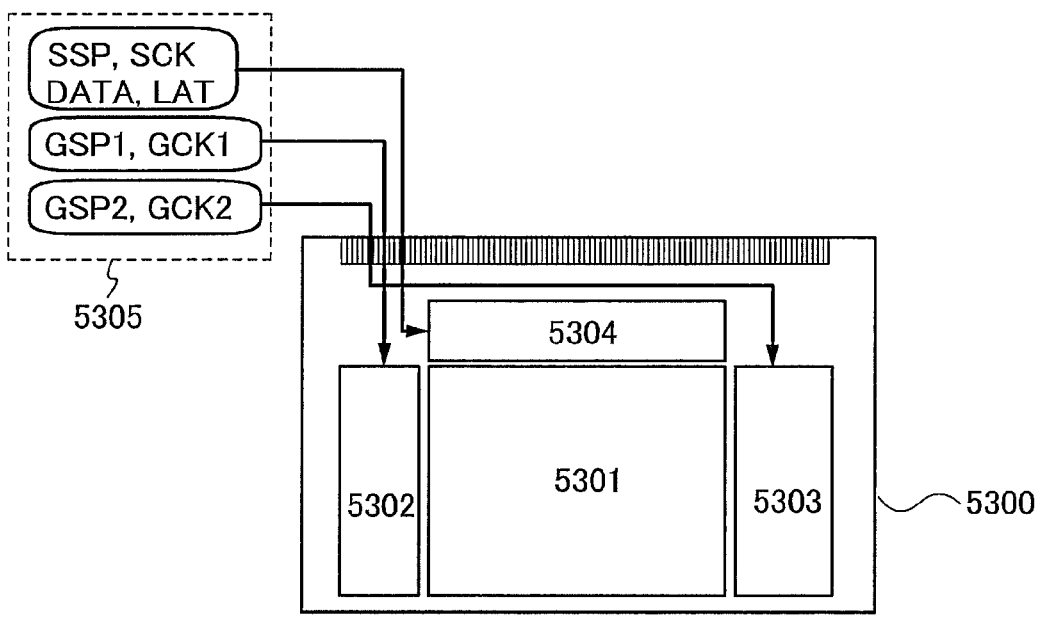
FIGS. 22A and 22B are block diagrams of display devices.

FIG. 22A illustrates an example of a block diagram of an active matrix display device, which is one example of the display device. A pixel portion 5301, a first scan line driver circuit 5302, a second scan line driver circuit 5303, and a signal line driver circuit 5304 are provided over a substrate 5300 of a display device. In the pixel portion 5301, a plurality of signal lines extending from the signal line driver circuit 5304 are provided, and a plurality of scan lines extending from the first scan line driver circuit 5302 and the second scan line driver circuit 5303 are provided. Note that in cross regions of the scan lines and the signal lines, pixels each having a display element are arranged in a matrix. Further, the substrate 5300 of the display device is connected to a timing control circuit 5305 (also referred to as a controller or a control IC) through a connection portion of a flexible printed circuit (FPC) or the like.

In FIG. 22A, the first scan line driver circuit 5302, the second scan line driver circuit 5303, and the signal line driver circuit 5304 are formed over the same substrate 5300 as the pixel portion 5301. Accordingly, the number of parts such as driver circuits provided outside is reduced, so that cost can decrease. Further, a connection portion used for extending a wiring when a driver circuit is provided outside the substrate 5300 has a smaller number of connections, so that reliability and yield can be improved.

Note that the timing control circuit 5305 supplies a start signal for the first scan line driver circuit (GSP1) and a clock signal for the scan line driver circuit (GCK1) to the first scan line driver circuit 5302, as an example. In addition, the timing control circuit 5305 supplies, for example, a start signal for the second scan line driver circuit (GSP2) (also referred to as a start pulse) and a clock signal for the scan line driver circuit (GCK2) to the second scan line driver circuit 5303. A start signal for the signal line driver circuit (SSP), a clock signal for the signal line driver circuit (SCK), data for a video signal (DATA) (also simply referred to as a video signal), and a latch signal (LAT) are supplied to the signal line driver circuit 5304. Note that each clock signal may be a plurality of clock signals with different phases, or may be supplied with an inverted clock signal (CKB). Note that either the first scan line driver circuit 5302 or the second scan line driver circuit 5303 can be omitted.

Figure 22B:
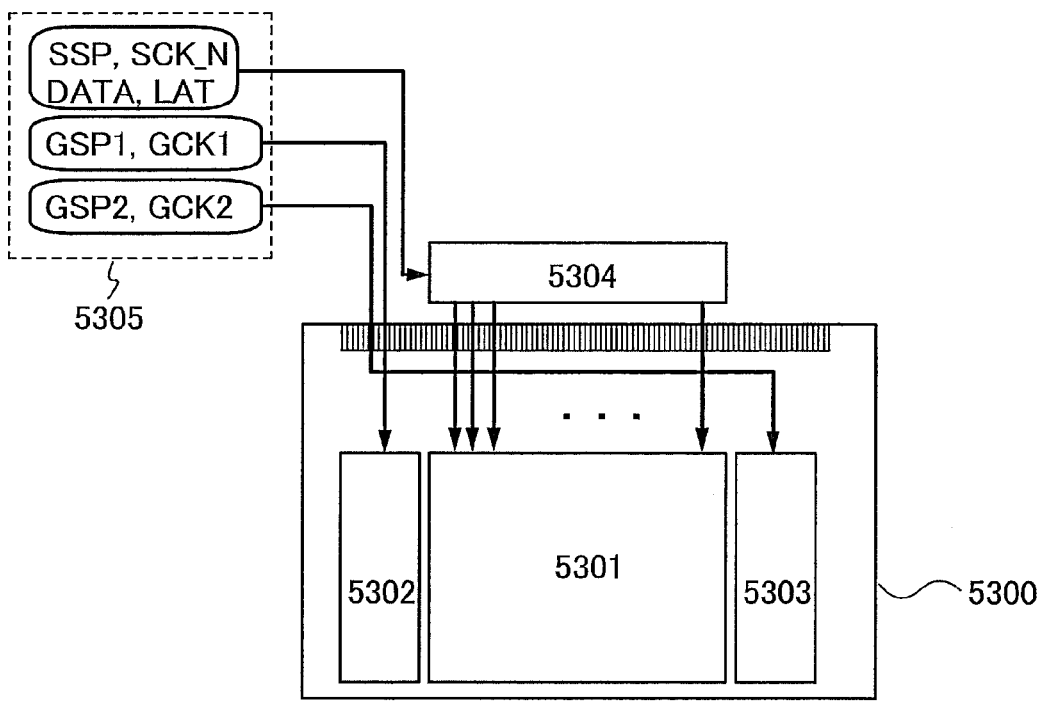

In FIG. 22B, a circuit with a low drive frequency (e.g., the first scan line driver circuit 5302 and the second scan line driver circuit 5303) is formed over the same substrate 5300 as the pixel portion 5301, and the signal line driver circuit 5304 is formed over another substrate which is different from the substrate provided with the pixel portion 5301. This structure enables a driver circuit formed over the substrate 5300 using a thin film transistor having low field effect mobility, compared with a transistor formed using a single crystal semiconductor. Accordingly, increase in the size of the display device, reduction in the number of steps, reduction in cost, improvement in yield, or the like can be achieved.

Figure 23A:
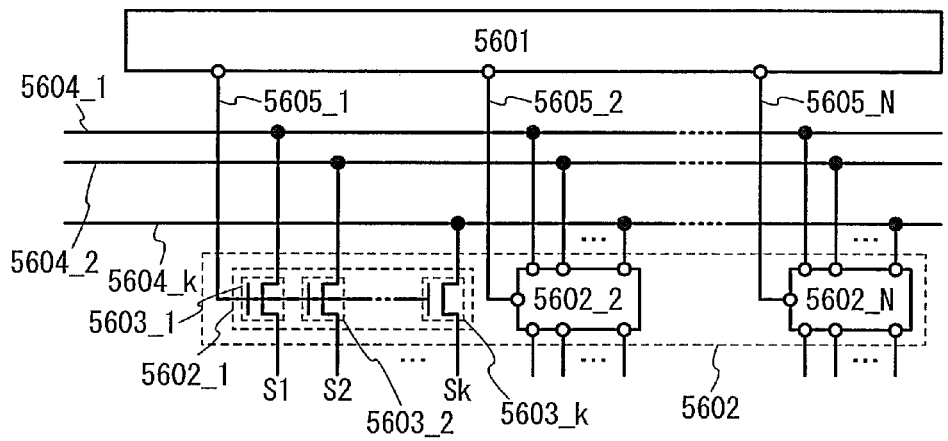
FIGS. 23A and 23B are a view illustrating a structure of a signal line driver circuit and a timing chart thereof, respectively.
Figure 23B:
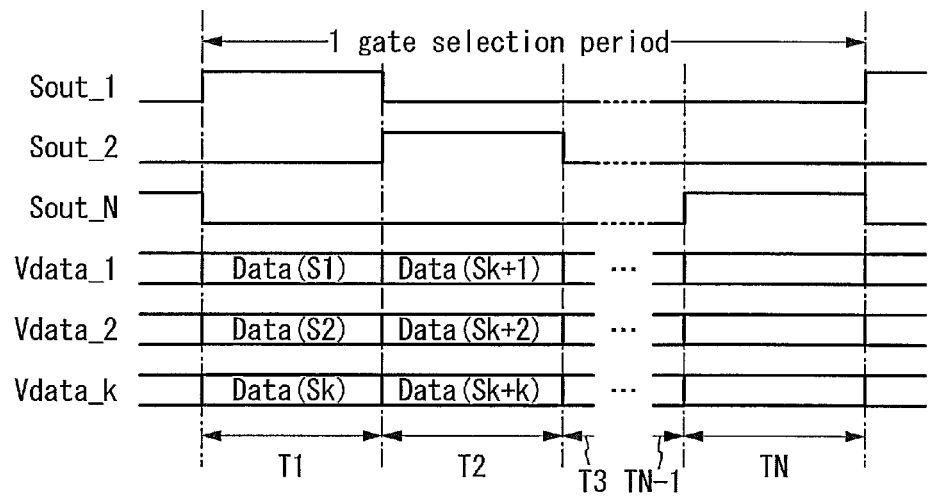

The thin film transistors described in Embodiments 1 to 8 are n-channel TFTs. In FIGS. 23A and 23B, an example of a structure and operation of a signal line driver circuit formed using an n-channel TFT is described.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example in which the thin film transistors 5603_1 to 5603_k are n-channel TFTs is described.

A connection relation of the signal line driver circuit will be described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal wirings S1 to Sk, respectively. Gates of the thin film transistors 5603_1 to 5603_k are connected to a wiring 5605_1.

The shift register 5601 has a function of sequentially outputting H level signals (also referred to as an H signal or a high power supply potential level) to the wirings 5605_1 to 5605_N, and a function of sequentially selecting the switching circuits 5602_1 to 5602_N.

The switching circuit 5602_1 has a function of controlling conduction states between the wirings 5604_1 to 5604_k and the signal lines S1 to Sk (conduction between the first terminal and the second terminal), that is, a function of controlling whether the potentials of the wirings 5604_1 to 5604__k_ are supplied or not to the signal lines S1 to Sk. In this manner, the switching circuit 5602_1 has a function of a selector. The thin film transistors 5603_1 to 5603__k_ have functions of controlling conduction states between the wiring 5604_1 to 5604__k_ and the signal lines S1 to Sk, that is, functions of supplying potentials of the wirings 5604_1 to 5604__k_ to the signal lines S1 to Sk, respectively. In this manner, each of the thin film transistors 5603_1 to 5603__k_ functions as a switch.

Note that the data for a video signal (DATA) is input to the wirings 5604_1 to 5604__k_. The data for a video signal (DATA) is an analog signal corresponding to image data or an image signal in many cases.

Next, operation of the signal line driver circuit illustrated in FIG. 23A is described with reference to a timing chart in FIG. 23B. In FIG. 23B, an example of signals Sout_1 to Sout_N and signals Vdata_1 to Vdata_k is illustrated. The signals Sout_1 to Sout_N are examples of output signals of the shift register 5601, and the signals Vdata_1 to Vdata_k are examples of signals which are input to the wirings 5604_1 to 5604__k_, respectively. Note that one operation period of the signal line driver circuit corresponds to one gate selection period in a display device. For example, one gate selection period is divided into periods T1 to TN. The periods T1 to TN are periods for writing the data for a video signal (DATA) to pixels in a selected row.

In the periods T1 to TN, the shift register 5601 sequentially outputs H level signals to the wirings 5605_1 to 5605_N. For example, in the period T1, the shift register 5601 outputs a high level signal to the wiring 5605_1. Then, the thin film transistors 5603_1 to 5603__k_ are turned on, so that the wirings 5604_1 to 5604__k_ and the signal lines S1 to Sk are brought into conduction. In this case, Data (S1) to Data (Sk) are input to the wirings 5604_1 to 5604__k_, respectively. The Data (S1) to Data (Sk) are input to pixels in a selected row in a first to k-th columns through the thin film transistors 5603_1 to 5603__k_, respectively. Thus, in the periods T1 to TN, the data for a video signal (DATA) is sequentially written to the pixels in the selected row by k columns.

By writing the data for a video signal (DATA) to pixels by a plurality of columns, the number of the data for a video signal (DATA) or the number of wirings can be reduced. Accordingly, the number of connections to external circuits can be reduced. Further, by writing the data for a video signal (DATA) to pixels of a plurality of columns each time, write time can be extended, and shortage of writing of the data for a video signal (DATA) can be prevented.

Note that for the shift register 5601 and the switching circuit 5602, a circuit formed using the thin film transistor described in Embodiments 1 to 8 can be used. In that case, all the transistors included in the shift register 5601 can be only n-channel transistors or only p-channel transistors.

One mode of a shift register which is used for part of a scan line driver circuit and/or a signal line driver circuit will be described with reference to FIGS. 24A to 24C and FIGS. 25A and 25B.

The scan line driver circuit includes a shift register. Additionally, the scan line driver circuit may include a level shifter, a buffer, or the like in some cases. In the scan line driver circuit, when the clock signal (CK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can feed a large amount of current is used.

Figure 24A:
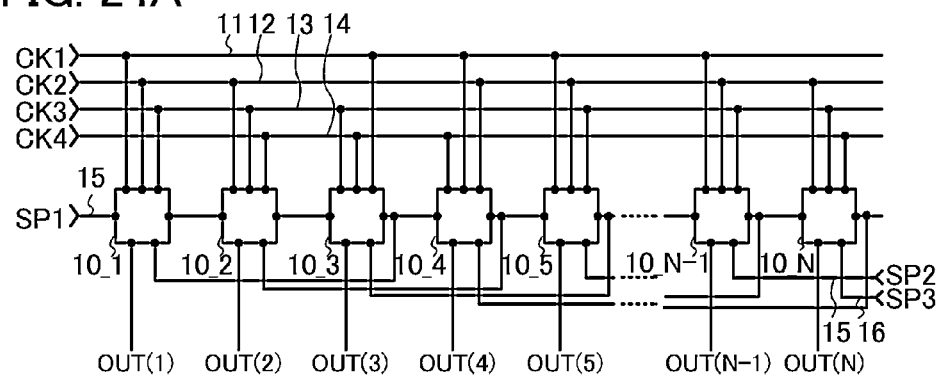
FIGS. 24A to 24C are circuit diagrams illustrating a structure of a shift register.

The shift register includes first to N-th pulse output circuits 10_1 to 10_N (N is a natural number of greater than or equal to 3) (see FIG. 24A). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to N-th pulse output circuits 10_1 to 10_N in the shift register illustrated in FIG. 24A. A start pulse SP1 (first start pulse) from a fifth wiring 15 is input to the first pulse output circuit 10_1. A signal from a pulse output circuit of the previous stage (also referred to as a previous stage signal OUT (n−1) (n is a natural number of greater than or equal to 2) is input to the n-th pulse output circuit 10__n_ (n is a natural number of greater than or equal to 2 and less than or equal to N) of the second and subsequent stages. A signal from the third pulse output circuit 10_3 which is two stages after the first pulse output circuit 10_1 is input to the first pulse output circuit 10_1, or a signal from the (n+2)-th pulse output circuit 10_(n+2) which is two stages after the n-th pulse output circuit 10__n_ is input to the n-th pulse output circuit 10__n_ of the second and subsequent stages (also referred to as a subsequent stage signal OUT (n+2)). From the pulse output circuit of each stage, a first output signal OUT (1) (SR) to be input to a pulse output circuit of a previous stage and/or a pulse output circuit of a subsequent stage and a second output signal OUT (1) which is input to another wiring or the like are output. Note that as illustrated in FIG. 24A, a subsequent stage signal OUT (n+2) is not input to the last two stages of the shift register; therefore, as an example, a second start pulse SP2 and a third start pulse SP3 may be input thereto, respectively.

Note that a clock signal (CK) is a signal which alternates between an H level signal and an L level signal (also referred to as an L signal or a low power supply potential level) at a regular interval. Here, the first to fourth clock signals (CK1) to (CK4) are sequentially delayed by a quarter of a cycle. In this embodiment, by using the first to fourth clock signals (CK1) to (CK4), control or the like of driving of a pulse output circuit is performed. Although the clock signal is used as a GCK or an SCK in accordance with a driver circuit to which the clock signal is input, the clock signal is described as a CK here.

A first input terminal 21, a second input terminal 22, and a third input terminal 23 are electrically connected to any of the first to fourth wirings 11 to 14. For example, in FIG. 24A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 102 is electrically connected to the fourth wiring 14.

Figure 24B:
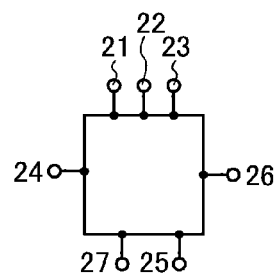

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 24B). In the first pulse output circuit 10_1, the first clock signal CK1 is input to the first input terminal 21, the second clock signal CK2 is input to the second input terminal 22, the third clock signal CK3 is input to the third input terminal 23, the start pulse is input to the fourth input terminal 24, a subsequent stage signal OUT (3) is input to the fifth input terminal 25, a first output signal OUT (1) (SR) is output from the first output terminal 26, and a second output signal OUT (1) is output from the second output terminal 27.

Next, an example of a specific circuit structure of the pulse output circuit illustrated in FIG. 24B will be described with reference to FIG. 24C.

Figure 24C:
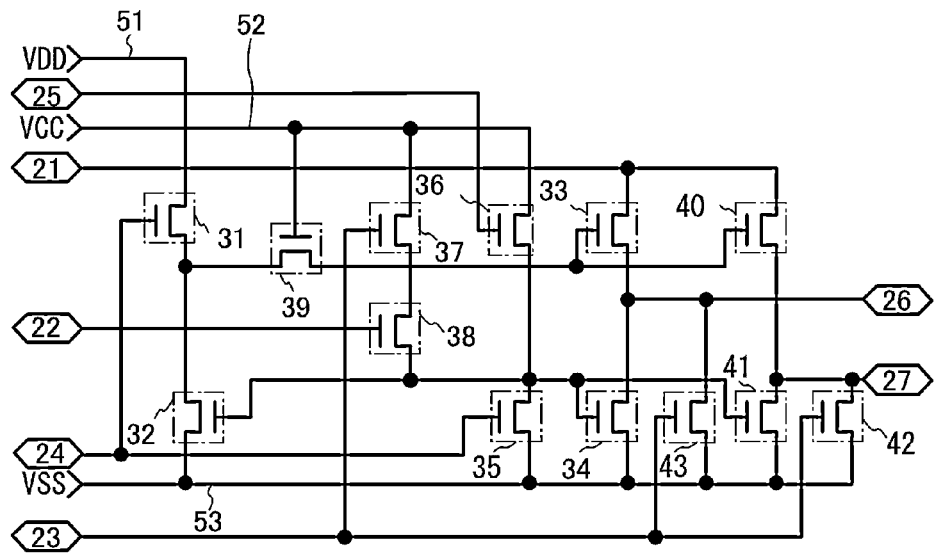

The pulse output circuit illustrated in FIG. 24C includes first to thirteenth transistors 31 to 43. In addition to the first to fifth input terminals 21 to 25, the first output terminal 26, and the second output terminal 27, signals or power supply potentials are supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied. Here, the magnitude relation among power supply potentials of the power supply lines illustrated in FIG. 24C is set as follows: the first power supply potential VDD is higher than or equal to the second power supply potential VCC, and the second power supply potential VCC is higher than the third power supply potential VSS. Although the first to fourth clock signals (CK1) to (CK4) are signals which alternate between an H level signal and an L level signal at a regular interval, a potential is VDD when the clock signal is at an H level, and a potential is VSS when the clock signal is at an L level. Note that the potential VDD of the power supply line 51 is higher than the potential VCC of the power supply line 52, so that there is no effect on an operation, the potential applied to a gate electrode of a transistor can be low, a shift of the threshold voltage of the transistor can be reduced, and deterioration can be suppressed.

In FIG. 24C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. A first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and a gate electrode of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and a gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 24C, a connection portion of the gate electrode of the third transistor 33, the gate electrode of the tenth transistor 40, and the second terminal of the ninth transistor 39 is a node A. A connection portion of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is a node B.

Figure 25A:
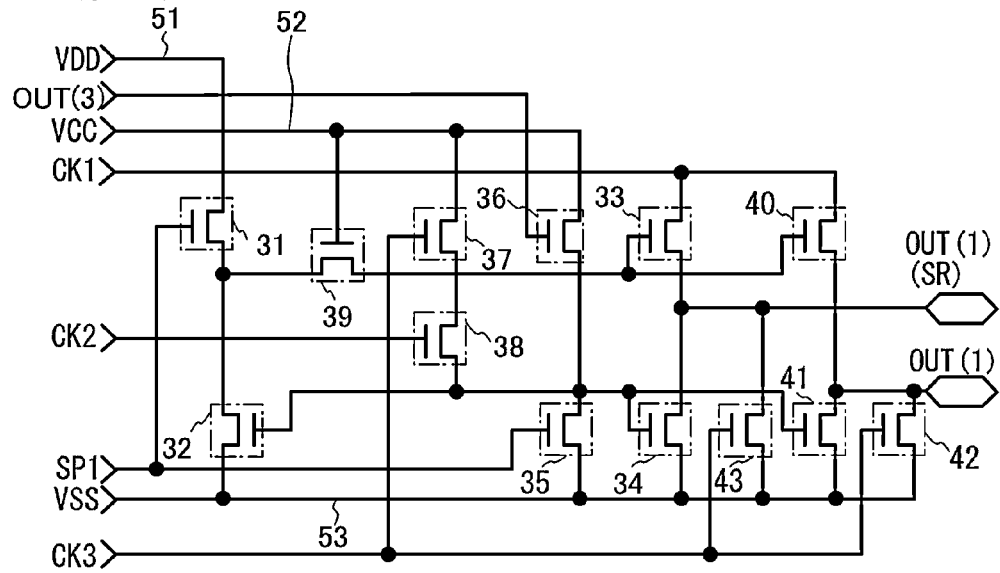
FIGS. 25A and 25B are a view illustrating an equivalent circuit of a shift register and a timing chart thereof showing operations of the shift register, respectively.

In FIG. 25A, signals which are input or output to/from the first to the fifth input terminals 21 to 25, the first output terminal 26, and the second output terminal 27 when the pulse output circuit illustrated in FIG. 24C is applied to the first pulse output circuit 10_1 are illustrated.

Specifically, the first clock signal CK1 is input to the first input terminal 21, the second clock signal CK2 is input to the second input terminal 22, the third clock signal CK3 is input to the third input terminal 23, the start pulse is input to the fourth input terminal 24, the subsequent stage signal OUT (3) is input to the fifth input terminal 25, the first output signal OUT (1) (SR) is output from the first output terminal 26, and the second output signal OUT (1) is output from the second output terminal 27.

Note that a thin film transistor is an element having at least three terminals of a gate, a drain, and a source. The thin film transistor includes a semiconductor whose channel region is formed at a region that overlaps the gate, and the potential of the gate is controlled, whereby current which flows between the drain and the source through the channel region can be controlled. Here, since the source and the drain of the thin film transistor may interchange depending on the structure, the operating condition, and the like of the thin film transistor, it is difficult to define which is a source or a drain. Therefore, a region functioning as a source and a drain is not called the source or the drain in some cases. In such a case, for example, one of the source and the drain may be referred to as a first terminal and the other thereof may be referred to as a second terminal.

Note that in FIGS. 24C and 25A, a capacitor may be provided in order to perform bootstrap operation effected by the node A in a floating state. A capacitor whose one electrode is electrically connected to the node B may be provided in order to hold the potential of the node B.

Figure 25B:
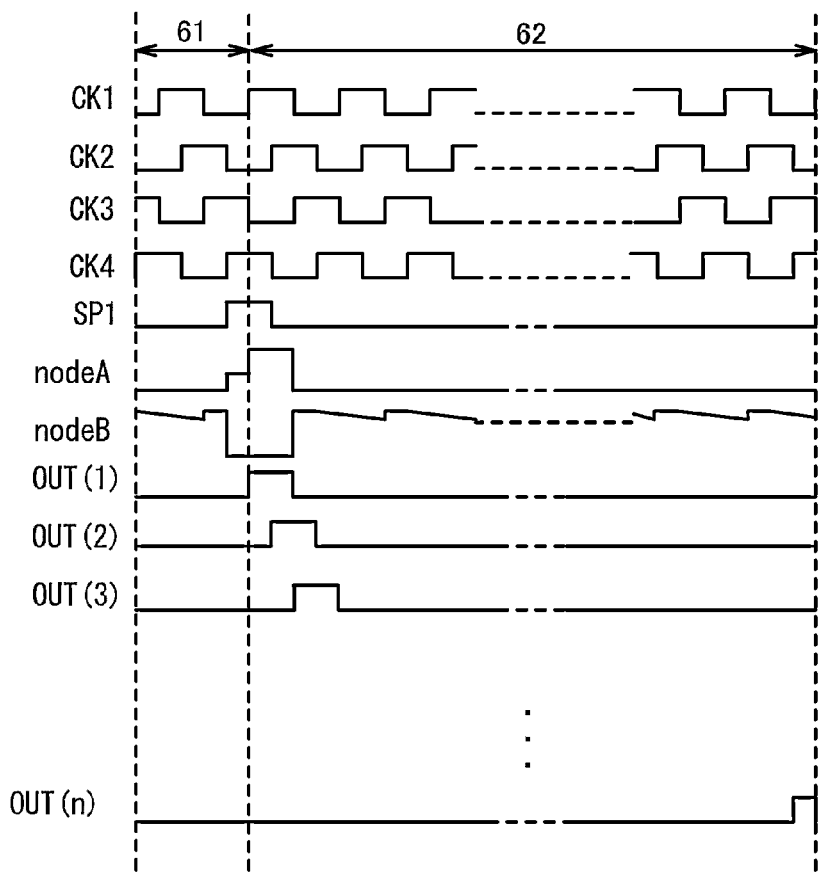

Here, a timing chart of a shift register in which a plurality of pulse output circuits illustrated in FIG. 25A are provided is illustrated in FIG. 25B. Note that in FIG. 25B, when the shift register is a scan line driver circuit, a period 61 is a vertical retrace period and a period 62 is a gate selection period.

Note that as illustrated in FIG. 25A, when the ninth transistor 39 having the gate to which the second power supply potential VCC is applied is provided, there are the following advantages before or after the bootstrap operation.

Without the ninth transistor 39 whose gate electrode is supplied with the second power supply potential VCC, when a potential of the node A is raised by bootstrap operation, a potential of a source which is the second terminal of the first transistor 31 increases to a value higher than the first power supply potential VDD. Then, the source of the first transistor 31 is switched to the first terminal side, that is, the power supply line 51 side. Therefore, in the first transistor 31, a large amount of bias voltage is applied and thus great stress is applied between a gate and a source and between the gate and a drain, which can cause deterioration in the transistor. When the ninth transistor 39 is provided whose gate electrode is supplied with the second power supply potential VCC, a potential of the node A is raised by bootstrap operation, but at the same time, an increase in a potential of the second terminal of the first transistor 31 can be prevented. In other words, with the ninth transistor 39, negative bias voltage applied between a gate and a source of the first transistor 31 can be reduced. Accordingly, with a circuit structure in this embodiment, negative bias voltage applied between a gate and a source of the first transistor 31 can be reduced, so that deterioration in the first transistor 31, which is due to stress, can further be restrained.

Note that the ninth transistor 39 may be provided in any places where the ninth transistor 39 is connected between the second terminal of the first transistor 31 and the gate of the third transistor 33 through the first terminal and the second terminal. When a shift register includes a plurality of pulse output circuits in this embodiment, the ninth transistor 39 may be omitted in a signal line driver circuit which has a larger number of stages than a scan line driver circuit, and there is an advantage of decreasing the number of transistors.

Note that when oxide semiconductors are used for semiconductor layers for the first to the thirteenth transistors 31 to 43, the off current of the thin film transistors can be reduced, the on current and the field effect mobility can be increased, and the degree of deterioration can be reduced, whereby malfunction in a circuit can decrease. Compared with a transistor formed using an oxide semiconductor and a transistor formed using amorphous silicon, the degree of deterioration of the transistor due to the application of a high potential to the gate electrode is low. Therefore, similar operation can be obtained even when the first power supply potential VDD is supplied to the power supply line which supplies the second power supply potential VCC, and the number of power supply lines which are led between circuits can decrease; therefore, the size of the circuit can be reduced Note that the clock signal which is supplied from the third input terminal 23 to the gate electrode of the seventh transistor 37 and the clock signal which is supplied from the second input terminal 22 to the gate electrode of the eighth transistor 38 are the same as the clock signal supplied from the second input terminal 22 to the gate electrode of the seventh transistor 37 and the clock signal supplied from the third input terminal 23 to the gate electrode of the eighth transistor 38, respectively. Thus, these signals function in a manner similar to respective signals even when connections are replaced. Note that in the shift register illustrated in FIG. 25A, the state is changed from the state where both the seventh transistor 37 and the eighth transistor 38 are in an on state, to the state where the seventh transistor 37 is turned off and the eighth transistor 38 is in an on state, and then to the state where both the seventh transistor 37 and the eighth transistor 38 are turned off. Accordingly, the decrease in the potential of the node B is caused twice, which is due to the decrease in the potential applied to the gate electrode of the seventh transistor 37 by the decrease in the potential of the third input terminal 23 and the decrease in the potential applied to the gate electrode of the eighth transistor 38 by the decrease in the potential of the second input terminal 22. On the other hand, when the shift register illustrated in FIG. 25A is operated in accordance with a period illustrated in FIG. 25B, the state is changed from the state where both the seventh transistor 37 and the eighth transistor 38 are in an on state to the state where the seventh transistor 37 is in an on state and the eighth transistor 38 is turned off, and then to the state where both the seventh transistor 37 and the eighth transistor 38 are turned off. Accordingly, the number of times of the decrease in the potential of the node B, which is due to the decrease in the potential of the second input terminal 22 and the potential of the third input terminal 23, can be reduced to one because of the decrease in the potential of the gate electrode of the eighth transistor 38. Therefore, the connection relation, that is, the clock signal CK3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the change in the potential of the node B can be reduced, whereby the noise can be decreased.

In this way, in a period during which the potential of the first output terminal 26 and the potential of the second output terminal 27 are each held at an L level, an H level signal is regularly supplied to the node B; therefore, malfunction of the pulse output circuit can be suppressed.

This embodiment can be implemented in appropriate combination with the structures described in the other embodiments.

Embodiment 10

A thin film transistor is manufactured, and a semiconductor device having a display function (also referred to as a display device) can be manufactured using the thin film transistor in a pixel portion and further in a driver circuit. Further, part or whole of the driver circuit can be formed over the same substrate as the pixel portion, using the thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which a display element is sealed, and a module in which an IC and the like including a controller are mounted on the panel. Furthermore, an element substrate, which corresponds to an embodiment before the display element is completed in a manufacturing process of the display device, is provided with a means for supplying current to the display element in each of a plurality of pixels. The element substrate may be specifically in a state where only a pixel electrode of a display element is formed or in a state after a conductive film to be a pixel electrode is formed and before the conductive film is etched to form a pixel electrode, and can have any mode.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Figure 26A:
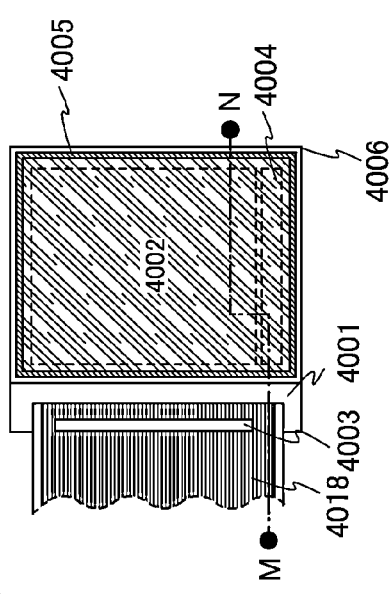
FIGS. 26A to 26C are views illustrating a semiconductor device.
Figure 26B:
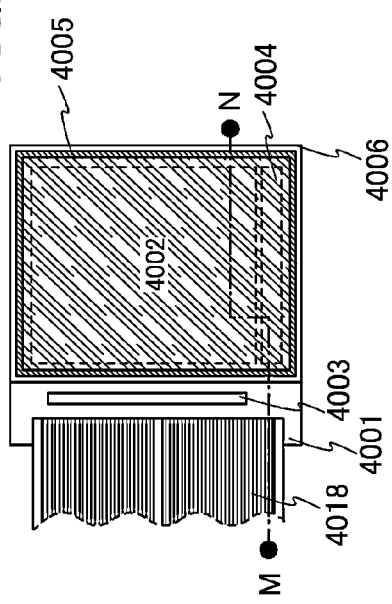
Figure 26C:
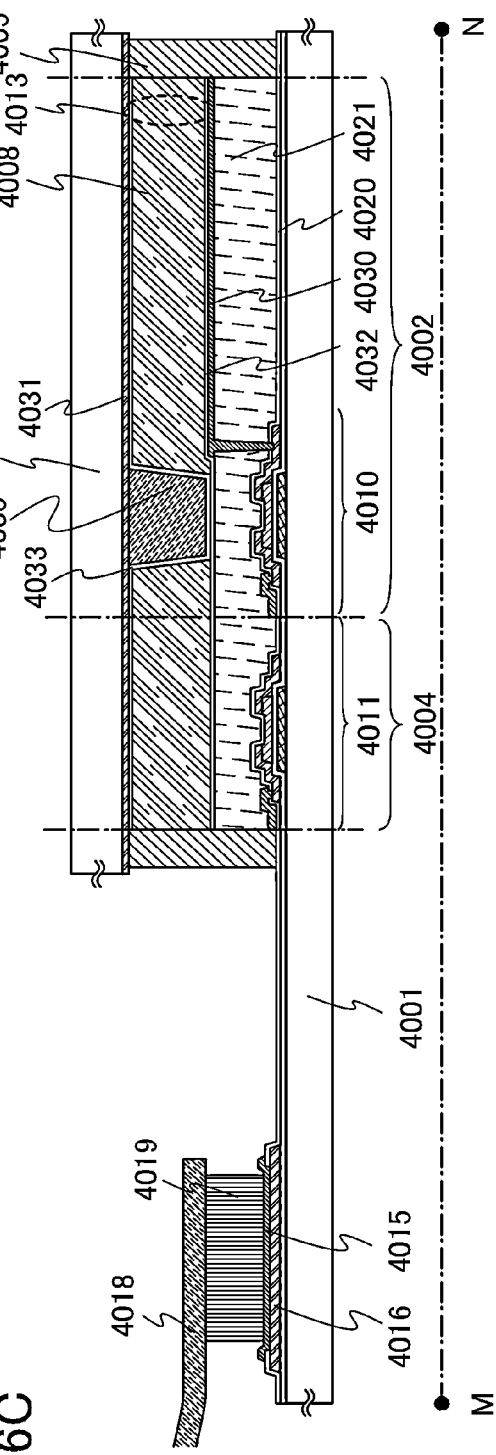

The appearance and a cross section of a liquid crystal display panel, which is an embodiment of a semiconductor device, will be described with reference to FIGS. 26A to 26C. FIGS. 26A and 26B are each a plan view of a panel in which highly reliable thin film transistors 4010 and 4011 each including the oxide semiconductor layer described in any of Embodiments 1 to 8, and a liquid crystal element 4013 are sealed between a first substrate 4001 and a second substrate 4006 with a sealant 4005. FIG. 26C is a cross-sectional view taken along line M-N of FIGS. 26A and 26B.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 26A illustrates an example in which the signal line driver circuit 4003 is mounted by a COG method and FIG. 26B illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 26C illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

Any of the highly reliable thin film transistors including the oxide semiconductor layer which is described in any of Embodiments 1 to 8 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A spacer 4035 is a columnar spacer obtained by selective etching of an insulating film and is provided in order to control the distance (a cell gap) between the pixel electrode layer 4030 and the counter electrode layer 4031. Alternatively, a spherical spacer may also be used. In addition, the counter electrode layer 4031 is electrically connected to a common potential line formed over the same substrate as the thin film transistor 4010. With the use of a common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, a liquid crystal composition containing a chiral agent at 5 wt % or more so as to improve the temperature range is used for the liquid crystal layer 4008. The liquid crystal composition which includes a liquid crystal exhibiting a blue phase and a chiral agent has a short response time of 1 msec or less, has optical isotropy, which makes the alignment process unneeded, and has a small viewing angle dependence.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer (color filter) and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In order to reduce surface unevenness of the thin film transistor and to improve reliability of the thin film transistor, the thin film transistor obtained in any of the above embodiments is covered with the insulating layers (the insulating layer 4020 and the insulating layer 4021) serving as a protective film or a planarizing insulating film. Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, an aluminum oxynitride film, and/or an aluminum nitride oxide film by a sputtering method. Although an example in which the protective film is formed by a sputtering method is described in this embodiment, an embodiment of the present invention is not limited to this method and a variety of methods may be employed.

In this embodiment, the insulating layer 4020 having a stacked-layer structure is formed as a protective film. Here, as a first layer of the insulating layer 4020, a silicon oxide film is formed by a sputtering method. The use of a silicon oxide film as a protective film has an effect of preventing hillock of an aluminum film used for the source and drain electrode layers.

As a second layer of the protective film, an insulating layer is formed. Here, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electric properties of the TFT.

Further, heat treatment (at 300° C. or lower) may be performed under a nitrogen atmosphere or an air atmosphere after the formation of the protective film.

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the formation method of the insulating layer 4021, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistor 4011.

The connection terminal electrode 4015 is electrically connected to a terminal included in the FPC 4018 via an anisotropic conductive film 4019.

FIGS. 26A to 26C illustrate an example in which the signal line driver circuit 4003 is formed separately and mounted on the first substrate 4001; however, an embodiment of the present invention is not limited to this structure. The scan line driver circuit may be separately formed and then mounted, or only part of the signal line driver circuit or part of the scan line driver circuit may be separately formed and then mounted.

Figure 27:
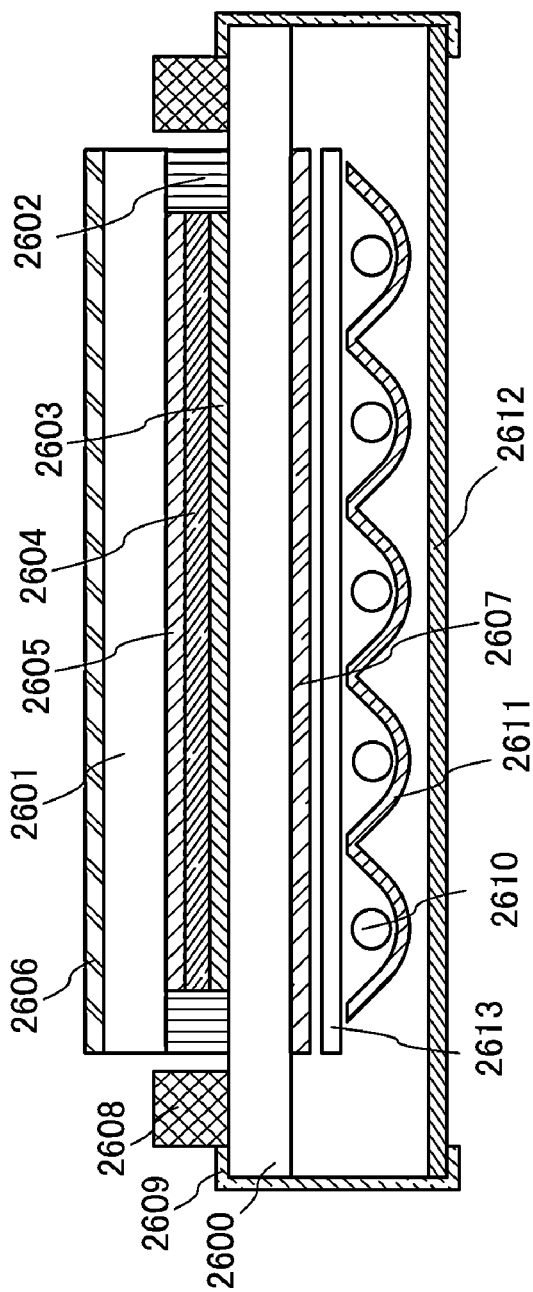
FIG. 27 is a view illustrating a semiconductor device.

FIG. 27 illustrates an example in which a liquid crystal display module is formed as a semiconductor device using a TFT substrate 2600 which is manufactured according to the manufacturing method disclosed in this specification.

FIG. 27 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605, are provided between the substrates to form a display region. The coloring layer 2605 is necessary to perform color display. In the RGB system, respective coloring layers corresponding to colors of red, green, and blue are provided for respective pixels. A polarizing plate 2606 is provided on the outer side of the counter substrate 2601, while a polarizing plate 2607 and a diffusion plate 2613 are provided on the outer side of the TFT substrate 2600. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power supply circuit. The polarizing plate and the liquid crystal layer may be stacked with a retardation plate interposed therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Fenoelectric Liquid Crystal) mode, an AFLC (Anti Ferroelectric Liquid Crystal) mode, or the like.

Through this process, a highly reliable liquid crystal display panel as a semiconductor device can be manufactured.

This embodiment can be implemented in appropriate combination with the structures described in the other embodiments.

Embodiment 11

An example of electronic paper will be described as a semiconductor device.

The semiconductor device can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain dye and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistor described in any of Embodiments 1 to 8 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 28:
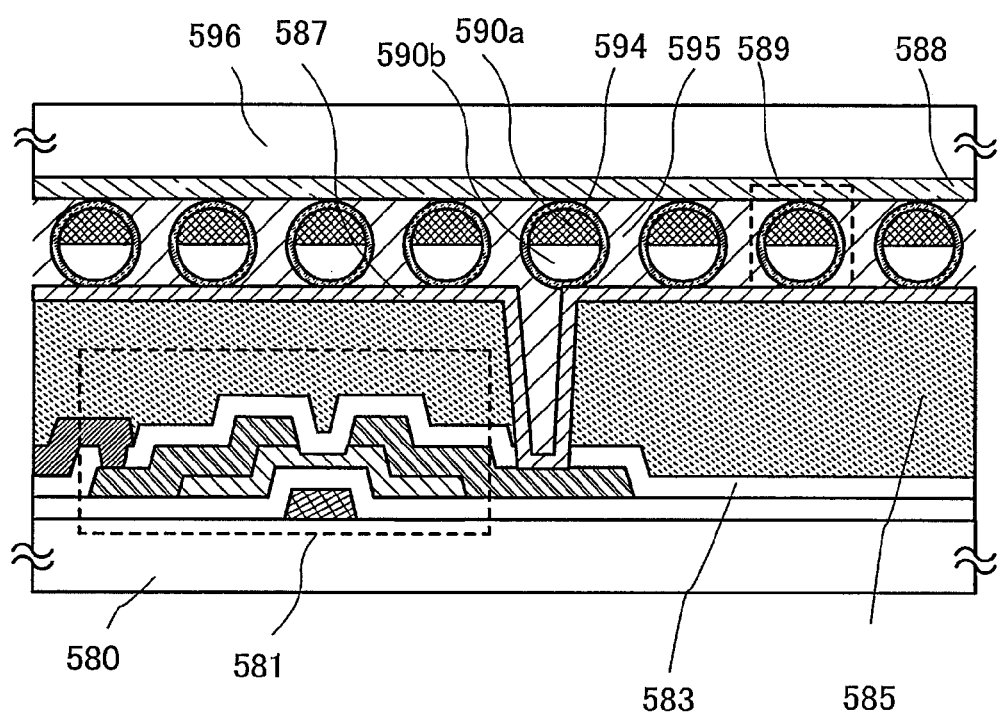
FIG. 28 is a view illustrating a semiconductor device.

FIG. 28 illustrates active matrix electronic paper as an example of a semiconductor device. A thin film transistor 581 used for the semiconductor device can be formed in a manner similar to the thin film transistor described in any of Embodiments 1 to 8, which is a highly reliable thin film transistor including an oxide semiconductor layer.

The electronic paper in FIG. 28 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom gate thin film transistor and is covered with an insulating film 583 which is in contact with a semiconductor layer. A source electrode layer or a drain electrode layer of the thin film transistor 581 is in contact with a first electrode layer 587 in an opening formed in an insulating layer 585, whereby the thin film transistor 581 is electrically connected to the first electrode layer 587. Between the first electrode layer 587 and a second electrode layer 588 on a substrate 596, spherical particles 589 are provided. Each spherical particle 589 includes a black region 590a and a white region 590b, and a cavity 594 filled with liquid around the black region 590a and the white region 590b. The circumference of the spherical particle 589 is filled with a filler 595 such as a resin or the like. The first electrode layer 587 corresponds to a pixel electrode, and the second electrode layer 588 corresponds to a common electrode. The second electrode layer 588 is electrically connected to a common potential line provided over the same substrate 580 as the thin film transistor 581. With the use of a common connection portion, the second electrode layer 588 can be electrically connected to the common potential line via conductive particles provided between the substrate 580 and the substrate 596.

Further, instead of the twisting ball, an electrophoretic element can also be used. A microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be implemented in appropriate combination with the structures described in the other embodiments.

Embodiment 12

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Based on this mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 29:
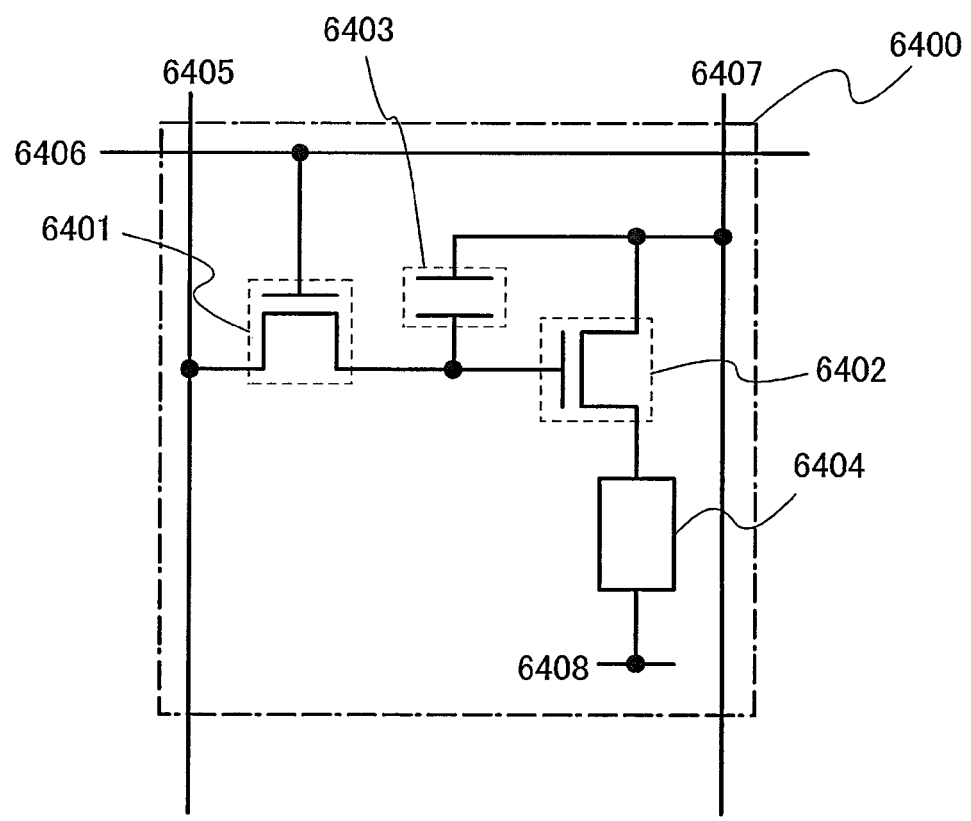
FIG. 29 is a view illustrating a equivalent circuit of a pixel included in a semiconductor device.

FIG. 29 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor for a light-emitting element 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor for a light-emitting element 6402. The gate of the driver transistor for a light-emitting element 6402 is connected to a power supply line 6407 via the capacitor 6403, a first electrode of the driver transistor for a light-emitting element 6402 is connected to the power supply line 6407, and a second electrode of the driver transistor for a light-emitting element 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is forward threshold voltage or higher of the light-emitting element 6404.

Gate capacitance of the driver transistor for a light-emitting element 6402 may be used as a substitute for the capacitor 6403, so that the capacitor 6403 can be omitted. The gate capacitance of the driver transistor for a light-emitting element 6402 may be formed between a channel region and a gate electrode.

In the case of a voltage-input voltage driving method, a video signal is input to the gate of the driver transistor for a light-emitting element 6402 so that the driver transistor for a light-emitting element 6402 is in either of two states of being sufficiently turned on and turned off. That is, the driver transistor for a light-emitting element 6402 operates in a linear region. Since the driver transistor for a light-emitting element 6402 operates in a linear region, voltage higher than the voltage of the power supply line 6407 is applied to the gate of the driver transistor for a light-emitting element 6402. Note that voltage higher than or equal to (voltage of the power supply line +Vth of the driver transistor for a light-emitting element 6402) is applied to the signal line 6405.

In the case of performing analog grayscale driving instead of digital time grayscale driving, the same pixel structure as that in FIG. 29 can be used by changing signal input.

In the case of performing analog grayscale driving, voltage higher than or equal to (forward voltage of the light-emitting element 6404+Vth of the driver transistor for a light-emitting element 6402) is applied to the gate of the driver transistor for a light-emitting element 6402. The forward voltage of the light-emitting element 6404 indicates voltage at which a desired luminance is obtained, and includes at least forward threshold voltage. By inputting a video signal to enable the driver transistor for a light-emitting element 6402 to operate in a saturation region, current can be supplied to the light-emitting element 6404. In order to allow the driver transistor for a light-emitting element 6402 to operate in the saturation region, the potential of the power supply line 6407 is higher than a gate potential of the driver transistor for a light-emitting element 6402. When an analog video signal is used, it is possible to feed current to the light-emitting element 6404 in accordance with the video signal and perform analog grayscale driving.

Note that an embodiment of the present invention is not limited to the pixel structure illustrated in FIG. 29. For example, a switch, a resistor, a capacitor, a transistor, a logic circuit, or the like may be added to the pixel illustrated in FIG. 29.

Next, structures of the light-emitting element will be described with reference to FIGS. 30A to 30C. A cross-sectional structure of a pixel is described by taking an n-channel driver TFT for a light-emitting element as an example. Driver TFTs for a light-emitting element 7001, 7011, and 7021 used in semiconductor devices illustrated in FIGS. 30A, 30B, and 30C, respectively, can be formed in a manner similar to that of the thin film transistor which is described in any of Embodiments 1 to 8 and arranged in a pixel and are highly reliable thin film transistors each including an oxide semiconductor layer.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure will be described with reference to FIG. 30A.

Figure 30A:
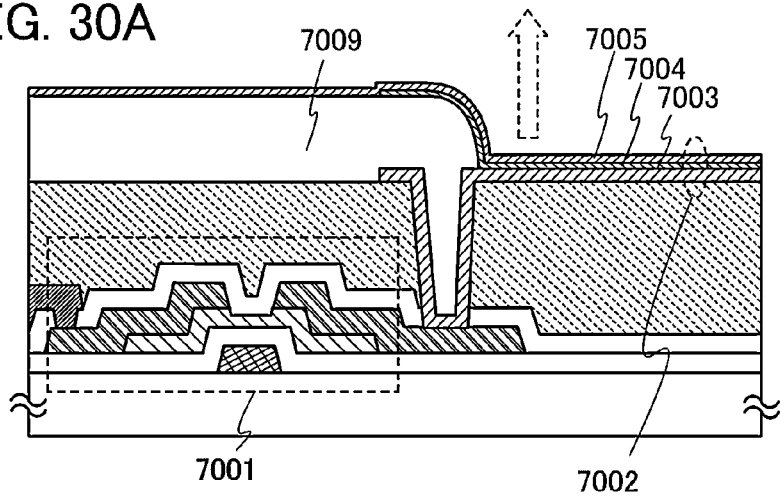
FIGS. 30A to 30C are views illustrating semiconductor devices.

FIG. 30A is a cross-sectional view of a pixel in the case where the driver TFT for a light-emitting element 7001 is of an n type and light is emitted from a light-emitting element 7002 to an anode 7005 side. In FIG. 30A, a cathode 7003 of the light-emitting element 7002 is electrically connected to the driver TFT for a light-emitting element 7001, and a light-emitting layer 7004 and the anode 7005 are stacked in that order over the cathode 7003. The cathode 7003 can be formed using a variety of conductive materials as long as they have a low work function and reflect light. For example, Ca, Al, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in that order over the cathode 7003. It is not necessary to form all of these layers. The anode 7005 is made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A partition 7009 is provided so as to cover part of the cathode 7003. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material so that a side surface of the partition 7009 is formed as an inclined surface with continuous curvature. When the partition 7009 is formed using a photosensitive resin material, a step of forming a resist mask can be omitted.

The light-emitting element 7002 corresponds to a region where the light-emitting layer 7004 is sandwiched between the cathode 7003 and the anode 7005. In the case of the pixel illustrated in FIG. 30A, light is emitted from the light-emitting element 7002 to the anode 7005 side as indicated by an arrow.

Next, a light-emitting element having a bottom emission structure will be described with reference to FIG. 30B. FIG. 30B is a cross-sectional view of a pixel in the case where the driver TFT for a light-emitting element 7011 is an n-channel transistor and light is emitted from a light-emitting element 7012 to a cathode 7013 side. In FIG. 30B, the cathode 7013 of the light-emitting element 7012 is formed over a light-transmitting conductive film 7017 that is electrically connected to the driver TFT for a light-emitting element 7011, and a light-emitting layer 7014 and an anode 7015 are stacked in that order over the cathode 7013. A light-blocking film 7016 for reflecting or blocking light may be formed so as to cover the anode 7015 when the anode 7015 has a light-transmitting property. For the cathode 7013, various materials can be used as in the case of FIG. 30A as long as they are conductive materials having a low work function. The cathode 7013 is formed to a thickness that can transmit light (preferably, approximately 5 nm to 30 nm). For example, an aluminum film with a thickness of 20 nm can be used as the cathode 7013. Similar to the case of FIG. 30A, the light-emitting layer 7014 may be formed using either a single layer or a plurality of layers stacked. The anode 7015 is not required to transmit light, but can be formed using a conductive material having a light-transmitting property with respect to visible light as in the case of FIG. 30A. As the light-blocking film 7016, a metal or the like that reflects light can be used; however, it is not limited to a metal film. For example, a resin or the like to which black pigments are added can also be used.

A partition 7019 is provided so as to cover part of the conductive film 7017. The partition 7019 is formed using an organic resin film of polyimide, acrylic, polyamide, epoxy, or the like, an inorganic insulating film, or organic polysiloxane. It is particularly preferable that the partition 7019 be formed using a photosensitive resin material so that a side surface of the partition 7019 is formed as an inclined surface with continuous curvature. When the partition 7019 is formed using a photosensitive resin material, a step of forming a resist mask can be omitted.

The light-emitting element 7012 corresponds to a region where the light-emitting layer 7014 is sandwiched between the cathode 7013 and the anode 7015. In the case of the pixel illustrated in FIG. 30B, light is emitted from the light-emitting element 7012 to the cathode 7013 side as indicated by an arrow.

Next, a light-emitting element having a dual emission structure will be described with reference to FIG. 30C. In FIG. 30C, a cathode 7023 of a light-emitting element 7022 is formed over a light-transmitting conductive film 7027 which is electrically connected to the driver TFT for a light-emitting element 7021, and a light-emitting layer 7024 and an anode 7025 are sequentially stacked over the cathode 7023. For the cathode 7023, various materials can be used as in the case of FIG. 30A as long as they are conductive materials having a low work function. The cathode 7023 is formed to a thickness that can transmit light. For example, a film of Al having a thickness of 20 nm can be used as the cathode 7023. As in FIG. 30A, the light-emitting layer 7024 may be formed using either a single layer or a plurality of layers stacked. In a manner similar to FIG. 30A, the anode 7025 can be formed using a light-transmitting conductive material.

A partition 7029 is provided so as to cover part of the conductive film 7027. The partition 7029 is formed using an organic resin film of polyimide, acrylic, polyamide, epoxy, or the like, an inorganic insulating film, or organic polysiloxane. It is particularly preferable that the partition 7029 be formed using a photosensitive resin material so that a side surface of the partition 7029 is formed as an inclined surface with continuous curvature. When the partition 7029 is formed using a photosensitive resin material, a step of forming a resist mask can be omitted.

The light-emitting element 7022 corresponds to a region where the cathode 7023, the light-emitting layer 7024, and the anode 7025 overlap one another. In the case of the pixel illustrated in FIG. 30C, light is emitted from the light-emitting element 7022 to both the anode 7025 side and the cathode 7023 side as indicated by arrows.

Although the organic EL elements are described here as the light-emitting elements, an inorganic EL element can also be provided as a light-emitting element.

Note that the example is described in which a thin film transistor (a driver TFT for a light-emitting element) which controls the driving of a light-emitting element is electrically connected to the light-emitting element; however, a structure may be employed in which a TFT for current control is connected between the driver TFT for a light-emitting element and the light-emitting element.

Figure 30B:
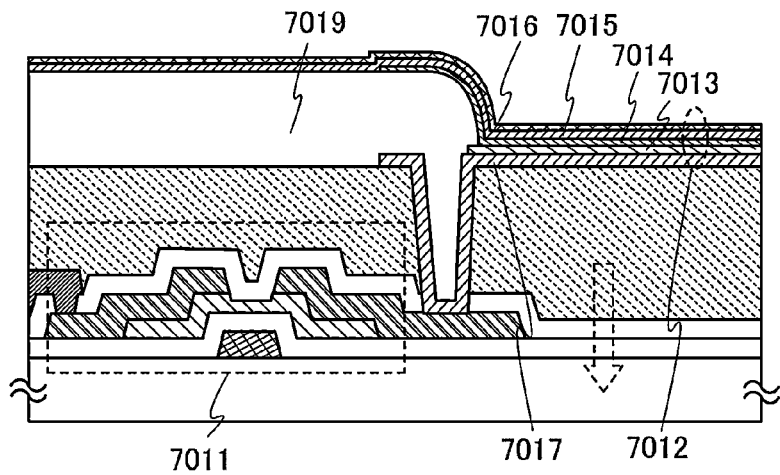
Figure 30C:
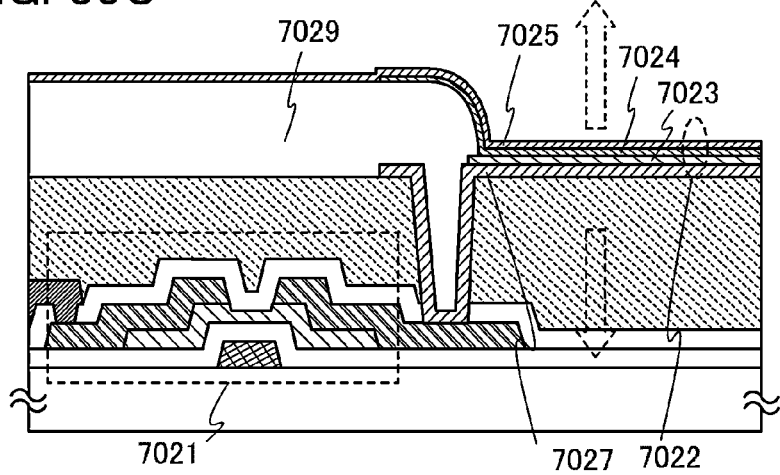

Note that the structure of the semiconductor device is not limited to those illustrated in FIGS. 30A to 30C and can be modified in various ways based on techniques disclosed in this specification.

Figure 31A:
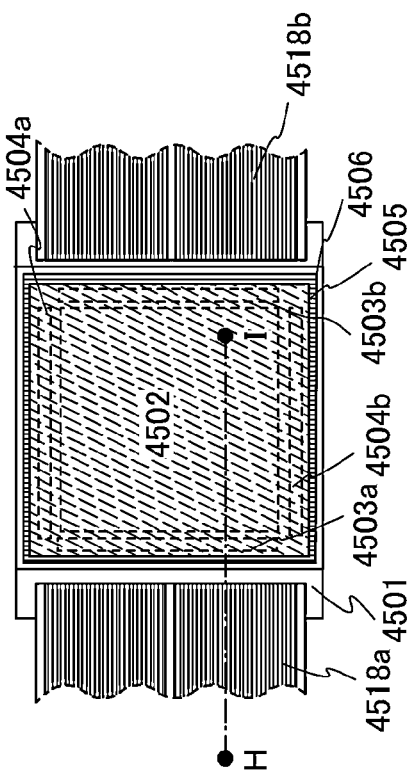
FIGS. 31A and 31B are views illustrating a semiconductor device.
Figure 31B:
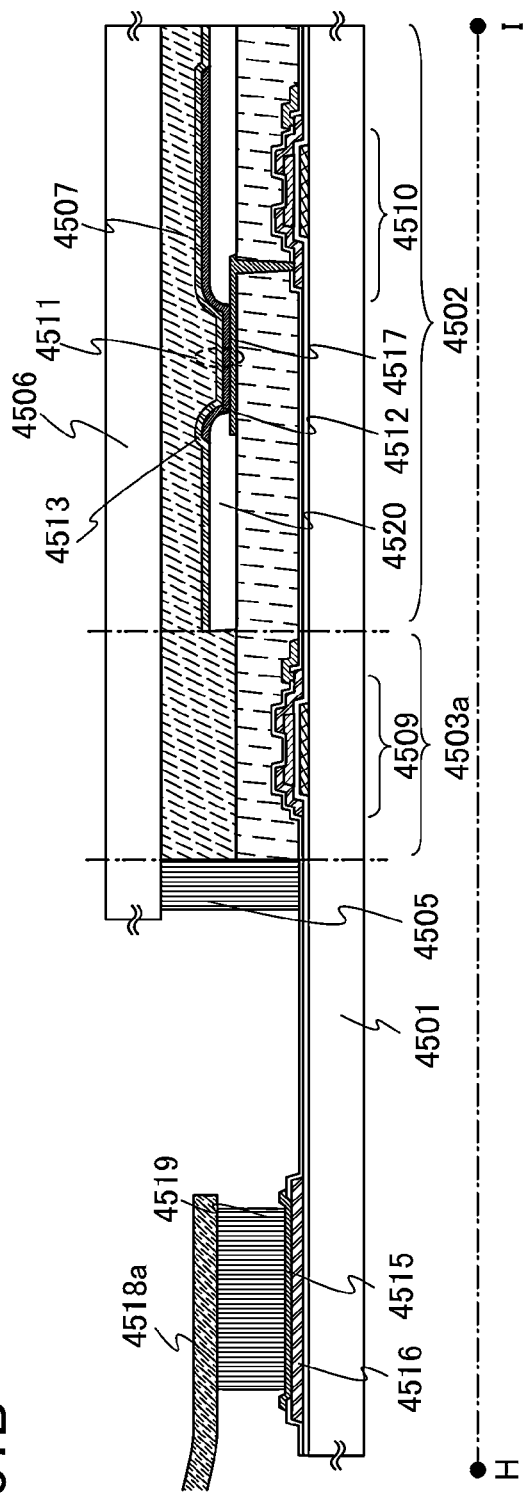

Next, the appearance and cross section of a light-emitting display panel (also referred to as a light-emitting panel) which corresponds to one mode of a semiconductor device will be described with reference to FIGS. 31A and 31B. FIG. 31A is a top view of a panel in which a thin film transistor and a light-emitting element formed over a first substrate are sealed between the first substrate and a second substrate with a sealant. FIG. 31B is a cross-sectional view taken along line H-I of FIG. 31A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 31B.

For the thin film transistors 4509 and 4510, the highly reliable thin film transistor including the oxide semiconductor layer described in any of Embodiments 1 to 8 can be employed. The thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is, but not limited to, the stacked structure which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, and the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode layer 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518a via an anisotropic conductive film 4519.

As the second substrate 4506 located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 31A and 31B.

Through this process, a highly reliable light-emitting display device (display panel) as a semiconductor device can be manufactured.

This embodiment can be implemented in appropriate combination with the structures described in the other embodiments.

Embodiment 13

A semiconductor device disclosed in this specification can be applied to electronic paper. Electronic paper can be used for electronic devices of a variety of fields as long as they can display data. For example, electronic paper can be applied to an e-book reader (electronic book), a poster, an advertisement in a vehicle such as a train, or displays of various cards such as a credit card. An example of the electronic device is illustrated in FIG. 32.

Figure 32:
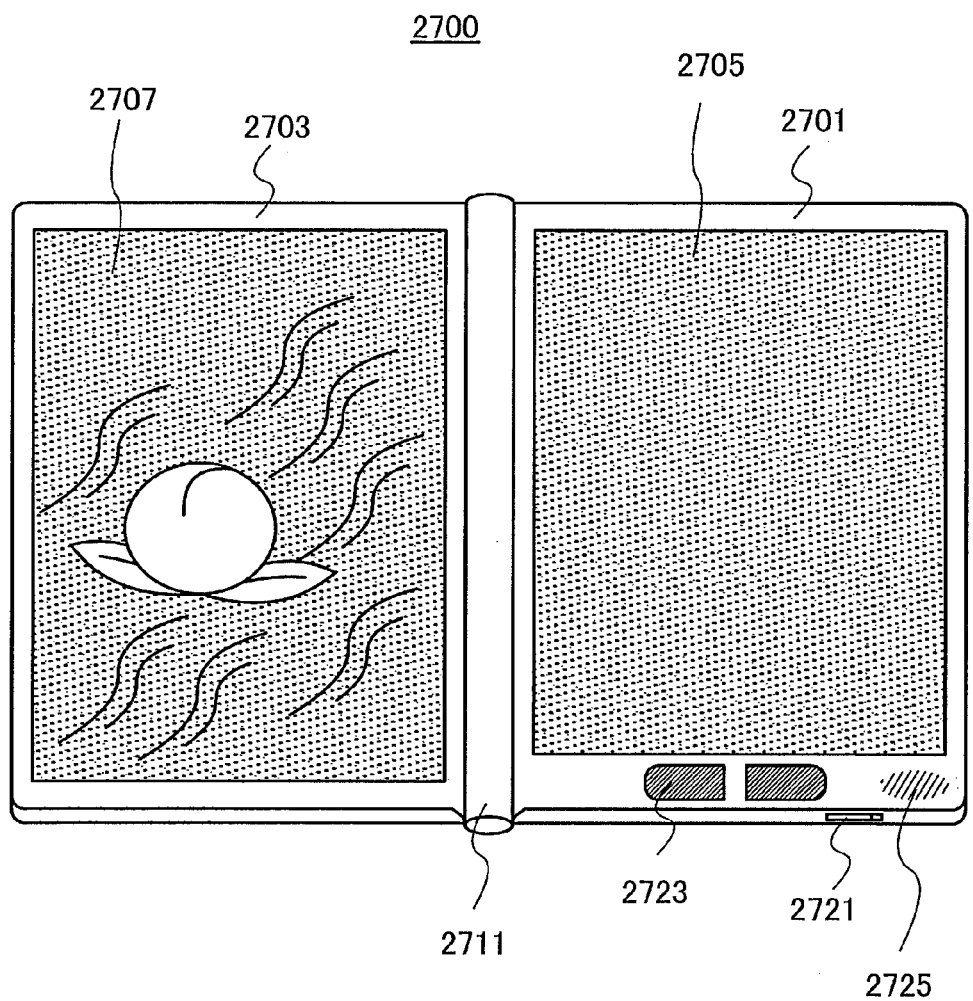
FIG. 32 is an external view of an example of an e-book reader.

FIG. 32 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 32) can display text and a display portion on the left side (the display portion 2707 in FIG. 32) can display graphics.

FIG. 32 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

Embodiment 14

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a cellular phone handset (also referred to as a cellular phone or a cellular phone device), a portable game console, a portable information terminal, an audio reproducing device, a large-sized game machine such as a pachinko machine, and the like.

Figure 33A:
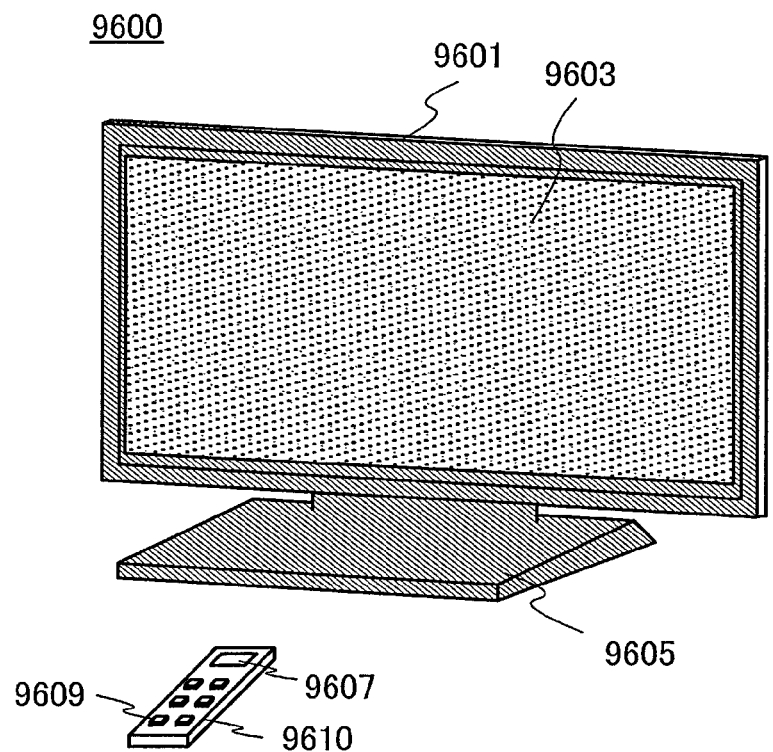
FIG. 33A is an external view of an example of a television device.

FIG. 33A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 33B:
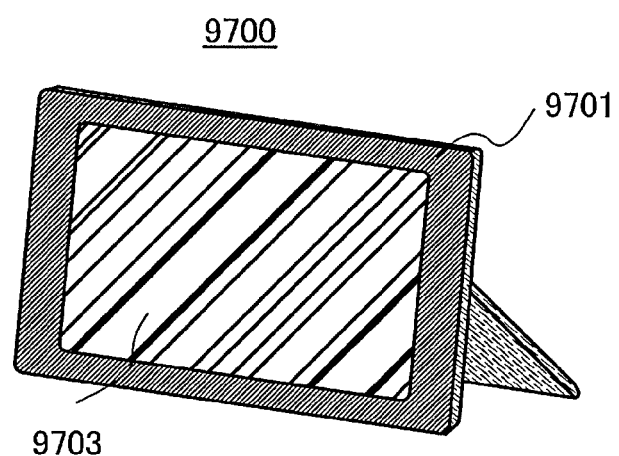
FIG. 33B is an external view of an example of a digital photo frame.

FIG. 33B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 34A:
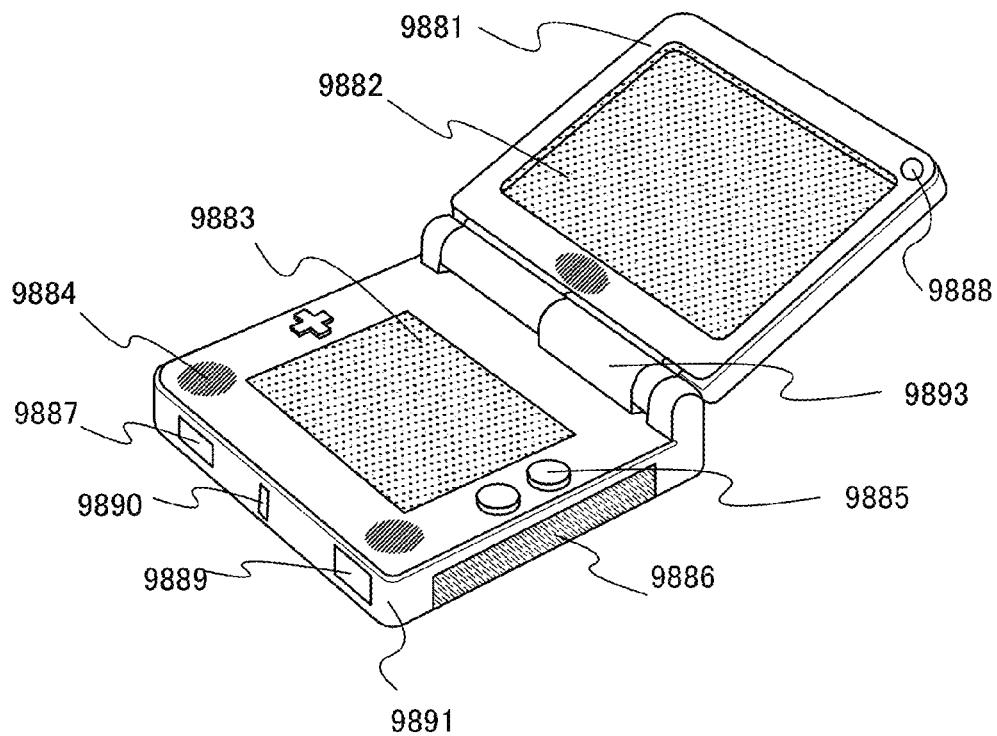
FIGS. 34A and 34B are external views of examples of an amusement machine.

FIG. 34A is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 34A includes a speaker portion 9884, a recording medium insert portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device disclosed in this specification can be employed. The portable amusement machine may include other accessory equipment, as appropriate. The portable amusement machine illustrated in FIG. 34A has a function of reading a program or data stored in a recording medium to display it on the display portion, and a function of sharing information with another portable amusement machine by wireless communication. The portable amusement machine illustrated in FIG. 34A can have various functions without limitation to the above.

Figure 34B:
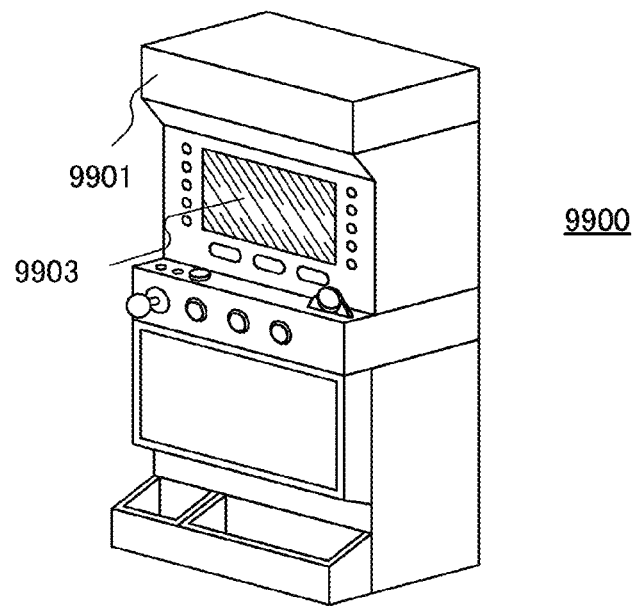

FIG. 34B illustrates an example of a slot machine 9900 which is an amusement machine with a big size. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment, as appropriate.

Figure 35A:
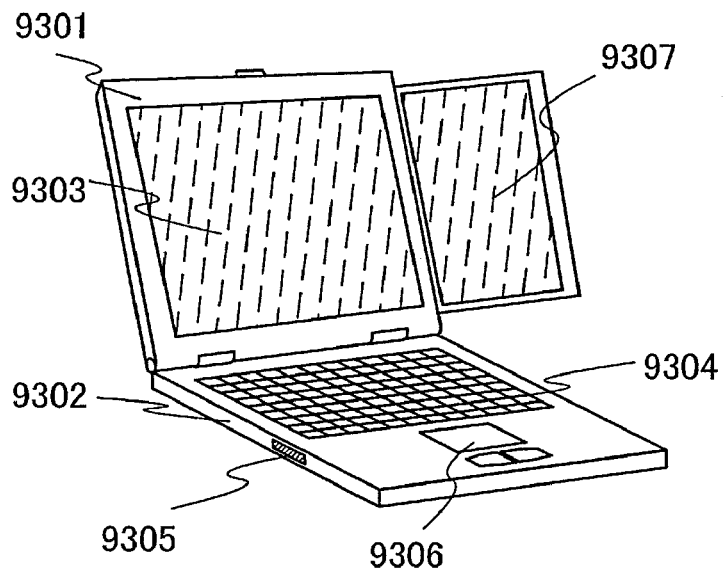
FIG. 35A is an external view of an example of a portable computer.

FIG. 35A is a perspective view illustrating an example of a portable computer.

In the portable computer of FIG. 35A, a top housing 9301 having a display portion 9303 and a bottom housing 9302 having a keyboard 9304 can overlap each other by closing a hinge unit which connects the top housing 9301 and the bottom housing 9302. The portable computer of FIG. 35A can be convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301, which includes a display portion 9307 and can keep the display portion 9307 therein by sliding it toward the inside of the top housing 9301, can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed using an image display device of a liquid crystal display panel, a light-emitting display panel such as an organic light-emitting element or an inorganic light-emitting element, or the like.

In addition, the portable computer in FIG. 35A can be provided with a receiver and the like and can receive a television broadcast to display an image on the display portion. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 35B:
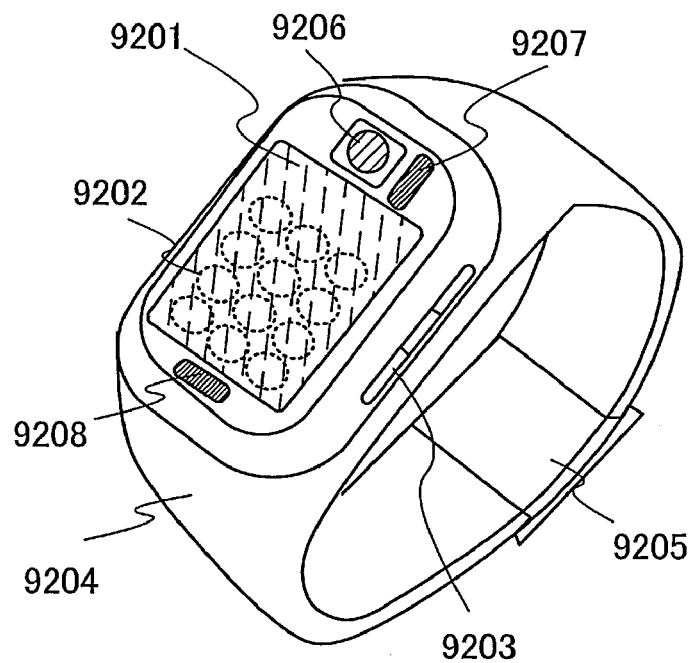
FIG. 35B is an external view of an example of a cellular phone.

FIG. 35B is a perspective view illustrating an example of a cellular phone that the user can wear on the wrist like a wristwatch.

This cellular phone is formed including a main body which includes a communication device having at least a telephone function, and a battery; a band portion 9204 which enables the main body to be worn on the wrist; an adjusting portion 9205 for adjusting the band portion to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for shifting the display, a switch for instruction to start taking images, or the like, and can be configured to have respective functions.

Input to this cellular phone is operated by touching the display portion 9201 with a finger or an input pen, operating the operation switches 9203, or inputting voice into the microphone 9208. In FIG. 35B, display buttons 9202 are displayed on the display portion 9201. Input can be performed by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 35B is provided with a receiver of a television broadcast and the like, and can display an image on the display portion 9201 by receiving a television broadcast. In addition, the cellular phone illustrated in FIG. 35B is provided with a memory device and the like such as a memory, and can record a television broadcast in the memory. The cellular phone illustrated in FIG. 35B may have a function of collecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 35B is compact and lightweight and thus has limited battery capacity. Therefore, a panel which can be driven with low power consumption is preferably used as a display device for the display portion 9201.

Note that FIG. 35B illustrates the electronic device which is worn on the wrist; however, this embodiment is not limited thereto as long as a portable shape is employed.

This application is based on Japanese Patent Application serial No. 2009-164197 filed with Japan Patent Office on Jul. 10, 2009, the entire contents of which are hereby incorporated by reference.

EXPLANATION OF REFERENCE

11: wiring, 12: wiring, 13: wiring, 14: wiring, 15: wiring, 21: terminal, 22: terminal, 23: terminal, 24: terminal, 25: terminal, 26: terminal, 27: terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 100: substrate, 101: gate electrode layer, 102: gate insulating layer, 103: oxide semiconductor layer, 105a: source electrode layer, 105b: drain electrode layer, 107: protective insulating layer, 108: capacitor wiring, 110: pixel electrode layer, 121: terminal, 122: terminal, 125: contact hole, 126: contact hole, 127: contact hole, 128: transparent conductive film, 129: transparent conductive film, 132: conductive film, 133: oxide semiconductor layer, 135: oxide semiconductor layer, 150: terminal, 151: terminal, 152: gate insulating layer, 153: connection electrode layer, 154: protective insulating film, 155: transparent conductive film, 156: electrode layer, 170: thin film transistor, 220: connection electrode layer, 221: first contact hole, 222: second contact hole, 223: third contact hole, 224: fourth contact hole, 225: source wiring, 226: first gate wiring, 227: second gate wiring, 400: substrate, 401: gate electrode layer, 402: gate insulating layer, 403: oxide semiconductor layer, 404a: source region, 404b: drain region, 405a: source electrode layer, 405b: drain electrode layer, 407: oxide insulating film, 409: conductive layer, 410: insulating layer, 411: pixel electrode layer, 419: conductive layer, 420: connection electrode layer, 421: first contact hole, 422: second contact hole, 423: third contact hole, 424: fourth contact hole, 425: source wiring, 426: first gate wiring, 427: second gate wiring, 428: first source wiring, 429: second source wiring, 430: gate wiring, 432: oxide semiconductor layer, 450: substrate, 451: gate electrode layer, 452: gate insulating layer, 453: oxide semiconductor layer, 455a: source electrode layer, 455b: drain electrode layer, 457: oxide insulating film, 460: thin film transistor, 461: thin film transistor, 462: thin film transistor, 463: thin film transistor, 464: thin film transistor, 470: connection electrode layer, 471: first contact hole, 472: second contact hole, 473: third contact hole, 474: fourth contact hole, 475: source wiring, 476: first gate wiring, 477: second gate wiring, 478: first source wiring, 479: second source wiring, 480: gate wiring, 482: oxide semiconductor layer, 490: third contact hole, 491: third contact hole, 580: substrate, 581: thin film transistor, 583: insulating film, 585: insulating layer, 587: electrode layer, 588: electrode layer, 589: spherical particle, 590a: black region, 590b: white region, 594: cavity, 595: filler, 596: substrate, 601: electric furnace, 602: chamber, 603: heater, 604: substrate, 605: susceptor, 606: gas supply means, 607: evacuation means, 611a: gas supply source, 611b: gas supply source, 612a: pressure regulation valve, 612b: pressure regulation valve, 613a: refiner, 613b: refiner, 614a: mass flow controller, 614b: mass flow controller, 615a: stop valve, 615b: stop valve, 1400: substrate, 1401: gate electrode layer, 1402: gate insulating layer, 1403: oxide semiconductor layer, 1405a: source electrode layer, 1405b: drain electrode layer, 1406a: source region, 1406b: drain region, 1407: insulating layer, 1408: insulating layer, 1409: conductive layer, 1418: channel protective layer, 1420: connection electrode layer, 1425: source wiring, 1426: first gate wiring, 1427: second gate wiring, 1430: thin film transistor, 1431: thin film transistor, 1432: thin film transistor, 1601: electric furnace, 1602: chamber, 1603: heater, 1604: substrate, 1605: susceptor, 1606: gas supply means, 1607: evacuation means, 1611: gas supply source, 1612: pressure regulation valve, 1613: refiner, 1614: mass flow controller, 1615: stop valve, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit substrate, 2613: diffusion plate, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4033: insulating layer, 4035: spacer, 4501: substrate, 4502: pixel portion, 4503a: signal line driver circuit, 4503b: signal line driver circuit, 4504a: scan line driver circuit, 4504b: scan line driver circuit, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4518a: FPC, 4518b: FPC, 4519: anisotropic conductive film, 4520: partition, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: driver transistor, 6403: capacitor, 6404: light-emitting element, 6405: signal line, 6406: scan line, 6407: power supply line, 6408: common electrode, 7001: driver TFT, 7002: light-emitting element, 7003: cathode, 7004: light-emitting layer, 7005: anode, 7009: partition, 7011: driver TFT, 7012: light-emitting element, 7013: cathode, 7014: light-emitting layer, 7015: anode, 7016: light-blocking film, 7017: conductive film, 7019: partition, 7021: driver TFT, 7022: light-emitting element, 7023: cathode, 7024: light-emitting layer, 7025: anode, 7027: conductive film, 7029: partition, 9201: display portion, 9202: display button, 9203: operation switch, 9204: band portion, 9205: adjusting portion, 9206: camera portion, 9207: speaker, 9208: microphone, 9301: top housing, 9302: bottom housing, 9303: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: input means (operation key), 9886: recording medium insert portion, 9887: connection terminal, 9888: sensor, 9889: microphone, 9890: LED lamp, 9891: housing, 9893: connection portion, 9900: slot machine, 9901: housing, and 9903: display portion.

What is claimed is:

1. A semiconductor device comprising:
a first gate electrode layer;
a first insulating film over the first gate electrode layer;
an oxide semiconductor layer over the first insulating film;
a connection layer over the first insulating film;
a source electrode layer and a drain electrode layer over the oxide semiconductor layer;
a second insulating film over the first insulating film, the oxide semiconductor layer, the source electrode layer, the drain electrode layer, and the connection layer;
a second gate electrode layer over the second insulating film; and
a first gate wiring, a second gate wiring, and a source wiring over the second insulating film,
wherein the source wiring is electrically connected to the source electrode layer,
wherein the first gate wiring is electrically connected to the first gate electrode layer,
wherein the first gate wiring is electrically connected to the second gate wiring through the connection layer, and
wherein the connection layer overlaps the source wiring.

2. The semiconductor device according to claim 1, wherein each of the source wiring, the first gate wiring, and the second gate wiring includes a conductive material which has lower resistivity than the source electrode layer and the drain electrode layer.

3. The semiconductor device according to claim 1, wherein the source wiring, the first gate wiring, and the second gate wiring include at least one of aluminum and copper.

4. The semiconductor device according to claim 1, wherein the source electrode layer, the drain electrode layer, and the connection layer are formed from the same layer.

5. The semiconductor device according to claim 1, wherein the second gate electrode layer is a part of the first gate wiring.

6. The semiconductor device according to claim 1, wherein the first gate electrode layer, the connection layer, the source electrode layer, the drain electrode layer, and the second gate electrode layer are formed using a single layer or a stacked layer of an element selected from titanium, tantalum, tungsten, molybdenum, chromium, neodymium, or scandium; an alloy including any of these elements as a component; or a nitride including any of these elements as a component.

7. A semiconductor device comprising:
a first gate electrode layer;
a connection layer;
a first insulating film over the first gate electrode layer and the connection layer;

an oxide semiconductor layer over the first insulating film;
a source electrode layer and a drain electrode layer over the oxide semiconductor layer;
a second insulating film over the first insulating film, the oxide semiconductor layer, the source electrode layer, and the drain electrode layer;
a second gate electrode layer over the second insulating film; and
a first gate wiring, a second gate wiring, and a source wiring over the second insulating film,
wherein the source wiring is electrically connected to the source electrode layer,
wherein the first gate wiring is electrically connected to the first gate electrode layer,
wherein the first gate wiring is electrically connected to the second gate wiring through the connection layer, and
wherein the connection layer overlaps the source wiring.

8. The semiconductor device according to claim 7, wherein each of the source wiring, the first gate wiring, and the second gate wiring includes a conductive material which has lower resistivity than the source electrode layer and the drain electrode layer.

9. The semiconductor device according to claim 7, wherein the source wiring, the first gate wiring, and the second gate wiring include at least one of aluminum and copper.

10. The semiconductor device according to claim 7, wherein the first gate electrode layer and the connection layer are formed from the same layer.

11. The semiconductor device according to claim 7, wherein the second gate electrode layer is a part of the first gate wiring.

12. The semiconductor device according to claim 7, wherein the first gate electrode layer, the connection layer, the source electrode layer, the drain electrode layer, and the second gate electrode layer are formed using a single layer or a stacked layer of an element selected from titanium, tantalum, tungsten, molybdenum, chromium, neodymium, or scandium; an alloy including any of these elements as a component; or a nitride including any of these elements as a component.

13. A semiconductor device comprising:
a first gate electrode layer;
a first insulating film over the first gate electrode layer;
an oxide semiconductor layer over the first insulating film;
a connection layer over the first insulating film;
a source electrode layer and a drain electrode layer over the oxide semiconductor layer;
a second insulating film over the first insulating film, the oxide semiconductor layer, the source electrode layer, the drain electrode layer, and the connection layer;
a second gate electrode layer over the second insulating film; and
a gate wiring, a first source wiring, and a second source wiring over the second insulating film,
wherein the first source wiring is electrically connected to the source electrode layer,
wherein the gate wiring is electrically connected to the first gate electrode layer,
wherein the first source wiring is electrically connected to the second source wiring through the connection layer, and
wherein the connection layer overlaps the gate wiring.

14. The semiconductor device according to claim 13, wherein the gate wiring, the first source wiring, and the second source wiring include a conductive material which has lower resistivity than the source electrode layer and the drain electrode layer.

15. The semiconductor device according to claim 13, wherein the gate wiring, the first source wiring, and the second source wiring include at least one of aluminum and copper.

16. The semiconductor device according to claim 13, wherein the source electrode layer, the drain electrode layer, and the connection layer are formed from the same layer.

17. The semiconductor device according to claim 13, wherein the second gate electrode layer is a part of the gate wiring.

18. The semiconductor device according to claim 13, wherein the first gate electrode layer, the connection layer, the source electrode layer, the drain electrode layer, and the second gate electrode layer are formed using a stacked layer of an element selected from titanium, tantalum, tungsten, molybdenum, chromium, neodymium, or scandium; an alloy including any of these elements as a component; or a nitride including any of these elements as a component.

19. A semiconductor device comprising:
a first gate electrode layer;
a connection layer;
a first insulating film over the first gate electrode layer and the connection layer;
an oxide semiconductor layer over the first insulating film;
a source electrode layer and a drain electrode layer over the oxide semiconductor layer;
a second insulating film over the first insulating film, the oxide semiconductor layer, the source electrode layer, and the drain electrode layer;
a second gate electrode layer over the second insulating film; and
a gate wiring, a first source wiring, and a second source wiring over the second insulating film,
wherein the first source wiring is electrically connected to the source electrode layer,
wherein the gate wiring is electrically connected to the first gate electrode layer,
wherein the first source wiring is electrically connected to the second source wiring through the connection layer, and
wherein the connection layer overlaps the gate wiring.

20. The semiconductor device according to claim 19, wherein the gate wiring, the first source wiring, and the second source wiring include a conductive material which has lower resistivity than the source electrode layer and the drain electrode layer.

21. The semiconductor device according to claim 19, wherein the gate wiring, the first source wiring, and the second source wiring include at least one of aluminum and copper.

22. The semiconductor device according to claim 19, wherein the first gate electrode layer and the connection layer are formed from the same layer.

23. The semiconductor device according to claim 19, wherein the second gate electrode layer is a part of the gate wiring.

24. The semiconductor device according to claim 19, wherein the first gate electrode layer, the connection layer, the source electrode layer, the drain electrode layer, and the second gate electrode layer are formed using a stacked layer of an element selected from titanium, tantalum, tungsten, molybdenum, chromium, neodymium, or scandium; an alloy including any of these elements as a component; or a nitride including any of these elements as a component.

* * * * *